(12) United States Patent
Fukushi et al.

(10) Patent No.: US 7,483,287 B2
(45) Date of Patent: Jan. 27, 2009

(54) SEMICONDUCTOR MEMORY

(75) Inventors: Isao Fukushi, Kawasaki (JP); Keizo Morita, Kawasaki (JP); Shoichiro Kawashima, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/790,529

(22) Filed: Apr. 26, 2007

(65) Prior Publication Data

US 2007/0195579 A1   Aug. 23, 2007

Related U.S. Application Data

(60) Division of application No. 11/073,036, filed on Mar. 7, 2005, now Pat. No. 7,227,769, which is a continuation-in-part of application No. 10/915,350, filed on Aug. 11, 2004, now abandoned.

(30) Foreign Application Priority Data

Mar. 8, 2004  (JP)  ............................. 2004-063682
Jan. 18, 2005 (JP)  ............................. 2005-010380

(51) Int. Cl.
*G11C 11/22* (2006.01)
(52) U.S. Cl. ...................................... 365/145; 365/149
(58) Field of Classification Search ................. 365/145, 365/149
See application file for complete search history.

(56) References Cited

U.S. PATENT DOCUMENTS 6,154,402 A    11/2000  Akita
6,487,103 B2*  11/2002  Yamamoto et al. .......... 365/145
6,809,951 B2   10/2004  Yamaguchi

FOREIGN PATENT DOCUMENTS

JP   2002-133857 A   5/2002

OTHER PUBLICATIONS

"Bitline GND Sensing Technique for Low-Voltage Operation FeRAM", Kawashima et al, *IEEE Journal of Solid-State Circuits*, vol. 37, No. 5, May 2002, pp. 592-598.

* cited by examiner

*Primary Examiner*—Amir Zarabian
*Assistant Examiner*—Kretelia Graham
(74) *Attorney, Agent, or Firm*—Arent Fox LLP

(57) ABSTRACT

A bit line is connected to a charge storing circuit through a charge transferring circuit. A control circuit controls charge transferability of the charge transferring circuit according to a change in the voltage of the bit line resulting from a charge read out from a memory cell. A leakage controlling circuit lowers the charge transferability of the charge transferring circuit in a read operation temporarily before the charge is read out to the bit line. The leakage controlling circuit makes it possible to avoid charge transfer between the charge storing circuit and the bit line before data is read from the memory cell. The charge storing circuit can thus generate a read voltage sufficient for a read circuit to operate with, in accordance with the logical value of the data stored in the memory cell.

12 Claims, 35 Drawing Sheets

SEMICONDUCTOR MEMORY

CROSS REFERENCE TO RELATED APPLICATIONS

This application is a Divisional of U.S. patent application Ser. No. 11/073,036 filed Mar. 7, 2005 now U.S. Pat. No. 7,227,769, which is a Continuation-in-Part of U.S. patent application Ser. No. 10/915,350, filed Aug. 11, 2004 now abandoned and claims the benefit of priority from Japanese patent Application Nos. 2004-063682 and 2005-010380, each filed on Mar. 8, 2004 and Jan. 18, 2005. All of the above applications are incorporated by disclosures of the prior applications are hereby incorporated in their entirety by reference.

BACKGROUND OF THE INVENTION

1. Field of the Invention

The present invention relates to a semiconductor memory having memory cells made of such components as ferroelectric capacitors which retain logical values of data in the form of electric charges. In particular, the present invention relates to a circuit technology for reading data from the memory cells.

2. Description of the Related Art

There has been recently proposed a technique for reading a ferroelectric memory, referred to as bit line GND sensing technique (disclosed in Japanese Unexamined Patent Application Publication No. 2002-133857 and IEEE Journal of Solid-State Circuits, Vol. 37, No. 5, pp. 592-598, May 2002). According to this type of reading technique, in order to prevent a variance in voltage of bit lines, at voltage appliance to plate lines charges are read out from memory cells to the bit lines and are transferred to charge storing circuits through charge transferring circuits referred to as charge transfers which are formed in pre-sense amplifiers. The logical values of the data retained in the memory cells are determined in accordance with the amounts of charges transferred to the charge storing circuits. The charge transfers are made of pMOS transistors. The gate-to-source voltages of the pMOS transistors are initialized to the same value as their threshold voltage before the rise of the plate lines. The gates of the pMOS transistors are controlled by inverting amplifiers which lower their output voltages in accordance with the rise of the bit lines in voltage.

In a read operation, the gate-to-source voltages of the pMOS transistors are initialized to the threshold voltage. Then, the pMOS transistors remain ON weakly till the rise of the plate lines. Consequently, the pMOS transistors have leakage between their sources and drains. The leakage causes an increase in the drain voltages (negative voltages) of the pMOS transistors, which causes a problem of a decrease in read margin.

In addition, the activation periods of control signals that activate the inverting amplifiers have been conventionally created by using delay circuits or the like. Because of this, the activation periods of the control signal need be designed to deal with the worst values of the operating temperature and operating voltage. Thus, the activation periods of the inverting amplifiers have been unnecessarily longer, consuming power in vain. Since the inverting amplifiers need be provided for each of the pre-sense amplifiers, and a large number of them operate simultaneously, they greatly affects the amount of the power consumption.

SUMMARY OF THE INVENTION

An object of the present invention is to avoid a decrease in the read margin at the time of data read from memory cells. Another object of the present invention is to reduce power consumption during the read operation of a semiconductor memory having memory cells which retain the logical values of data in the form of electric charges.

According to a first aspect of the present invention, a bit line connected to a memory cell is connected to a charge storing circuit through a charge transferring circuit. The memory cell has a capacitor for storing a charge corresponding to the logic of data. A control circuit controls charge transferability of the charge transferring circuit to transfer a charge read out to the bit line to the charge storing circuit, in accordance with a change in the voltage of the bit line, the change resulting from the charge read out to the bit line. A leakage controlling circuit lowers the charge transferability of the charge transferring circuit in a read operation temporarily before the charge is read out from the memory cell to the bit line. A read circuit generates the logic of data retained in the memory cell in accordance with a read voltage which the charge storing circuit generates in accordance with the stored charge.

The leakage controlling circuit makes it possible to avoid charge transfer between the charge storing circuit and the bit line before the data read from the memory cell. The charge storing circuit can thus generate a read voltage sufficient for the read circuit to operate with, in accordance with the logical value of the data stored in the memory cell. As a result, it is possible to avoid a decrease in read margin, thereby preventing the semiconductor memory from malfunctioning.

According to a preferred example of the first aspect of the present invention, the control circuit has an input terminal connected to the bit line, and an output terminal connected to a control terminal of the charge transferring circuit for the sake of adjusting the charge transferability. The leakage controlling circuit is connected to the input terminal, and forcefully changes the voltage of this input terminal to such a voltage that lowers the charge transferability in a read operation. The charge transferability of the charge transferring circuit can thus be adjusted easily by using the control circuit.

According to a preferred example of the first aspect of the present invention, the control circuit has an input terminal connected to the bit line, and an output terminal connected to a control terminal of the charge transferring circuit for the sake of adjusting the charge transferability. The leakage controlling circuit is connected to the output terminal, and forcefully changes the voltage of this output terminal to such a voltage that lowers the charge transferability in a read operation. Since the charge transferability of the charge transferring circuit is adjusted separately from the operation of the control circuit, it is possible to adjust the charge transferability of the charge transferring circuit directly by the leakage controlling circuit. As a result, the charge transferability can be adjusted with high precision at high speed.

According to a preferred example of the first aspect of the present invention, an initializing circuit, in a read operation, sets the charge transferability of the charge transferring circuit to an initial state before the charge is read out from the memory cell to the bit line. The leakage controlling circuit lowers the charge transferability temporarily in synchronization with the setting by the initializing circuit. Consequently, after the setting, it is possible to avoid charge transfer between the charge storing circuit and the bit line before data read. The charge storing circuit can thus generate a read voltage sufficient for the read circuit to operate with.

According to a preferred example of the first aspect of the present invention, the charge transferring circuit has a transistor which is connected to the output of the control circuit at its gate, and connected to the bit line at one of its source and drain and to the charge storing circuit at the other of the source and drain. In a read operation, the initializing circuit sets the gate-to-source voltage of the transistor to a threshold voltage of the transistor before a charge is read out from the memory cell to the bit line. The leakage controlling circuit changes the gate voltage of the transistor so as to make the absolute value of the gate-to-source voltage be smaller than the absolute value of the threshold voltage temporarily during a period from when the initializing circuit completes the setting to when the charge is read out from the memory cell to the bit line. Since the charge transferring circuit is thus made of a transistor and the gate-to-source voltage of the transistor is adjusted by the leakage controlling circuit, it is possible to adjust the charge transferability of the charge transferring circuit easily.

According to a preferred example of the first aspect of the present invention, a transferring control circuit enhances the charge transferability of the charge transferring circuit after the charge is started to be read out from the memory cell to the bit line in the read operation. This enables the charges read out onto the bit line to be securely transferred to and stored in the charge storing circuit, without being left on the bit line. The charge storing circuit can thus generate a read voltage sufficient for the read circuit to operate with.

According to a preferred example of the first aspect of the present invention, the charge storing circuit includes a first and second capacitors. The first capacitor stores the charges read out from the memory cell to the bit line throughout the read operation. The electrical connection of the second capacitor with the charge transferring circuit is released by the control of a connection release circuit, after the read operation is started. That is, the second capacitor is released from the charge transferring circuit. The release of the connection reduces a capacitance of the capacitor connected to the charge transferring circuit. Thus, it is possible to increase the read voltage drastically in the latter half of the read operation, and to improve the read margin.

According to a preferred example of the first aspect of the present invention, a detecting circuit detects that the read voltage has reached a predetermined value, and stops the operation of the control circuit in response to this detection. It is therefore possible to reduce the operating period of the control circuit to minimum and reduce the power consumption of the semiconductor memory during a read operation.

According to a preferred example of the first aspect of the present invention, the memory cell has a pair of capacitors for storing charges corresponding to complementary logical values, respectively. The charge transferring circuit, the charge storing circuit, the control circuit, and the leakage controlling circuit are formed for each of the pair of capacitors. The detecting circuit detects that either one of read voltages has reached a predetermined value. The read voltages are generated by a pair of charge storing circuits corresponding to the pair of capacitors. The pair of capacitors retain pieces of data which are mutually reverse in logic. Consequently, regardless of whichever logical value the memory cell contains, either one of the read voltages can always reach the predetermined value, enabling the reduction in the power consumption during a read operation in any case.

According to a second aspect of the present invention, a bit line connected to a memory cell is connected to a charge storing circuit through a charge transferring circuit. The memory cell has a capacitor for storing a charge corresponding to the logic of data. A leakage controlling circuit raises the charge transferability of the charge transferring circuit in a read operation temporarily when a charge is read out from the memory cell to the bit line. A read circuit generates the logic of data retained in the memory cell in accordance with a read voltage which the charge storing circuit generates in accordance with the stored charge.

The leakage controlling circuit effects charge transfer from the bit line to the charge storing circuit only at data read from the memory cell. At all other time, the charge transfer is preventable between the charge storing circuit and the bit line. The charge storing circuit can thus generate a read voltage sufficient for the read circuit to operate with, in accordance with the logical value of the data stored in the memory cell. As a result, it is possible to avoid a decrease in read margin and prevent the semiconductor memory from malfunctioning.

According to a preferred example of the second aspect of the present invention, the memory cell has an access gate connecting the capacitor to the bit line. An initializing circuit sets the charge transferability of the charge transferring circuit to an initial state in a read operation before the access gate turns on. The leakage controlling circuit raises the charge transferability temporarily in synchronization with the turning-on of the access gate. Consequently, upon completion of the initialization, it is possible to heighten the charge transferability in synchronization with data read. The charge storing circuit can thus generate a read voltage sufficient for the read circuit to operate with. Charge transfer is preventable between the charge storing circuit and the bit line before the data read.

According to a preferred example of the second aspect of the present invention, the charge transferring circuit has a transistor which is connected to the output of the leakage controlling circuit at its gate, and connected to the bit line at one of its source and drain and to the charge storing circuit at the other of the source and drain. The initializing circuit, in a read operation, sets the absolute value of the gate-to-source voltage of the transistor to a value smaller than the absolute value of the threshold voltage of the transistor before the access gate turns on. The leakage controlling circuit changes the gate voltage of the transistor so as to make the absolute value of the gate-to-source voltage be greater than the absolute value of the threshold voltage temporarily in synchronization with the turning-on of the access gate. Since the charge transferring circuit is thus made of a transistor and the gate-to-source voltage of the transistor is adjusted by the leakage controlling circuit, it is possible to adjust the charge transferability of the charge transferring circuit easily.

According to a third aspect of the present invention, a bit line connected to a memory cell is connected to a charge storing circuit through a charge transferring circuit. The memory cell has a capacitor for storing a charge corresponding to the logic of data. The charge storing circuit has a first and second capacitors. The first capacitor stores the charges read out from the memory cell to the bit line throughout the read operation. The electrical connection of the second capacitor with the charge transferring circuit is released by the control of a connection release circuit, after the read operation is started. The release of the connection reduces a capacitance of the capacitor connected to the charge transferring circuit. Thus, it is possible to increase the read voltage drastically in the latter half of the read operation, and to improve the read margin.

According to a preferred example of the first, second, and third aspects of the present invention, a floating setting circuit in the connection release circuit sets the other end of the second capacitor to enter a floating state, after the read operation is started. This enables the electrical connection between the second capacitor and the charge transferring circuit to be released with ease.

According to a preferred example of the first and third aspects of the present invention, the function of the connection release circuit is brought into effect by the control of a release control circuit, only when a power supply voltage detected by a supply voltage detecting unit is lower than a predetermined value. Since the connection/non-connection of the second capacitor during the read operation is controlled with the power supply voltage, it is possible to generate the optimum read voltage in accordance with the change in characteristic of a ferroelectric capacitor due to the power supply voltage.

According to a preferred example of the first and third aspects of the present invention, the function of the connection release circuit is brought into effect by the control of a release control circuit, only when temperature detected by a temperature detecting unit is higher than a predetermined value. Since the connection/non-connection of the second capacitor during the read operation is controlled with the temperature, it is possible to generate the optimum read voltage in accordance with the change in characteristic of a ferroelectric capacitor due to the temperature.

According to a preferred example of the first and third aspects of the present invention, the function of the connection release circuit is brought into effect by the control of a release control circuit, only when an address detected by an address detecting unit specifies the end of a memory cell array. Since the connection/non-connection of the second capacitor during the read operation is controlled with the location of the memory cell to be accessed, it is possible to generate the optimum read voltage in accordance with the change in characteristic of a ferroelectric capacitor depending on the layout.

According to a preferred example of the first and third aspects of the present invention, the function of the connection release circuit is brought into effect by the control of a release control circuit, only when a use period specified by a time signal exceeds a predetermined period. Since the connection/non-connection of the second capacitor during the read operation is controlled with the use period of the ferroelectric memory, it is possible to generate the optimum read voltage in accordance with the deterioration in characteristic of the ferroelectric capacitor.

According to a preferred example of the first and third aspects of the present invention, a release control circuit detects the read voltage and brings the function of the connection release circuit into effect when the read voltage reaches a predetermined value. For example, in the case of detecting the logic value of the read voltage using a reference voltage, or in the case of detecting the logic value of the read voltage using a complementary read voltage, one voltage reaches the predetermined value faster than the other voltage. Since the voltage reached the predetermined value rises drastically by the function of the connection release circuit, it is possible to improve the read margin.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
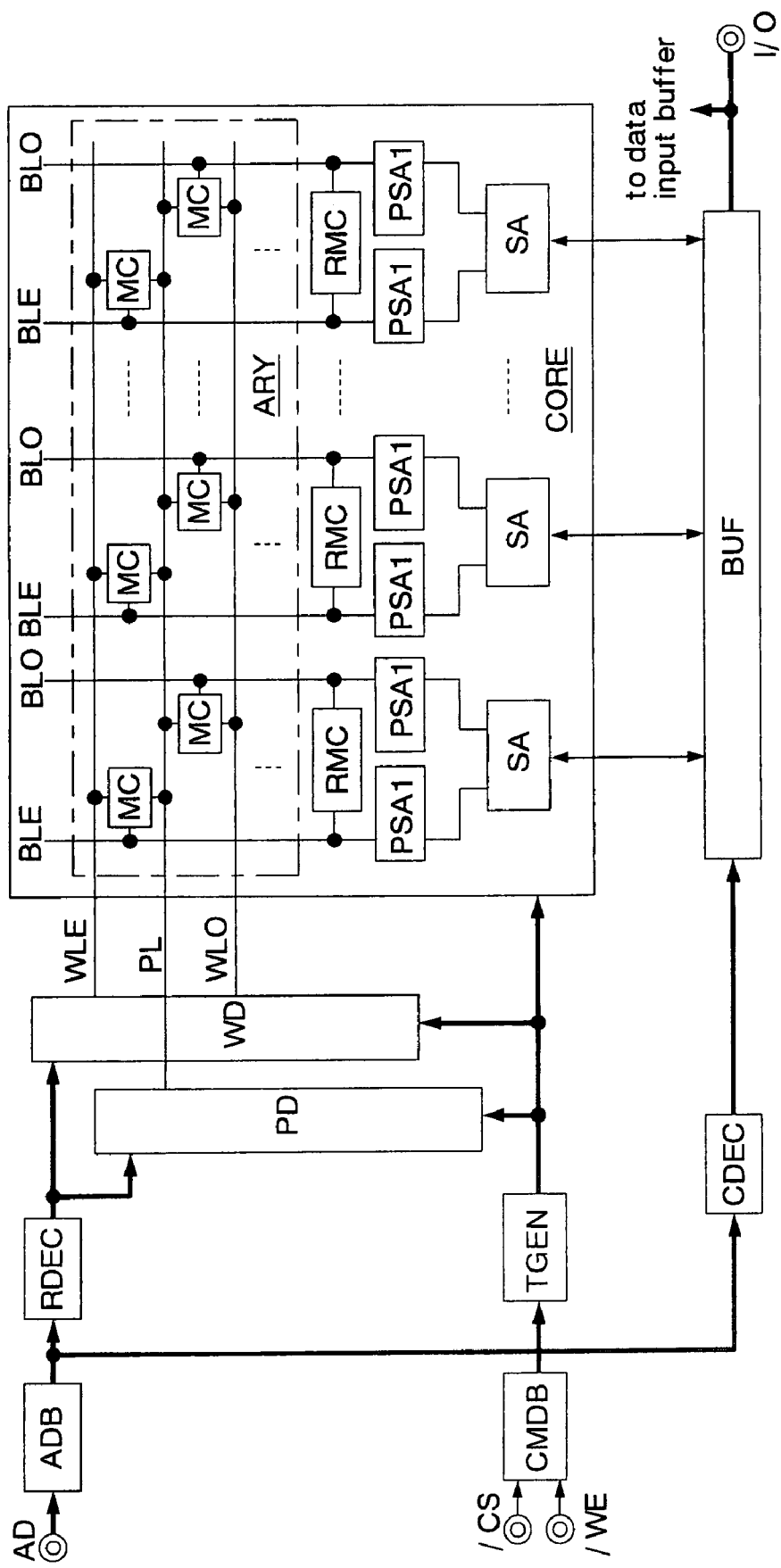
FIG. 1 is a block diagram showing a first embodiment of the semiconductor memory of the present invention.

Hereinafter, embodiments of the present invention will be described with reference to the drawings. Double circles in the drawings represent external terminals. In the drawings, each thick line represents a signal line that consists of a plurality of lines. Some of the blocks connected with the thick lines consist of a plurality of circuits each. Signals supplied through the external terminals are designated by the same reference symbols as the names of the terminals. Signal lines for transmitting signals are designated by the same reference symbols as the names of the signals.

FIG. 1 shows a first embodiment of the semiconductor memory of the present invention. This semiconductor memory is formed as a ferroelectric memory on a silicon substrate by using CMOS processes. The ferroelectric memory is used, for example, as a work memory of a handheld terminal such as a cellular phone. The ferroelectric memory has an address buffer ADB, a command buffer CMDB, a row decoder RDEC, a timing generator TGEN, a column decoder CDEC, a plate driver PD, a word driver WD, a memory core CORE, and a data output buffer BUF. FIG. 1 chiefly shows those circuits necessary for a read operation. Thus, circuits necessary for a write operation, such as a data input buffer and a write amplifier, are omitted from the diagram.

The address buffer ADB receives an address signal AD through an address terminal, and outputs the received signal to the row decoder RDEC and the column decoder CDEC. The row decoder RDEC decodes high-order bits (row address) of the address signal to generate a row decoding signal, and outputs the generated signal to the word driver WD and the plate driver PD. The column decoder CDEC decodes low-order bits (column address) of the address signal to generate a column decoding signal, and outputs the generated signal to the data output buffer BUF.

The command buffer CMDB receives command signals such as a chip select signal /CS and a write enable signal /WE through command terminals, and outputs the received signals to the timing generator TGEN. The timing generator TGEN decodes the operation mode indicated by the command signals received. According to the decoding result, the timing generator TGEN outputs timing signals for operating the plate driver PD, the word driver WD, the data output buffer BUF, pre-sense amplifiers PSA to be described later, etc.

The plate driver PD selects a predetermined plate line PL in response to the timing signal from the timing generator TGEN and the row decoding signal from the row decoder RDEC. The selected plate line PL changes from low level to high level for a predetermined period. The word driver WD selects a predetermined word line WL (WLE or WLO) in response to the timing signal from the timing generator TGEN and the row decoding signal from the row decoder RDEC. The selected word line WL changes from low level to high level for a predetermined period.

The memory core CORE has a memory cell array ARY, reference memory cells RMC which are connected in common to bit lines BL (BLE, BLO), pre-sense amplifiers PSA1 (bit line GND sense circuits) which correspond to the bit lines BL, respectively, and sense amplifiers SA which receive the outputs of respective pairs of pre-sense amplifiers PSA1 corresponding to the bit lines BLE and BLO. Memory cells MC that are in connection with the word lines WLE are connected to the bit lines BLE. Memory cells MC that are in connection with the word lines WLO are connected to the bit lines BLO.

The pre-sense amplifiers PSA1 operate when data is read from the memory cells MC. The pre-sense amplifiers PSA1 convert the charges read out to the bit lines BLE (or BLO) into voltages, and output the converted voltages to the sense amplifiers. The pre-sense amplifiers PSA1 will be detailed later with reference to FIGS. 3 and 4. The sense amplifiers SA differentially amplify read voltages output from the respective pairs of pre-sense amplifiers PSA1 corresponding to the bit line pairs BLE, BLO, and output the amplified data signals to the data output buffer BUF. The data output buffer BUF selects, for example, 16 bits out of a plurality of bits of read data read from the memory core CORE according to the column decoding signal, and outputs the selected read data to a data input/output terminal I/O. The data input/output terminal I/O consists of 16 bits, for example.

Figure 2:
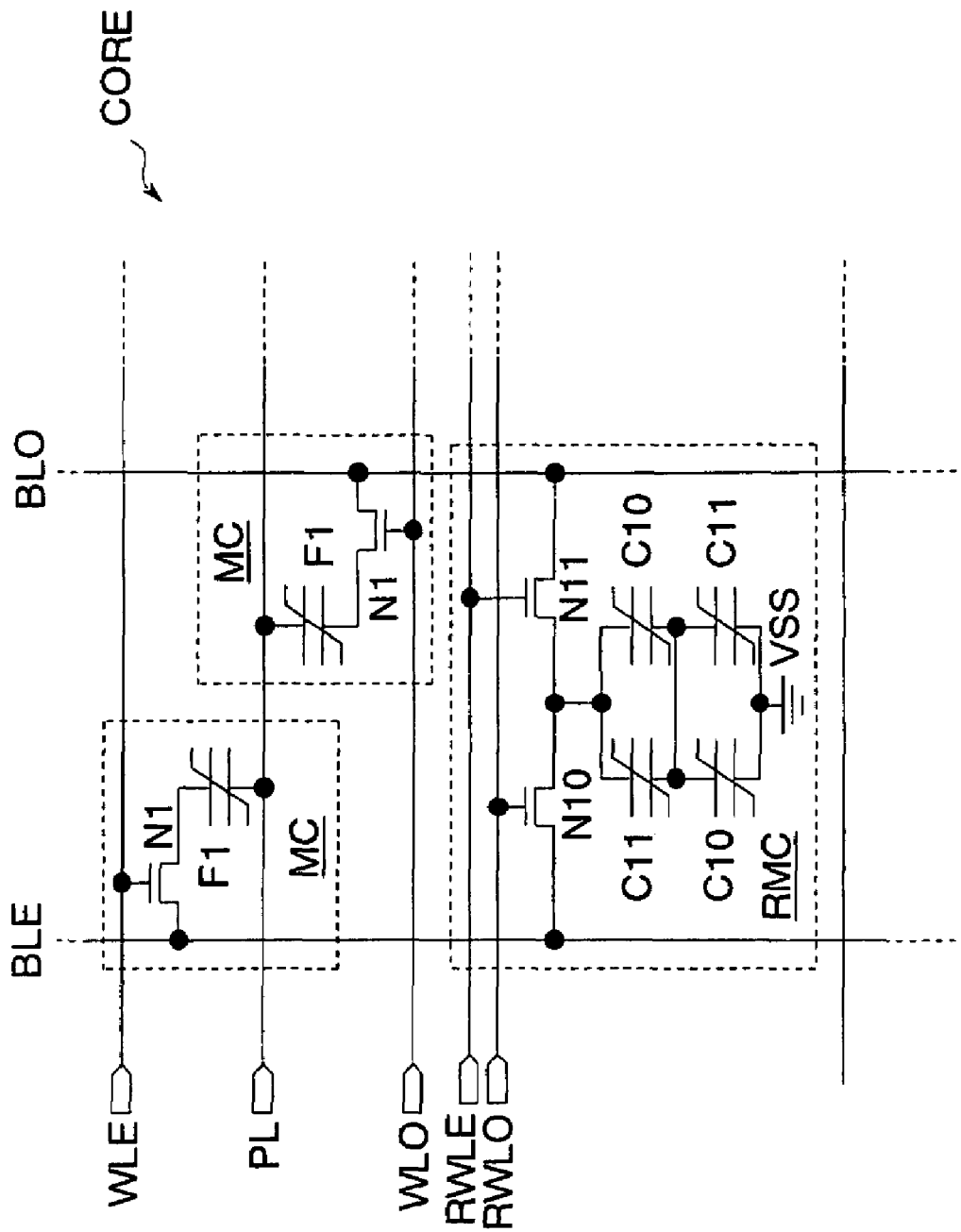
FIG. 2 is a circuit diagram showing the details of the memory cells and the reference memory cells shown in FIG. 1.

FIG. 2 shows the details of the memory cells MC and the reference memory cells RMC shown in FIG. 1.

Each of the memory cells MC, typically referred to as 1T1C type, has an access transistor N1 (access gate) which is made of an nMOS transistor, and a ferroelectric capacitor F1. The ferroelectric capacitor F1 is connected at one end to a bit line BLE or a bit line BLO through the access transistor N1, and at the other end to a plate line PL. The gates of the access transistors N1 of memory cells MC that are in connection with complementary bit lines BLE and BLO, respectively, are connected to respective different word lines WLE and WLO. That is, the memory cells MC connected to the complementary bit lines BLE and BLO, respectively, will not be accessed simultaneously.

A reference memory cell RMC has a reference capacitor which is composed of four ferroelectric capacitors C10 and C11 identical to the ferroelectric capacitors F1 of the memory cells MC, and two nMOS transistors N10 and N11. The nMOS transistor N10 connects the reference capacitor to the bit line BLE when a reference word line RWLO is at high level. The nMOS transistor N11 connects the reference capacitor to the bit line BLO when a reference word line RWLE is at high level.

The reference capacitor is constituted by connecting two capacitor pairs in parallel, the capacitor pairs each having a ferroelectric capacitor C10 for storing "logic 0" and a ferroelectric capacitor C11 for storing "logic 1" which are connected in series. Each capacitor pair is connected at one end to a ground line VSS. The reference capacitor has a capacitance of $(C10+C11)/2$. That is, the reference capacitor has a capacitance intermediate between the capacitance of a ferroelectric capacitor F1 containing "logic 0" and the capacitance of a ferroelectric capacitor F1 containing "logic 1". Since a plurality of ferroelectric capacitors identical to the memory cell capacitors are combined to constitute the reference capacitor, it is possible to achieve the intermediate capacitance easily with high precision.

In the memory cell array ARY composed of 1T1C type cells, when a word line WLE goes high in level and memory cells MC connected to the bit lines BLE are selected, the reference word line RWLE is turned to high level so that the reference capacitors are connected to the bit lines BLO. Similarly, when a word line WLO goes high in level and memory cells MC connected to the bit lines BLO are selected, the reference word line RWLO is turned to high level so that the reference capacitors are connected to the bit lines BLE. Then, the voltages of the bit lines BLE (or BLO), which vary with the capacitances of the ferroelectric capacitors F1, and the voltages of the bit lines BLO (or BLE), which vary with the capacitances of the reference capacitors, are transmitted to the respective pre-sense amplifiers PSA1.

Figure 3:
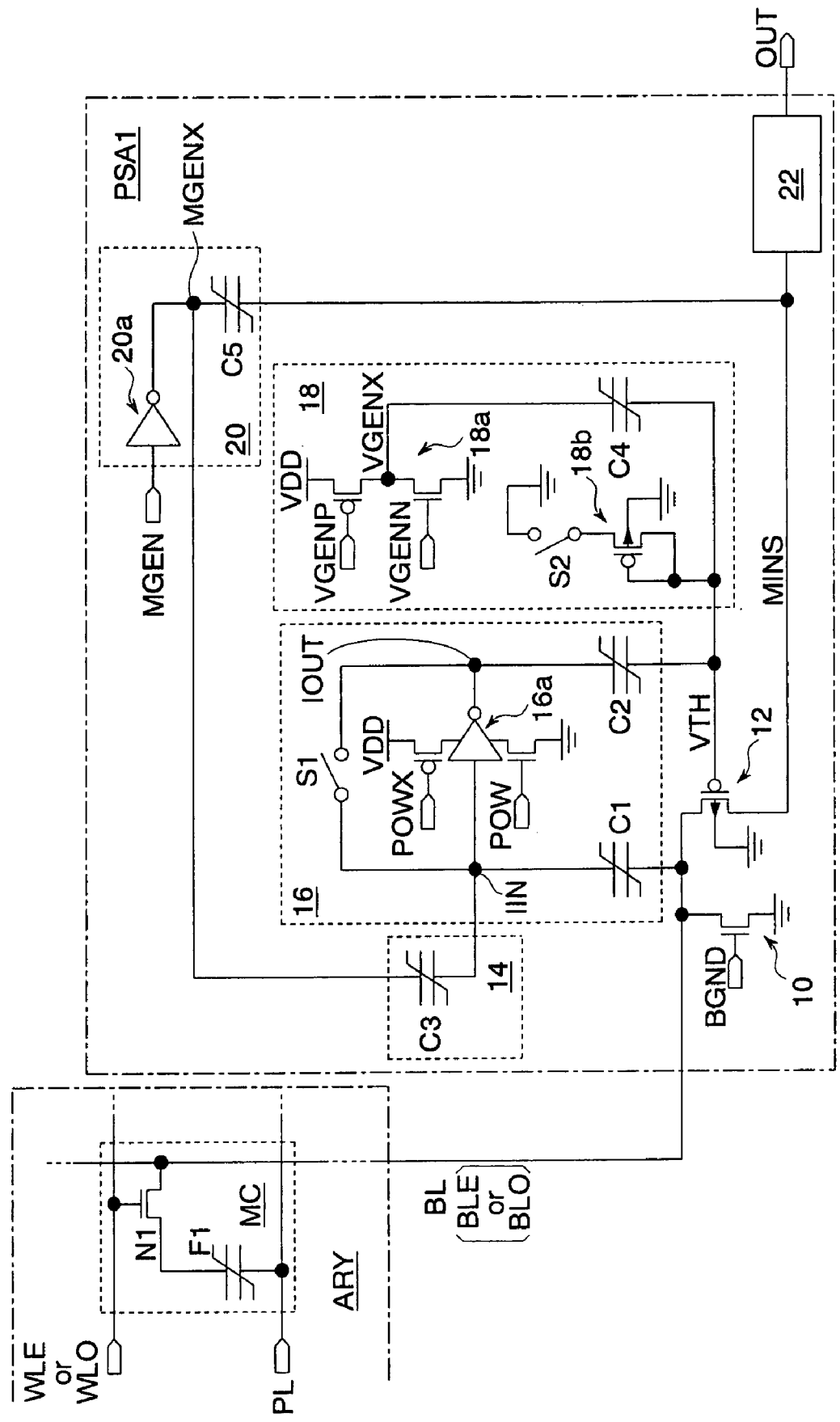
FIG. 3 is a circuit diagram showing the details of the pre-sense amplifiers shown in FIG. 1.

FIG. 3 shows the details of the pre-sense amplifiers PSA1 shown in FIG. 1. A pre-sense amplifier PSA1 has a bit line initializing circuit 10, a charge transferring circuit 12, a leakage controlling circuit 14, an inverting amplifier 16 (control circuit), a threshold voltage generator 18 (initializing circuit), a negative voltage generator 20 (charge storing circuit, initializing circuit), and a level shifter 22.

The bit line initializing circuit 10 is made of an nMOS transistor which receives a control signal BGND at its gate, is connected to a ground line at its source, and is connected to a bit line BL (BLE or BLO) at its drain. The charge transferring circuit 12 is made of a pMOS transistor which is connected to an output node VTH of the threshold voltage generator 18 at its gate (control terminal), is connected to the bit line BL at its source, and is connected to an output node MINS of the negative voltage generator 20 at its drain. The leakage controlling circuit 14 has a capacitor C3 which is arranged between a node MGENX and an input terminal IIN of the inverting amplifier 16. The capacitor C3 is made of a ferroelectric capacitor, for example. The capacitor C3 has a capacitance sufficiently smaller than that of a capacitor C1 of the inverting amplifier 16 to be described later. Because of the capacitive coupling of the capacitor C3, the input voltage IIN of the inverting amplifier 16 drops slightly in synchronization with a fall of the node MGENX.

The inverting amplifier 16 has a CMOS inverter 16a (feedback inverter), a switch S1 for connecting an output terminal IOUT of the CMOS inverter 16a to the input terminal IIN, a capacitor C1 arranged between the input terminal IIN of the CMOS inverter 16a and the bit line BL, and a capacitor C2 arranged between the output terminal IOUT of the CMOS inverter 16a and the gate of the charge transferring circuit 12. The source of a pMOS transistor (not shown) of the CMOS inverter 16a is connected to a power supply line VDD through a pMOS transistor which receives a power controlling signal POWX at its gate. The source of an nMOS transistor (not shown) of the CMOS inverter 16a is connected to the ground line through an nMOS transistor which receives a power controlling signal POW at its gate. At the beginning of a read operation, the power controlling signals POWX and POW change to low level and high level, respectively, whereby the CMOS inverter 16a is activated. Similarly, the switch S1 is turned off at the beginning of a read operation. The capacitors C1 and C2 are made of ferroelectric capacitors, for example.

The threshold voltage generator 18 has a voltage generator 18a which generates high level (power supply voltage VDD) or low level (ground voltage) on a node VGENX, a capacitor C4 which is connected between the node VGENX and the node VTH, a clamping circuit 18b which is connected to the node VTH, and a switch S2 which connects the clamping circuit 18b to the ground line. The voltage generator 18a has a pMOS transistor and an nMOS transistor which are connected in series between the power supply line VDD and the ground line. The gates of the pMOS transistor and the nMOS transistor receive voltage controlling signals VGENP and VGENN, respectively. The clamping circuit 18b is made of a pMOS transistor which is connected at its source to the ground line through the switch S2, and at its gate and drain to the node VTH. The capacitor C4 is made of a ferroelectric capacitor, for example.

The negative voltage generator 20 has a CMOS inverter 20a which receives a negative voltage controlling signal MGEN and is connected to the node MGENX at its output, and a capacitor C5 which is arranged between the node MGENX and the node MINS. The capacitor C5 is made of a ferroelectric capacitor, for example. The level shifter 22 has a capacitor (not shown) for converting a negative voltage occurring on the node MINS into a positive voltage.

Figure 4:
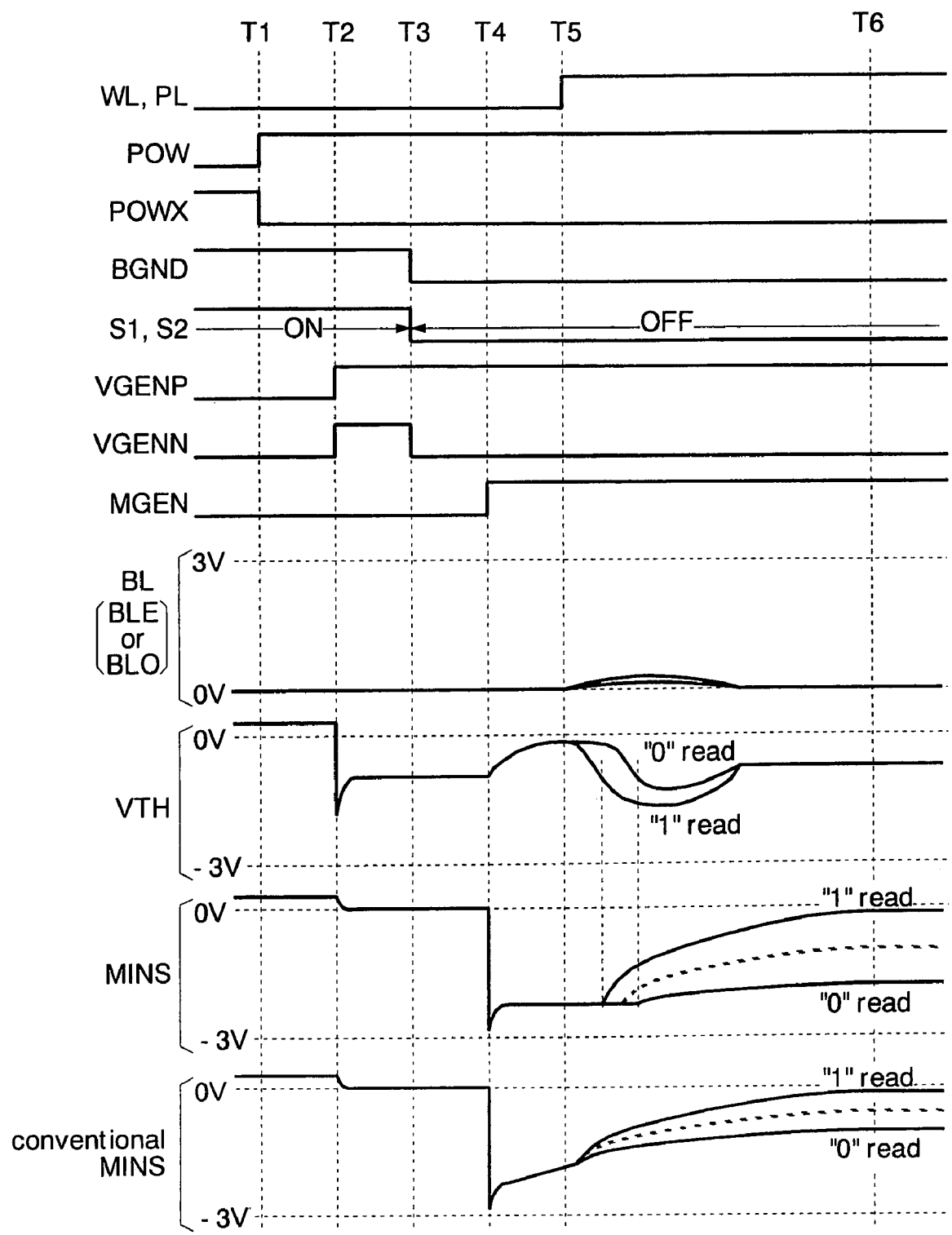
FIG. 4 is a waveform chart showing a read operation of the ferroelectric memory according to the first embodiment.

FIG. 4 shows a read operation of the ferroelectric memory according to the first embodiment. In an initial state, the nodes VTH and MINS connected to the gate and drain of the pMOS transistor 12 (charge transferring circuit) are floating, and their voltages are unstable. Nevertheless, since the source and drain (p-type diffusion layers) and the back gate (n-type diffusion layer, ground voltage) of the pMOS transistor 12 form pn junctions, the voltages of the nodes VTH and MINS will not rise over the forward voltage of the pn junctions (approximately 0.8 V).

The voltage controlling signals VGENP, VGENN and the negative voltage controlling signal MGEN are kept at low level, and the nodes VGENX and MGENX are kept at high level. Since the control signal BGND is kept at high level, the nMOS transistor 10 (bit line initializing circuit) turns on, and the voltage of the bit line BL (BLE or BLO) is initialized to the ground voltage. The power controlling signals POW and POWX are kept at low level and high level, respectively, and the feedback inverter 16a (CMOS inverter) is off. The switches S1 and S2 are on. Control signals for controlling the operations of the switches S1 and S2, as well as the voltage controlling signals VGENP and VGENN, the negative voltage controlling signal MGEN, the control signal BGND, and the power controlling signals POW and POWX are generated by the timing generator TGEN shown in FIG. 1.

At time T1, the power controlling signals POW and POWX change to high level and low level, respectively, whereby the feedback inverter 16a is activated. Since the switch S1 is on, the input voltage INN and output voltage IOUT of the feedback inverter 16a both are approximately VDD/2.

At time T2, the voltage controlling signals VGENP and VGENN change to high level, and the node VGENX changes from high level to low level. Because of the capacitive coupling of the capacitor C4, the node VTH also drops in voltage with the change of the node VGENX to low level. Given a power supply voltage VDD of 3 V, for example, when the voltage of the node VGENX falls by 3 V, the voltage of VTH is also going to fall by 3 V. Since the switch S2 is on, however, the pMOS transistor 18b (clamping circuit) clamps the voltage of the node VTH to the threshold voltage of the pMOS transistor 18b (for example, −0.6 V). As a result, after falling once, the voltage of the node VTH traces a differential waveform and settles to the negative voltage (−0.6 V). In this way, the threshold voltage generator 18 functions as an initializing circuit for setting the input node VTH of the charge transferring circuit 12 to a predetermined voltage.

The threshold voltage of the pMOS transistor 12 is designed to be equal to the threshold voltage of the pMOS transistor 18b. Thus, when the node VTH drops in voltage temporarily, the pMOS transistor 12 turns on and the voltage of the node MINS falls to the voltage of the bit line BL (ground voltage). Since the voltage of the node MGENX is set at high level (=power supply voltage VDD) by the CMOS inverter 20a, the capacitor C5 is charged with a charge corresponding to the product of the capacitance thereof and the power supply voltage VDD.

At time T3, the voltage controlling signal VGENN changes to low level, and the nMOS transistor of the voltage generator 18a turns off. Since the pMOS transistor of the voltage generator 18a is already off, the node VGENX enters a floating state. At the same time, the switches S1 and S2 are turned off. Since the switch S2 is off, the clamping of the node VTH by the pMOS transistor 18b is released. Since the switch S1 is off, the short between the input and output of the feedback inverter 16a is released. A voltage of approximately VDD/2 is input to the feedback inverter 16a, so that the feedback inverter 16a functions as an inverting amplifier having a high gain. Meanwhile, the control signal BGND also changes to low level, and the bit line BL enters a floating state. Consequently, after time T3, a change in the voltage of the bit line BL changes the input voltage INN of the feedback inverter 16a through the capacitive coupling of the capacitor C1. The feedback inverter 16a amplifies the change in the input voltage IIN and changes the output voltage IOUT inversely. Because of the capacitive coupling of the capacitor C2, the voltage of the node VTH varies with the change in the output voltage IOUT.

At time T4, the negative voltage controlling signal MGEN changes to high level, and the voltage of the node MGENX changes from high level to low level. Because of the capacitive coupling of the capacitor C5, the voltage of the node MINS drops as the voltage of the node MGENX falls. Given a power supply voltage VDD of 3 V, for example, when the voltage of the node MGENX falls by 3 V, the voltage of the node MINS also drops by approximately 3 V. Since the voltage of the node MINS is initialized to 0 V, it drops to approximately −3 V due to the change in the voltage of the node MGENX. The voltage of the node MINS turns out to be higher than −3 V, however, due to a loss resulting from parasitic capacitances and the leakage current of the pMOS transistor 12 which is weakly turned on in advance. The voltage of the node MINS is kept at this voltage by the capacitor C5. In this way, the negative voltage generator 20 functions as an initializing circuit for setting the input/output node MINS of the charge transferring circuit 12 to a predetermined voltage and setting the charge transferability of the charge transferring circuit 12 to an initial state.

Moreover, at time T4, the node MGENX falls due to the change of the negative voltage controlling signal MGEN. The capacitive coupling of the capacitor C3 forcefully lowers the input voltage IIN of the feedback inverter 16a slightly. The feedback inverter 16a amplifies this voltage change to raise the output voltage IOUT. Because of the capacitive coupling of the capacitor C2, the voltage of the node VTH rises with the output voltage IOUT. Consequently, the gate-to-source voltage (absolute value) of the pMOS transistor 12 decreases to reduce the leakage current that flows from the node MINS to the bit line BL through the pMOS transistor 12. That is, the charge transferability of the charge transferring circuit 12 decreases. This prevents the voltage of the node MINS from being increased by the source-to-drain leakage of the pMOS transistor 12 before a charge is read out from the memory cell MC to the bit line BL. Note that the capacitor C1 has a capacitance sufficiently greater than that of the capacitor C3, so that the variation in the voltage of the bit line BL occurring from the capacitive coupling of the capacitor C1 upon the variance in the input voltage IIN is negligible.

At time T5, the voltages of the word line WL and the plate line PL change from the ground voltage to the power supply voltage VDD. The rise of the word line WL turns on the access transistor N1 of the memory cell MC, so that a positive voltage is applied to the ferroelectric capacitor F1 of the memory cell MC. When the memory cell MC contains data "1", reverse polarization occurs since the voltage to be applied to the ferroelectric capacitor F1 has polarity reverse to that in write operation. A large reverse charge is thus read out to the bit line BL. When the memory cell MC contains data "0", reverse polarization will not occur since the voltage to be applied to the ferroelectric capacitor F1 has the same polarity as that in write operation. A relatively small charge is thus read out to the bit line BL. Here, the voltage of the bit line BL starts to rise. When the voltage of the bit line BL rises slightly, however, the input voltage of the feedback inverter 16a rises due to the capacitive coupling of the capacitor C1. The inverse amplifying operation of the feedback inverter 16a and the capacitive coupling of the capacitor C2 lower the voltage of the node VTH and increase the gate-to-source voltage (absolute value) of the pMOS transistor 12. This causes a drain current through the pMOS transistor 12, and the charge read out to the bit line BL is transferred from the bit line BL to the node MINS. The voltage of the bit line BL is thus prevented from rising, and is kept at approximately 0 V (ground voltage). In this way, the feedback inverter 16a functions as a control circuit for adjusting the charge transferability of the charge transferring circuit 12. Since the capacitor C5 is discharged by the charge transferred to the node MINS, the voltage (read voltage) of the node MINS increases. In this way, the capacitor C5 of the negative voltage generator 20 functions as a read circuit for generating a read voltage in accordance with the stored charge. Incidentally, in the case when the memory cell MC contains the data "0" ("0 read"), the voltage of the node VTH falls moderately as compared to the case when the memory cell MC contains the data "1" ("1 read"). Therefore, the timing when the voltage of the node VTH falls below the threshold voltage of the pMOS transistor 12 in "0 read" is later than the timing when the voltage of the node VTH falls below the threshold voltage of the pMOS transistor 12 in "1 read". Accordingly, the timing when the voltage of the node MINS starts to increase in "0 read" is later than the timing when the voltage of the node MINS starts to increase in "1 read". As a result of this, it is possible to increase a read margin in "0 read".

In the case of reading data from a memory cell MC in connection with the bit line BLE, the reference memory cell RMC is connected to the bit line BLO. Similarly, in the case of reading data from a memory cell MC in connection with the bit line BLO, the reference memory cell RMC is connected to the bit line BLE. The pre-sense amplifier PSA connected to the reference memory cell RMC makes the same operations as described above, thereby generating a negative voltage on the node MINS in accordance with the charge read from the reference memory cell RMC. In the diagram, essential voltages in the pre-sense amplifier PSA connected to the reference memory cell RMC are shown by broken lines.

At time T6, the read voltages (negative voltages) of the nodes MINS corresponding to the memory cell MC and the reference memory cell RMC, respectively, are converted into positive voltages by the level shifter 22 shown in FIG. 3, and then differentially amplified by the sense amplifier SA shown in FIG. 1. Then, the logical value of the data stored in the memory cell MC is read. Subsequently, as with ordinary ferroelectric memories, a restore operation is performed to restore the state of the memory cell MC which has made reverse polarization due to the read operation.

The waveforms at the bottom of FIG. 4 show changes at a conventional node MINS.

In the period T4-T5, the gate-to-source voltage of the pMOS transistor 12 is conventionally set to be equal to the threshold voltage of the pMOS transistor 12. Consequently, the pMOS transistor 12 causes a leakage current (drain-to-source current), and the node MINS rises in voltage. As a result, the waveform when the memory cell MC contains data "0" is shifted toward a positive direction, so that the difference between the voltages input to the sense amplifier SA decreases. This results in a smaller read margin. Incidentally, the period T4-T5 is designed to be as short as possible, but it needs to have a predetermined margin so as not to reverse the relationship between the times T4 and T5.

As has been described, according to the present embodiment, during a period from when the capacitor C3 constituting the leakage controlling circuit 14 sets the voltage of the node MINS to an initial value to when a charge is read from the memory cell MC (T4-T5), the gate-to-source voltage (absolute value) of the pMOS transistor 12 is made slightly smaller than the threshold voltage (absolute value) of the pMOS transistor 12 so as to lower the charge transferability of the charge transferring circuit 12. It is therefore possible to avoid leakage between the drain and source of the pMOS transistor 12 in this period.

In particular, since the charge transferability of the charge transferring circuit 12 is lowered temporarily in synchronization with the voltage of the node MINS being set to the initial value, it is possible to avoid leakage in the charge transferring circuit 12 during a period between the initialization of the node MINS and read of data. Thus, with the memory cell MC containing data "0", the waveform of the node MINS can be prevented from shifting toward a positive direction. In other words, a read voltage sufficient for the sense amplifier SA to operate with according to the logical value of data stored in the memory cell MC can be generated on the node MINS. As a result, it is possible to avoid a decrease of the read margin. That is, the ferroelectric memory can be prevented from malfunctioning.

In addition, since the leakage controlling circuit 14 forcefully changes the input voltage of the inverting amplifier 16, the charge transferability of the charge transferring circuit 12 can be adjusted easily by using the amplification of the inverting amplifier 16.

Figure 5:
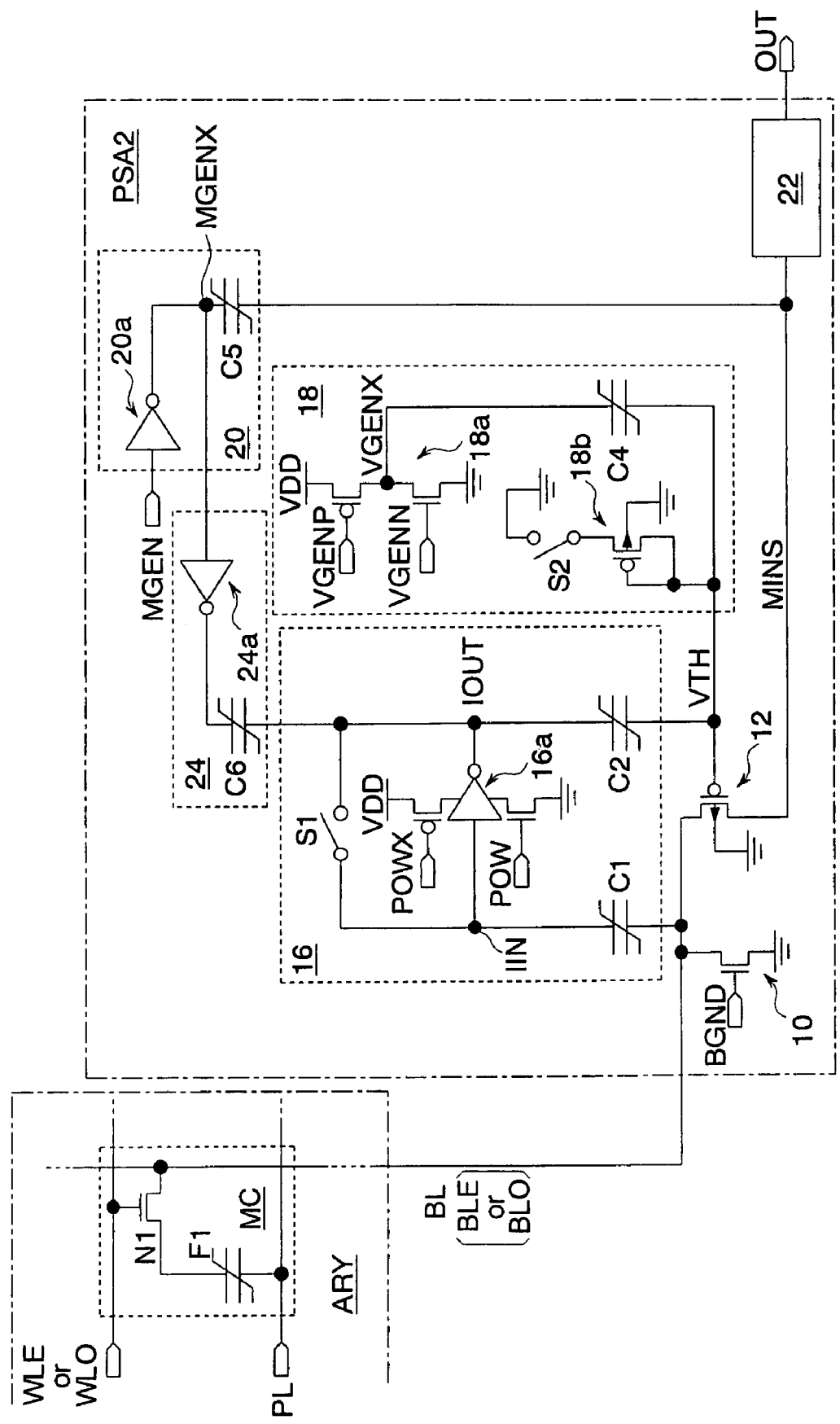
FIG. 5 is a circuit diagram showing the details of the pre-sense amplifier according to a second embodiment of the present invention.

FIG. 5 shows a second embodiment of the semiconductor memory of the present invention. The same elements as those described in the first embodiment will be designated by identical reference numbers or symbols. Detailed description thereof will be omitted. In this embodiment, pre-sense amplifiers PSA2 are formed instead of the pre-sense amplifiers PSA1 of the first embodiment. The rest of the configuration is the same as in the first embodiment. That is, the semiconductor memory is formed as a ferroelectric memory on a silicon substrate by using CMOS processes. The ferroelectric memory is used, for example, as a work memory of a handheld terminal such as a cellular phone. The ferroelectric memory has the same basic configuration as in FIGS. 1 and 2 seen above, except in the pre-sense amplifiers.

The pre-sense amplifiers PSA2 have a leakage controlling circuit 24 instead of the leakage controlling circuit 14 in the pre-sense amplifiers PSA1 of the first embodiment. In other respects, the pre-sense amplifiers PSA2 have the same configuration as that of the pre-sense amplifiers PSA1. The leakage controlling circuit 24 has a CMOS inverter 24a and a capacitor C6 which are arranged between the node MGENX and the output terminal IOUT of the inverting amplifier 16. That is, the output of the leakage controlling circuit 24 is connected directly to the capacitor C2. The capacitor C6 is made of a ferroelectric capacitor, for example. The capacitor C6 has a capacitance greater than that of the capacitor C3 in the first embodiment, but sufficiently smaller than that of the capacitor C2 of the inverting amplifier 16. Because of the capacitive coupling of the capacitor C6 and of the capacitor C2, the voltage of the output terminal IOUT of the inverting amplifier 16 and the voltage of the node VTH rise slightly in synchronization with a fall of the node MGENX.

Figure 6:
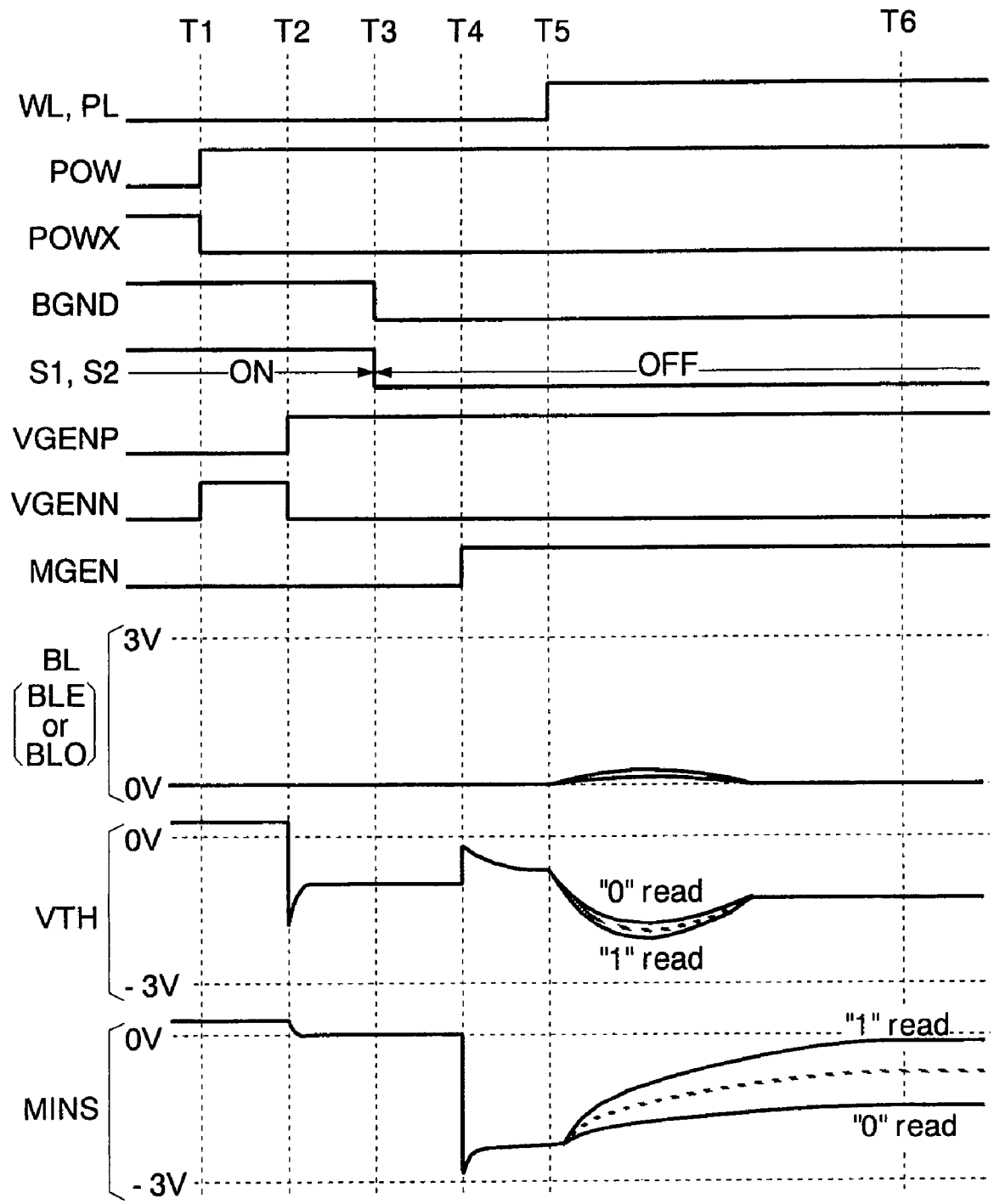
FIG. 6 is a waveform chart showing a read operation of the ferroelectric memory according to the second embodiment.

FIG. 6 shows a read operation of the ferroelectric memory according to the second embodiment. This embodiment differs from the first embodiment only in the waveform of the node VTH at times T4 and thereafter. The other waveforms are the same as in the first embodiment (FIG. 4).

At time T4, the node MGENX falls due to the change in the negative voltage controlling signal MGEN. The capacitive coupling of the capacitor C6 forcefully raises the output voltage IOUT of the feedback inverter 16a slightly. Because of the capacitive coupling of the capacitor C2, the voltage of the node VTH is forcefully raised in accordance with the output voltage IOUT. That is, the voltage of the node VTH rises in synchronization with the change of the negative voltage controlling signal MGEN, regardless of the operation of the inverting amplifier 16. Consequently, the gate-to-source voltage (absolute value) of the pMOS transistor 12 decreases to reduce the leakage current that flows from the node MINS to the bit line BL through the pMOS transistor 12. That is, the charge transferability of the charge transferring circuit 12 decreases. As in the first embodiment, this prevents the voltage of the node MINS from being increased by the source-to-drain leakage of the pMOS transistor 12 before a charge is read out from the memory cell MC to the bit line BL.

This embodiment can provide the same effects as those of the first embodiment described above. Moreover, in this embodiment, the gate voltage of the pMOS transistor 12 can be forcefully and directly adjusted by the leakage controlling circuit 24. It is therefore possible to adjust the charge transferability of the charge transferring circuit 12 with high precision at high speed.

Figure 7:
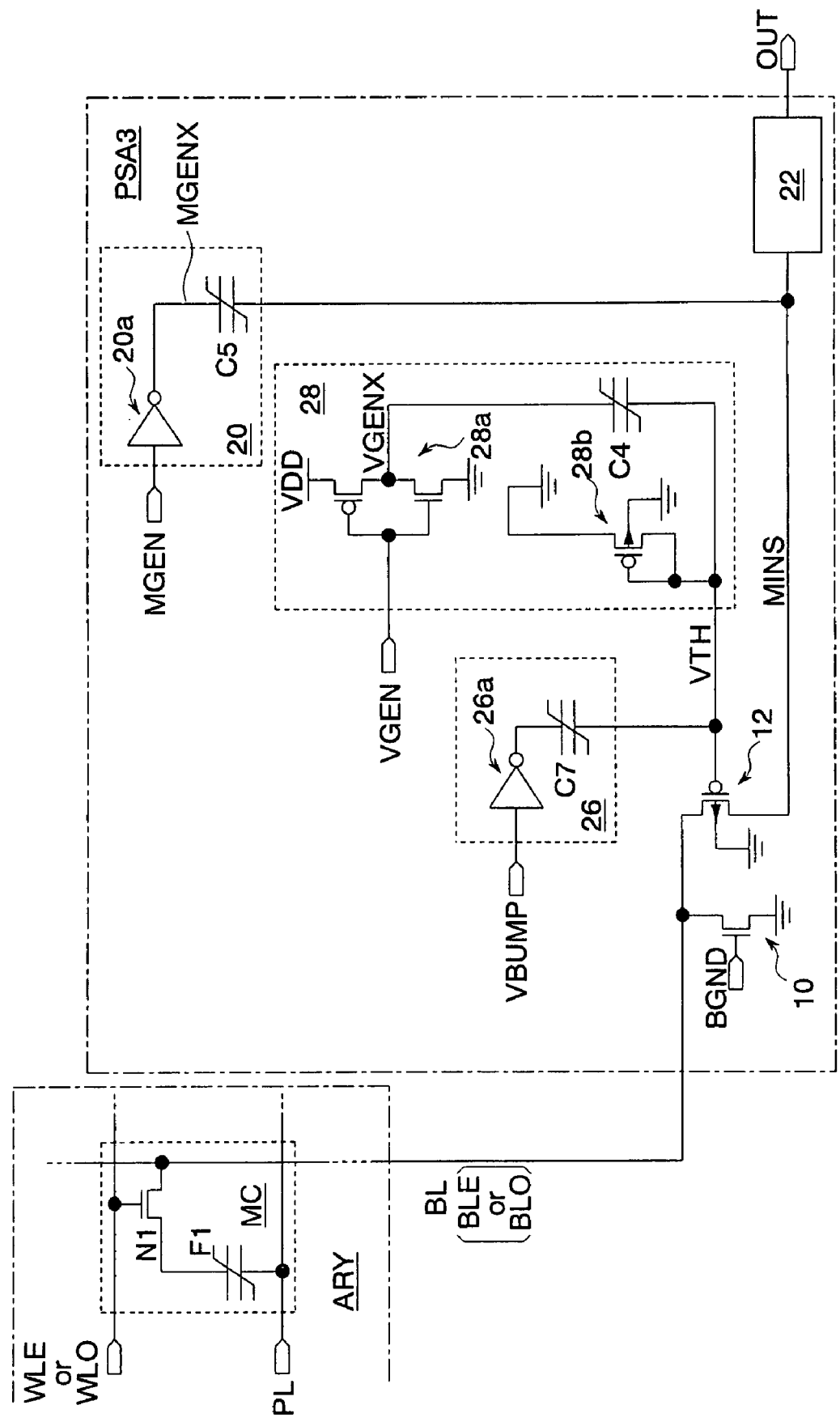
FIG. 7 is a circuit diagram showing the details of the pre-sense amplifier according to a third embodiment of the present invention.

FIG. 7 shows a third embodiment of the semiconductor memory of the present invention. The same elements as those described in the first embodiment will be designated by identical reference numbers or symbols. Detailed description thereof will be omitted. In this embodiment, pre-sense amplifiers PSA3 are formed instead of the pre-sense amplifiers PSA1 of the first embodiment. The rest of the configuration is the same as in the first embodiment. That is, the semiconductor memory is formed as a ferroelectric memory on a silicon substrate by using CMOS processes. The ferroelectric memory is used, for example, as a work memory of a handheld terminal such as a cellular phone. The ferroelectric memory has the same basic configuration as in FIGS. 1 and 2 seen above, except in the pre-sense amplifiers.

The pre-sense amplifiers PSA3 have a leakage controlling circuit 26 (pull-down circuit) and a threshold voltage generator 28 (initializing circuit) instead of the leakage controlling circuit 14 and the threshold voltage generator 18 in the pre-sense amplifiers PSA1 of the first embodiment. Moreover, the inverter amplifier 16 is not formed in the pre-sense amplifiers PSA3. In other respects, the pre-sense amplifiers PSA3 have the same configuration as that of the pre-sense amplifiers PSA1.

The leakage controlling circuit 26 has a CMOS inverter 26a and a capacitor C7 which are arranged between the input node of a control signal VBUMP and the node VTH. The capacitor C7 is made of a ferroelectric capacitor, for example. The capacitance of the capacitor C7 is designed to be smaller than that of the capacitor C4. Because of the capacitive coupling of the capacitor C7, the voltage of the node VTH falls temporarily in response to a change of the control signal VBUMP from low level to high level. The control signal VBUMP is generated by the timing generator TGEN (FIG. 1).

The threshold voltage generator 28 is the same as the threshold voltage generator 18 of the first embodiment, except that it does not have the switch S2, that the voltage generator 28a is made of a CMOS inverter, and that the absolute value of the threshold voltage of the clamping circuit 28b (pMOS transistor) is smaller than the absolute value of the threshold voltage of the charge transferring circuit 12 (pMOS transistor). Since the switch S2 is absent, the source of the clamping circuit 28b (pMOS transistor) is connected directly to the ground line. The input of the voltage generator 28a receives a voltage controlling signal VGEN which has the same logic as that of the voltage controlling signal VGENP in the first embodiment. For example, the pMOS transistor 28b has a threshold voltage of –0.5 V, and the pMOS transistor 12 has a threshold voltage of –0.6 V. The threshold voltages (absolute values) can be lowered by reducing the gate lengths of the transistors, increasing the gate widths, reducing the impurity concentrations of the back gates, etc.

Figure 8:
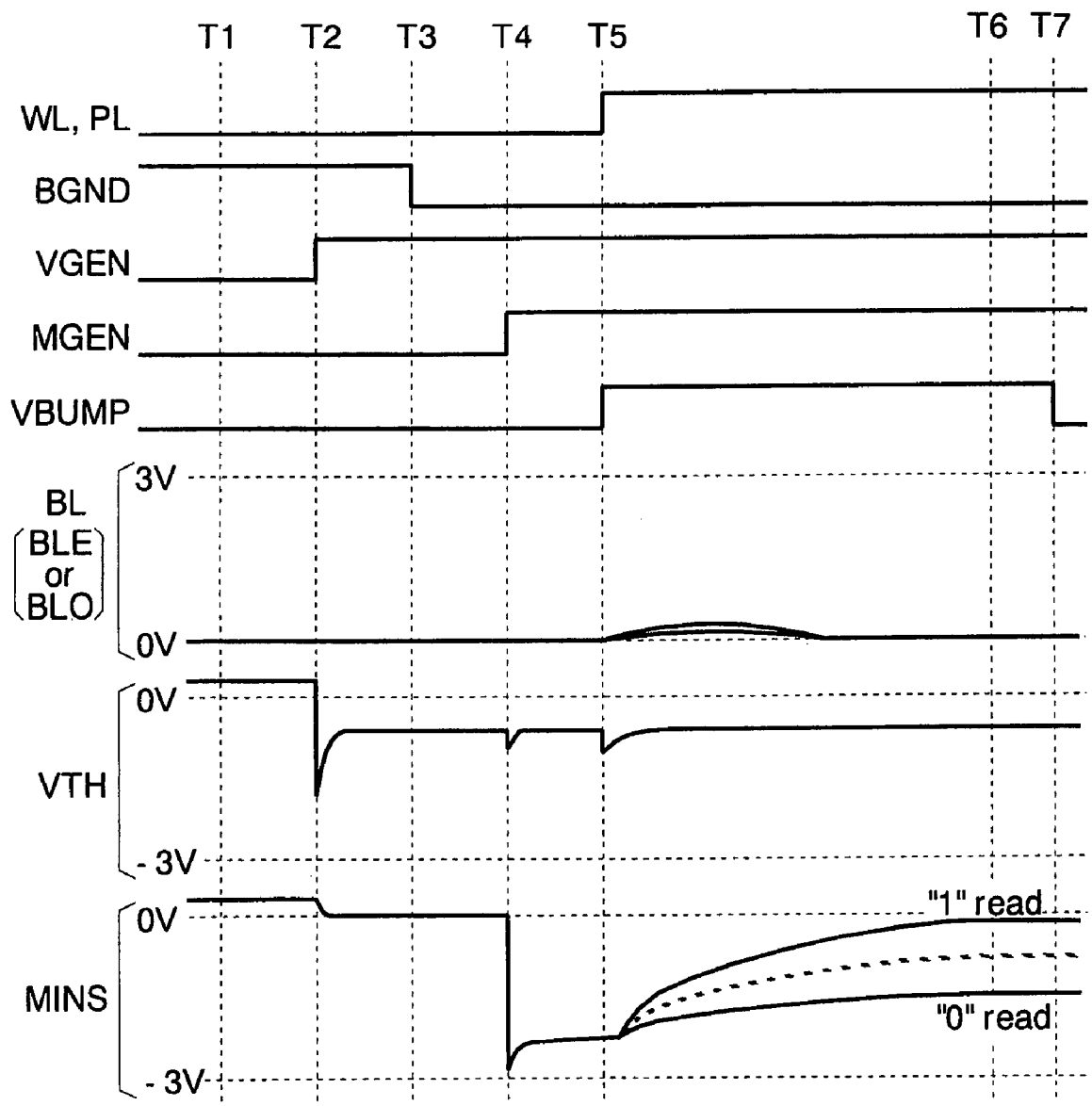
FIG. 8 is a waveform chart showing a read operation of the ferroelectric memory according to the third embodiment.

FIG. 8 shows a read operation of the ferroelectric memory according to the third embodiment. In this embodiment, the waveform of the voltage controlling signal VGEN is the same as the waveform of the voltage controlling signal VGENP in the first embodiment. The control signal VBUMP changes to high level at time T5, which is the same as the activation timing of the word line WL and the plate line PL, and changes to low level at time T7. The other waveforms are the same as in the first embodiment (FIG. 4), except the waveform of the node VTH.

At time T2, the voltage controlling signal VGEN changes to high level, and then the voltage of the node VTH is clamped to, for example, approximately –0.5 V in accordance with the threshold voltage of the pMOS transistor 28b. At time T4, the negative voltage controlling signal MGEN changes to high level. The voltage of the node MGENX falls by 3 V, and the voltage of the node MINS also falls by approximately 3 V. Here, the voltages of the bit line BL and the node VTH are 0 V and –0.5 V, respectively. The absolute value of the gate-to-source voltage of the pMOS transistor 12 is smaller than the absolute value of the threshold voltage of the pMOS transistor 12. Consequently, no leakage occurs from the node MINS to the bit line BL, and the voltage of the node MINS remains unchanged during the period T4-T5.

At time T5, the word line WL and plate line PL change to high level, and the control signal VBUMP changes to high level simultaneously. Because of the capacitive coupling of the capacitor C7, the node VTH falls below the threshold voltage (for example, –0.6 V) of the pMOS transistor 12 (for example, –0.8 V) in response to the change of the control signal VBUMP to high level. The voltage of the node VTH is clamped by the pMOS transistor 28b, and thus returns gradually to –0.5 V. While the voltage of the node VTH is lower than the threshold voltage of the pMOS transistor 12, the charge transferability of the pMOS transistor 12 increases temporarily so that a sufficient amount of current flows through the pMOS transistor 12. Thus, for a predetermined period from time T5, the charge read out to the bit line can be transferred to the node MINS. At time T7, the control signal VBUMP changes to low level, and the operation of the pre-sense amplifier PSA3 is completed.

This embodiment can provide the same effects as those of the first embodiment described above. Moreover, in this embodiment, the voltage of the node VTH is made higher than the threshold voltage of the pMOS transistor 12 during the period between when the voltage of the node MINS is set to a predetermined negative voltage and when the word line WL and plate line PL are activated. In synchronization with the activation of the word line WL and plate line PL, the voltage of the node VTH is temporarily made lower than the threshold voltage of the pMOS transistor 12. This makes it possible to avoid leakage between the drain and source of the pMOS transistor 12 before a charge is read out from the memory cell MC to the bit line BL. After the charge is read out from the memory cell MC to the bit line BL, a read voltage sufficient for the sense amplifier SA to operate with according to the logical value of data stored in the memory cell MC can be generated on the node MINS.

Since the inverting amplifier 16 (FIG. 3) is not formed in the pre-sense amplifiers PSA3, the pre-sense amplifiers PSA3 can be reduced in layout size. The pre-sense amplifiers PSA3 are circuits necessary for the respective bit lines BL, and a large number of them thus are arranged within a chip. Consequently, the reduced layout size of the pre-sense amplifiers PSA3 can reduce the chip size of the ferroelectric memory significantly, allowing a reduction of chip cost. Moreover, since a voltage intermediate between the power supply voltage VDD and the ground voltage is applied as the input voltage to the inverting amplifier 16, a feedthrough current flows from the power supply line VDD to the ground line all the time. Consequently, the ferroelectric memory can be reduced in power consumption since no inverting amplifier 16 is used.

Figure 9:
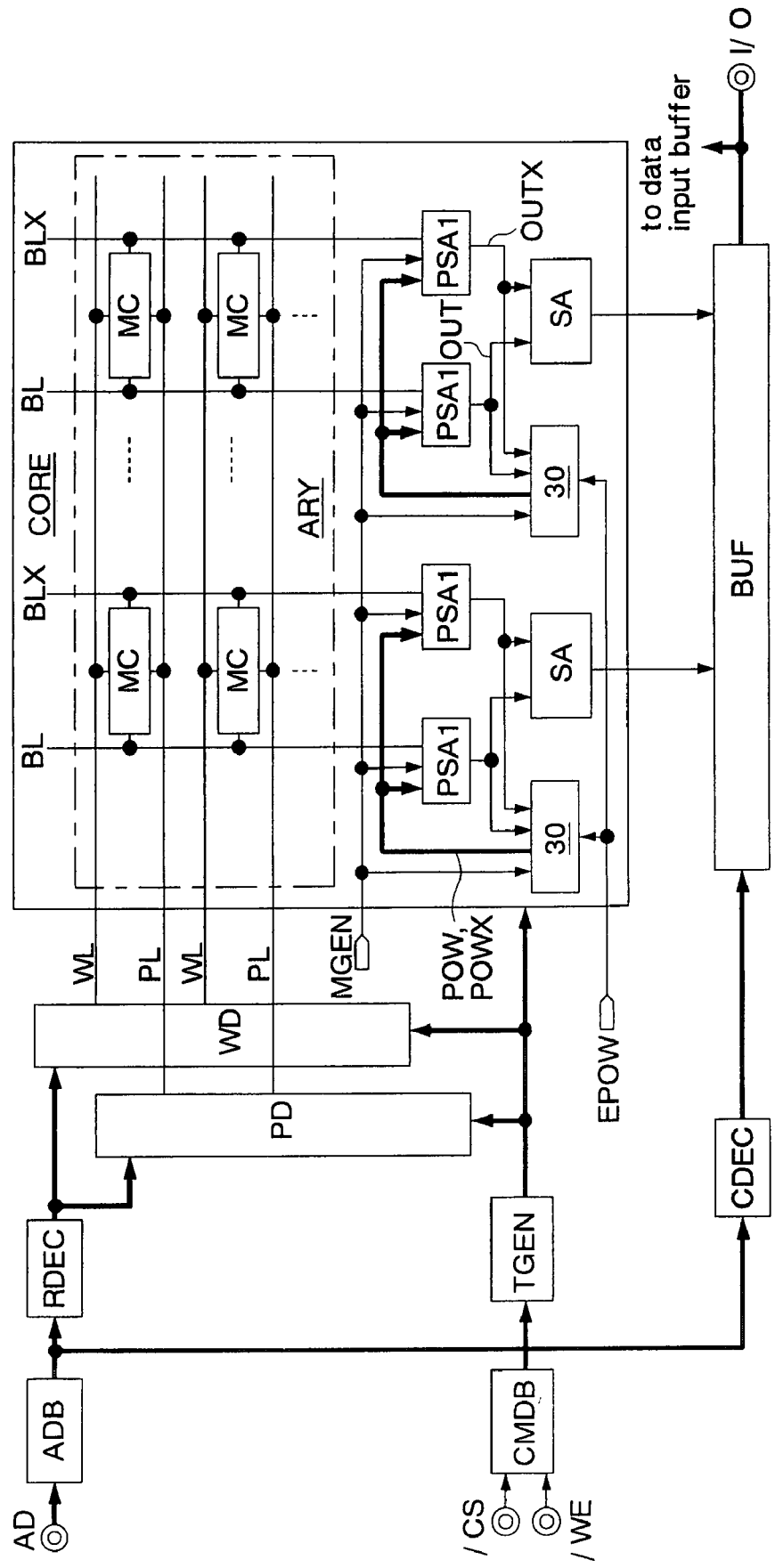
FIG. 9 is a block diagram showing a fourth embodiment of the semiconductor memory of the present invention.

FIG. 9 shows a fourth embodiment of the semiconductor memory of the present invention. The same elements as those described in the first embodiment will be designated by identical reference numbers or symbols. Detailed description thereof will be omitted. In this embodiment, the memory core CORE is different from that of the first embodiment. The rest of the configuration is the same as in the first embodiment. That is, the semiconductor memory is formed as a ferroelectric memory on a silicon substrate by using CMOS processes. The ferroelectric memory is used, for example, as a work memory of a hand-held terminal such as a cellular phone.

The memory cell array ARY of the memory core CORE is composed of memory cells MC typically referred to as 2T2C, which are connected to complementary bit lines BL and BLX. The bit lines BL and BLX are connected to respective pre-sense amplifiers PSA1. The memory core CORE has a detecting circuit 30 with respect to each of the pairs of pre-sense amplifiers PSA1 corresponding to the bit line pairs BL, BLX. When either one of output voltages OUT and OUTX output from the pair of pre-sense amplifiers PSA1 exceeds a predetermined voltage (VSMT shown in FIG. 11), the detecting circuit 30 stops supplying the inverting amplifiers 16 in the pre-sense amplifiers PSA1 with power supply voltages VDD and VSS, thereby stopping the operation of the same.

Figure 10:
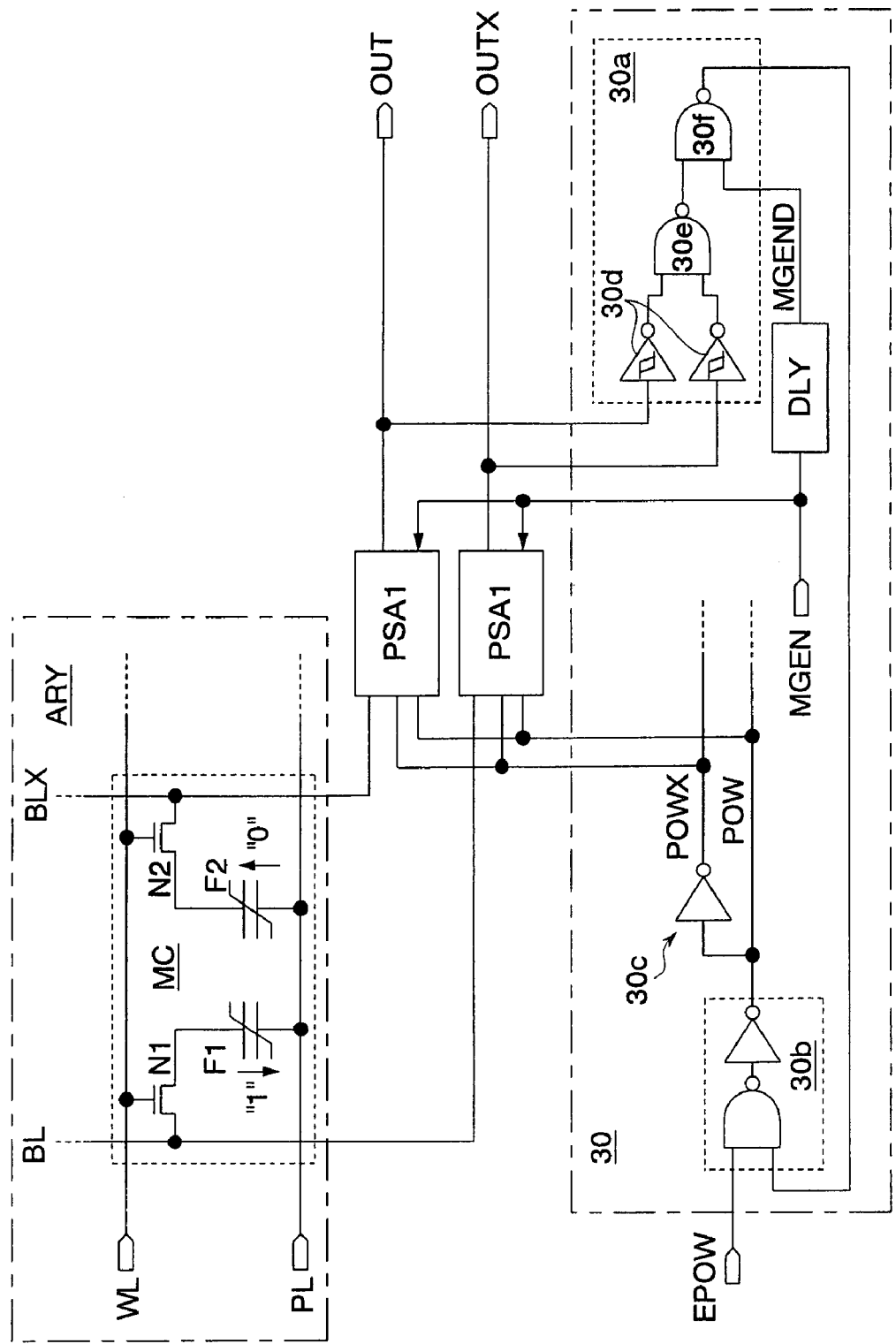
FIG. 10 is a circuit diagram showing the details of the memory cells and the detecting circuits shown in FIG. 9.

FIG. 10 shows the details of the memory cell array ARY and the detecting circuits 30 shown in FIG. 9. The memory cell array ARY, as mentioned above, is composed of 2T2C type memory cells MC. The memory cells MC each have a pair of transfer transistors N1 and N2 consisting of nMOS transistors, and a pair of ferroelectric capacitors F1 and F2. The ferroelectric capacitor F1 is connected at one end to a bit line BL through the transfer transistor N1, and at the other end to a plate line PL. The ferroelectric capacitor F2 is connected at one end to a bit line XBL through the transfer transistor N2, and at the other end to the plate line PL. The gates of the transfer transistors N1 and N2 are connected to a common word line WL. In the diagram, the arrows attached to the ferroelectric capacitors F1 and F2 indicate the states of polarization. The upward arrow indicates that "logic 0" is contained therein. The downward arrow indicates that "logic 1" is contained therein. In 2T2C type cells, the pair of ferroelectric capacitors F1 and F2 are thus written with mutually reverse data. Consequently, the sense amplifiers SA shown in FIG. 9 differentially amplify the voltages on the nodes MINS corresponding to the charges read out to the complementary bit lines BL and BLX ("1 read" and "0 read" in FIG. 11 to be seen later), respectively, which are converted into positive voltage values. This eliminates the need for reference memory cells.

The detecting circuit 30 has a detecting unit 30a, a delay circuit DLY, an AND circuit 30b, and an inverter 30c. The detecting unit 30a has inverters 30d of Schmitt trigger type which receive the outputs OUT and OUTX of the corresponding pair of pre-sense amplifiers PSA1, respectively, a NAND gate 30e which receives the outputs of the inverters 30d, and a NAND gate 30f which receives the output of the NAND gate 30e and the output of the delay circuit DLY. The threshold voltages of the inverters 30d at a rise in input are set at VSMT. That is, the inverters 30d change their outputs from high level to low level when their input voltages exceed VSMT.

The NAND gate 30e functions as an OR gate of negative logic. The NAND gate 30f operates in a period when the negative voltage controlling signal MGEN delayed by the delay circuit DLY for a predetermined time, or a delay signal MGEND, is at high level. The NAND gate 30f changes its output from high level to low level in response to a change of either of the inverters 30d to low level. The AND circuit 30b masks the transmission of a power controlling signal EPOW during a period when the output of the NAND gate 30f is at low level. Masking the power controlling signal EPOW keeps the power controlling signals POW and POWX at low level and high level, respectively.

Figure 11:
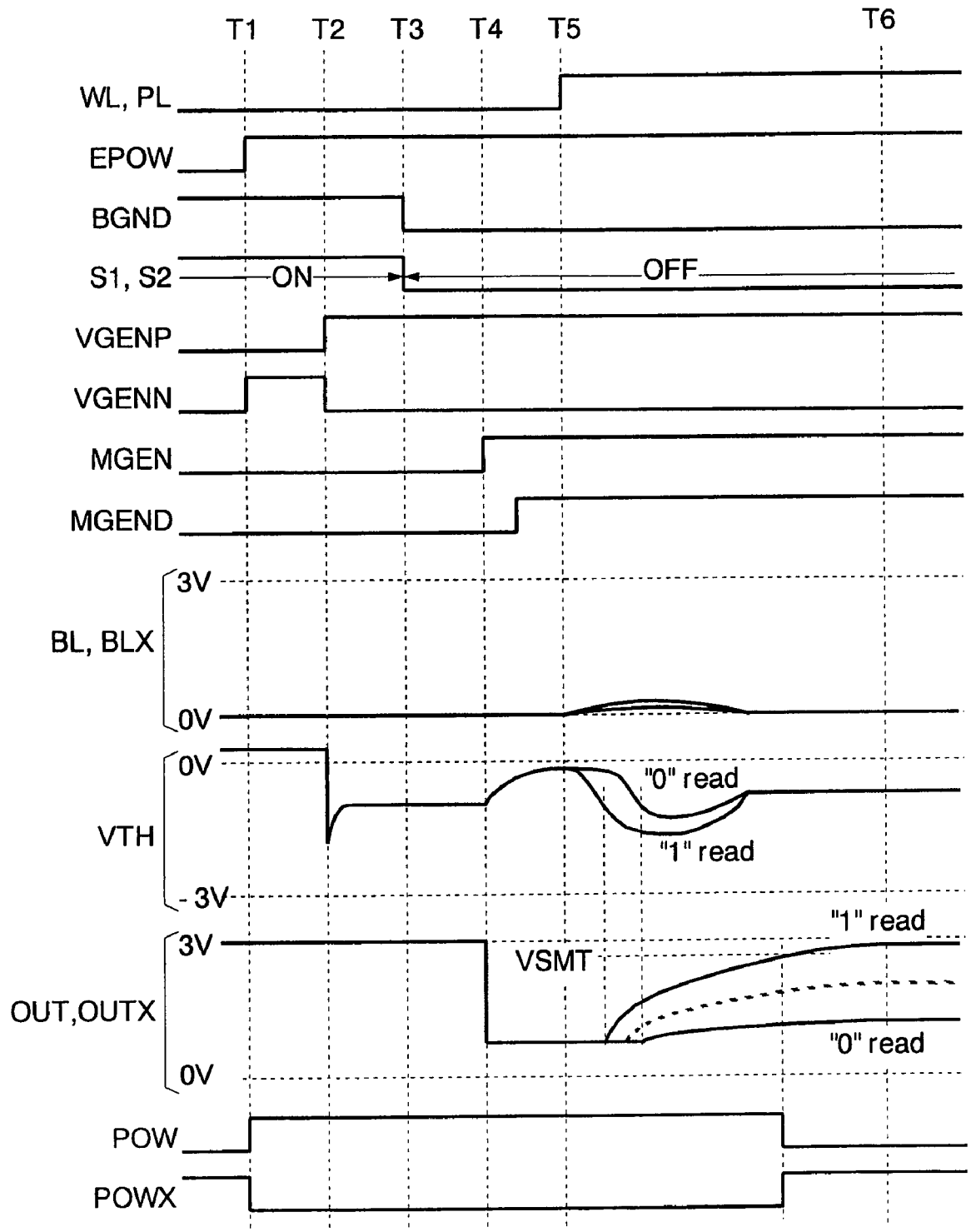
FIG. 11 is a waveform chart showing a read operation of the ferroelectric memory according to the fourth embodiment.

FIG. 11 shows a read operation of the ferroelectric memory according to the fourth embodiment. This embodiment differs from the first embodiment in the inactivation timing of the power controlling signals POW and POWX. Because of the provision of the detecting circuits 30, the waveforms of the power controlling signal EPOW and the delay signal MGEND are added. The read voltages OUT and OUTX are also added. The other waveforms are the same as in the first embodiment (FIG. 4).

In a 2T2C type memory cell MC, either one of the voltages of the nodes OUT and OUTX corresponding to the complementary bit lines BL and BLX respectively, always exceeds the threshold voltage VSMT of the Schmitt trigger inverter 30d in the period T5-T6. When the detecting circuit 30 detects that either one of the voltages of the nodes OUT and OUTX has exceeded the threshold voltage VSMT, it changes the power controlling signals POW and POWX to low level and high level, respectively, to stop supplying the power supply voltage VDD and the ground voltage to the inverting amplifiers 16 in the pre-sense amplifiers PSA1. As a result, the inverting amplifiers 16 stop their amplifying operations. Since a voltage intermediate between the power supply voltage VDD and the ground voltage is applied as the input voltage to the inverting amplifiers 16, feedthrough currents flow from the power supply lines VDD to the ground lines all the time. While in nonoperation, the power supply to the inverting amplifiers 16 can be interrupted to reduce the power consumption in read operations.

This embodiment can provide the same effects as those of the first embodiment described above. Besides, in this embodiment, the inverting amplifiers 16 are supplied with power only when necessary. It is therefore possible to reduce feedthrough currents and reduce the power consumption of the ferroelectric memory in operation.

Moreover, since the present invention is applied to a ferroelectric memory having memory cells of 2T2C type, either one of the read voltages OUT and OUTX always reach the threshold voltage VSMT. Consequently, the operation of the inverting amplifiers 16 can be stopped for each read operation regardless of the logical values of the data retained in the memory cells MC. As a result, it is possible to reduce the power consumption in read operations all the time.

Figure 12:
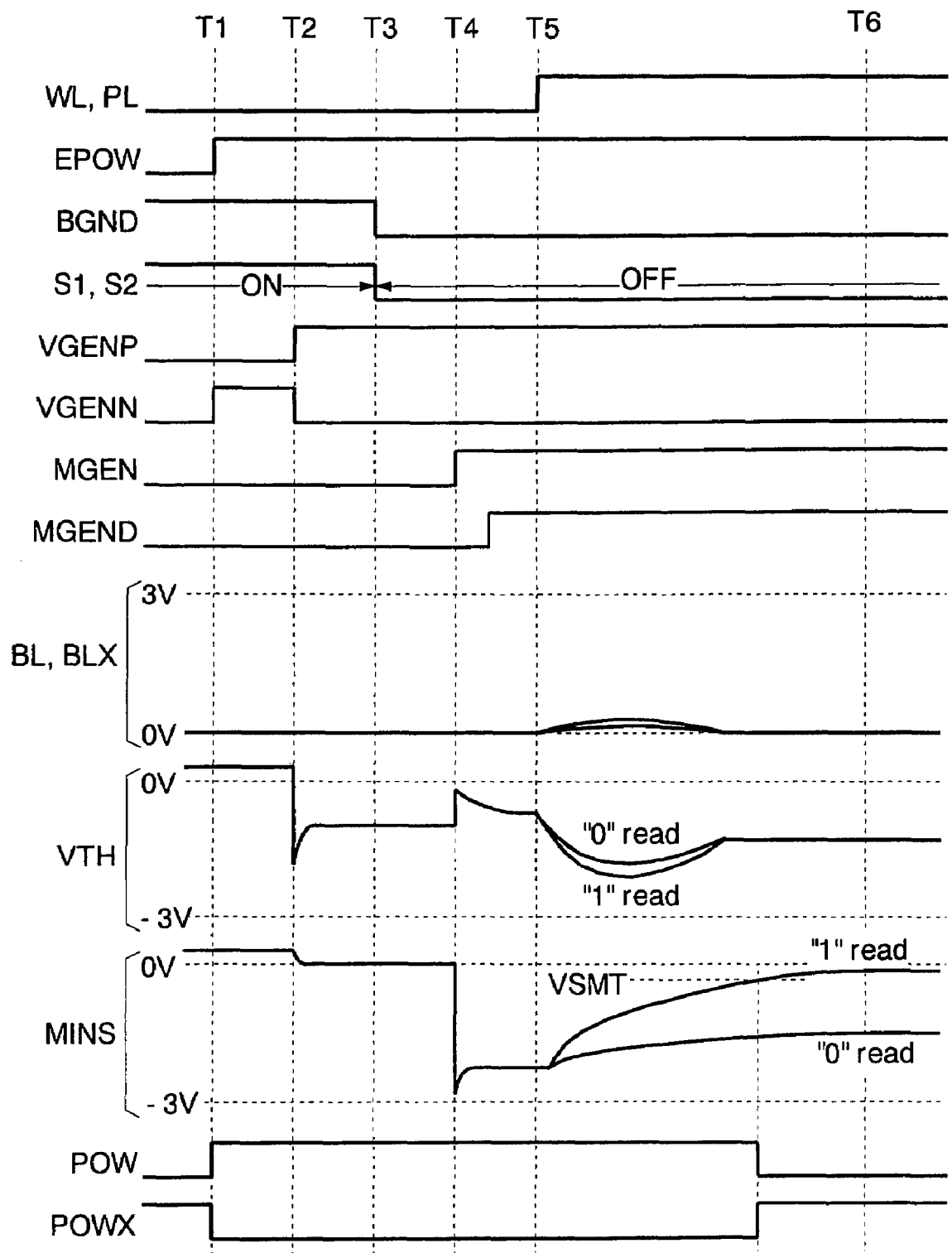
FIG. 12 is a waveform chart showing a read operation of the ferroelectric memory according to a fifth embodiment.

FIG. 12 shows a read operation of the ferroelectric memory according to a fifth embodiment. The same elements as those described in the first embodiment will be designated by identical reference numbers or symbols. Detailed description thereof will be omitted. In this embodiment, pre-sense amplifiers PSA2 (FIG. 5) are formed instead of the pre-sense amplifiers PSA1 of the fourth embodiment. The rest of the configuration is the same as in the fourth embodiment. That is, the semiconductor memory is formed as a ferroelectric memory on a silicon substrate by using CMOS processes. The ferroelectric memory is used, for example, as a work memory of a hand-held terminal such as a cellular phone. This embodiment can provide the same effects as those of the first and fourth embodiments described above.

Figure 13:
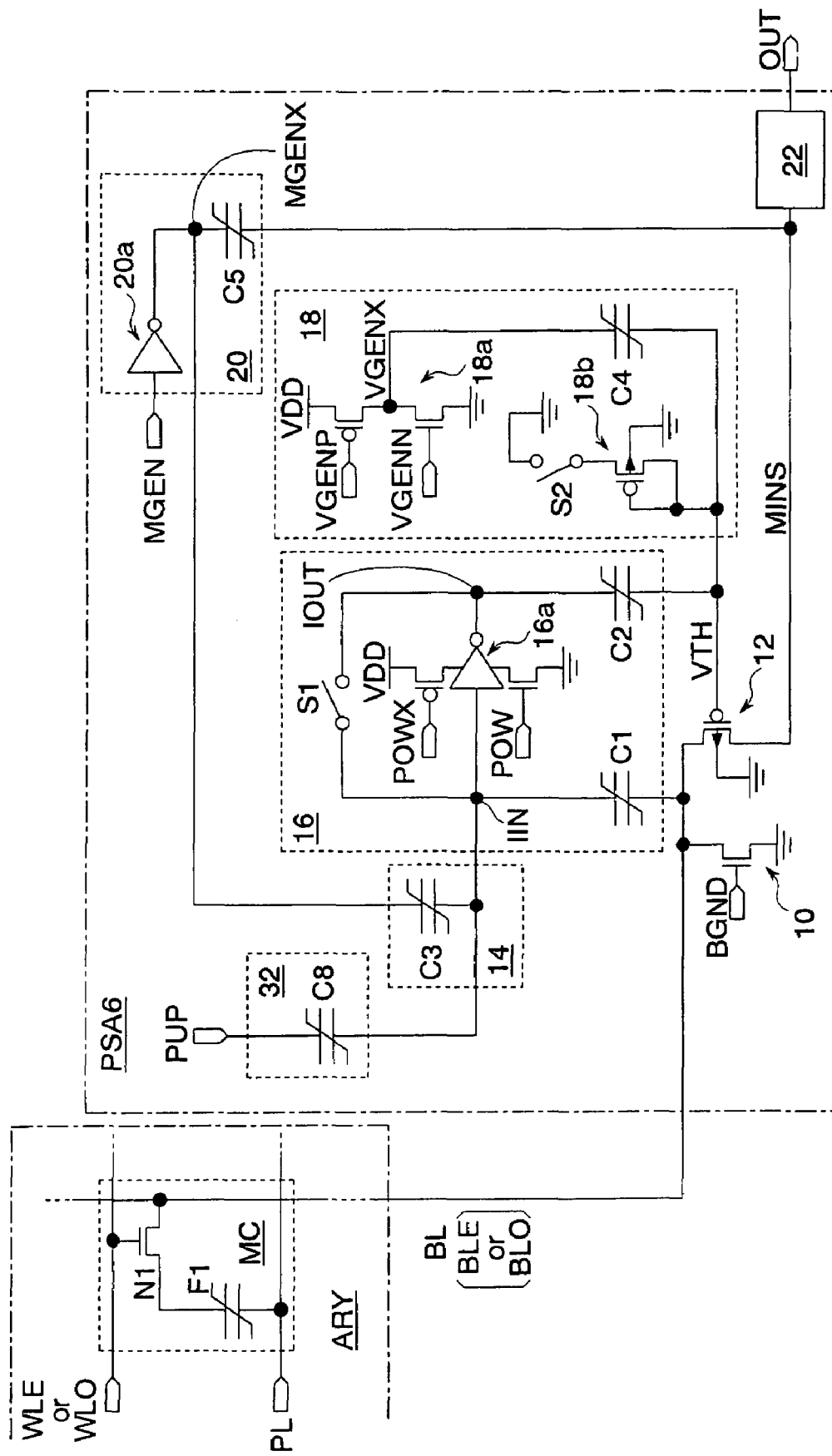
FIG. 13 is a circuit diagram showing the details of the pre-sense amplifier according to a sixth embodiment of the present invention.

FIG. 13 shows a sixth embodiment of the semiconductor memory of the present invention. The same elements as those described in the first embodiment will be designated by identical reference numbers or symbols. Detailed description thereof will be omitted. In this embodiment, pre-sense amplifiers PSA6 are formed instead of the pre-sense amplifiers PSA1 of the first embodiment. The rest of the configuration is the same as in the first embodiment. That is, the semiconductor memory is formed as a ferroelectric memory on a silicon substrate by using CMOS processes. The ferroelectric memory is used, for example, as a work memory of a hand-held terminal such as a cellular phone. The ferroelectric memory has the same basic configuration as in FIGS. 1 and 2 seen above, except in the pre-sense amplifiers.

The pre-sense amplifiers PSA6 are constituted by adding a capacitor C8 (pull-up circuit 32, transferring control circuit) made of a ferroelectric material to the pre-sense amplifiers PSA1 of the first embodiment. In other respects, the pre-sense amplifiers PSA6 have the same configuration as that of the pre-sense amplifiers PSA1. The capacitor C8 receives a pull-up signal PUP at one end, and is connected at the other end to the input terminal IIN of the feedback inverter 16a formed in the inverter amplifier 16. The capacitor C8 has a capacitance sufficiently smaller than that of the capacitor C1 connecting the input terminal INN and the bit line BL, which is approximately the same as the capacitance of the capacitor C3.

Figure 14:
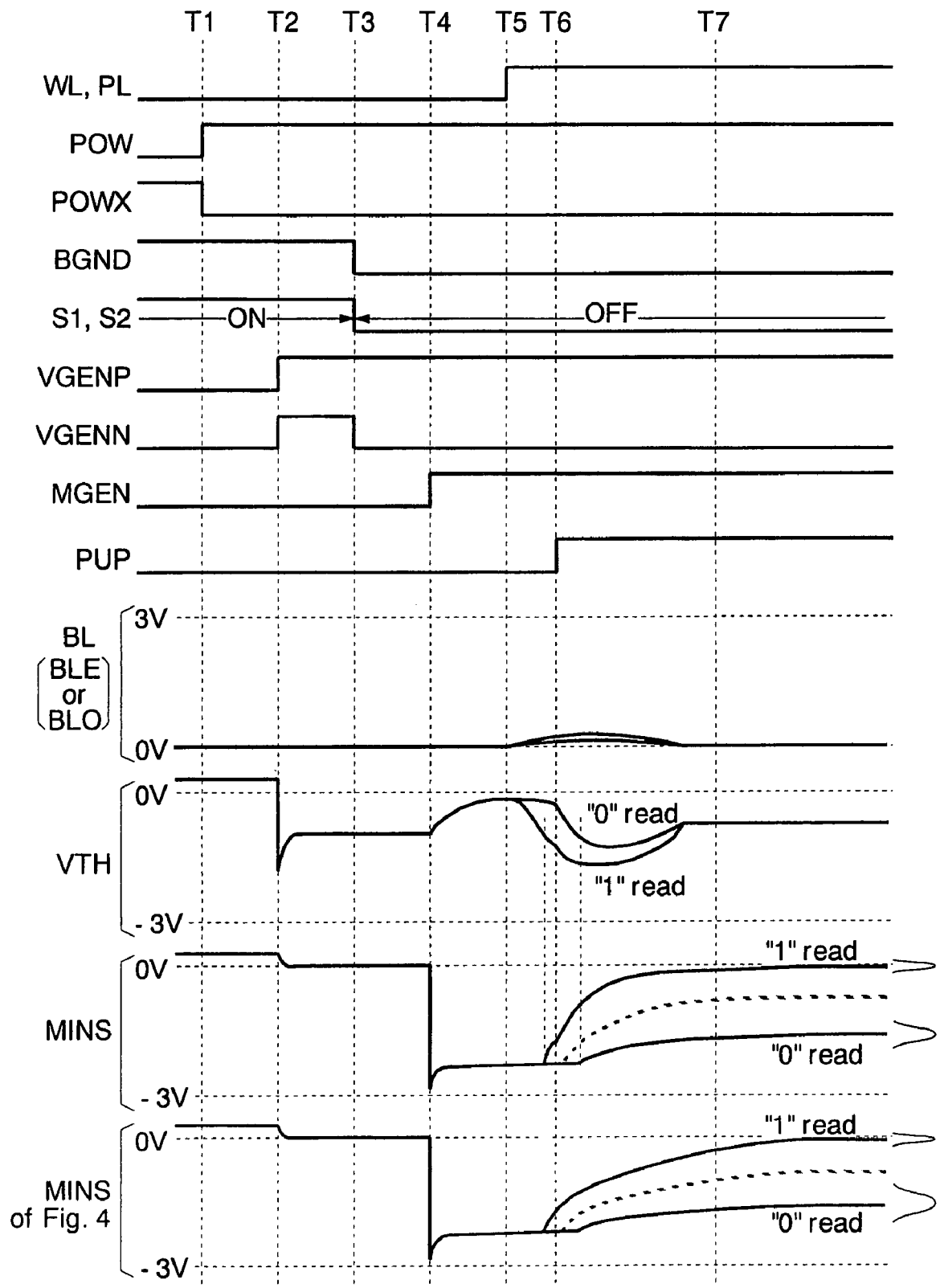
FIG. 14 is a waveform chart showing a read operation of the ferroelectric memory according to the sixth embodiment.

FIG. 14 shows a read operation of the ferroelectric memory according to the sixth embodiment. This embodiment differs from the first embodiment only in the waveforms of the node VTH at times T6 and thereafter. The other waveforms are the same as in the first embodiment (FIG. 4). After the negative voltage controlling signal MGEN rises and the word line WL and the plate line PL are driven, the pull-up signal PUP rises at time T6.

The rise of the pull-up signal PUP at time T6 forcefully raises the input voltage IIN of the feedback inverter 16a slightly because of the capacitive coupling of the capacitor C8. This rise causes the output voltage IOUT of the feedback inverter 16a to drop slightly. The voltage of the node VTH forcefully falls with the output voltage IOUT because of the capacitive coupling of the capacitor C2. Accordingly, a fall rate of the node VTH increases slightly from time T6.

As the voltage of the node VTH falls, the gate-to-source voltage (absolute value) of the pMOS transistor 12 (charge transferring circuit) increases, and the leakage current flowing from the node MINS to the bit line BL through the pMOS transistor 12 increases. That is, the charge transferability of the charge transferring circuit 12 improves. Therefore, the charges read out from the ferroelectric capacitor F1 to the bit line BL are transferred to the node MINS without being left in the bit line BL. The change in voltage of the node MINS (charging speed) is more significant as compared to that of the first embodiment (the waveforms of the node MINS in FIG. 4). Since the charges read out onto the bit line BL can be transferred to the node MINS without fail, the difference of the read voltages (the node MINS and the node OUT in FIG. 13) due to the variations in characteristic of the memory cells MC decreases.

It should be noted that the capacitance of the capacitor C8 is designed so that the voltage of the bit line BL becomes 0 V after the charges on the bit line BL are transferred to the node MINS. According to the first embodiment, the inverting amplifier 16 operates in response to the voltage of the bit line BL only. Therefore, it is difficult to transfer all the charges read out onto the bit line BL to the node MINS, and the voltage of the bit line BL is slightly higher than 0 V after the read operation (at time T7, for example). In other words, the rise in voltage of the bit line BL is not enough to make the input voltage IIN of the feedback inverter 16a the same as the output voltage IOUT in value. According to this embodiment, the capacitor C8 forcefully returns the input voltage INN of the feedback inverter 16a to the same value as the output voltage IOUT, whereby all the charges read out onto the bit line BL can be transferred to the node MINS.

The curves at the right end of the waveforms of the node MINS in the diagram show the distribution showing the variations in read voltage (variations in characteristic of the memory cells MC). The variations in read voltage of the data "0" are large according to the first embodiment (waveforms of the node MINS in FIG. 4), whereas the variations in read voltage of the data "0" can be made smaller according to this embodiment. Since the read margin of the data "0" can be increased in the worst memory cell MC, it is possible to ship the ferroelectric memory which has been defective in the first embodiment due to the insufficient margin as the nondefective ferroelectric memory. This causes the yield of the ferroelectric memory to improve. It should be noted that the read margin is the difference between the read voltage of the data "0" and the read voltage from the reference memory cell RMC shown by the broken line in the drawing. Incidentally, the read voltage of the data "1" at the node MINS becomes approximately 0 V in both of the first and sixth embodiments. Therefore, the variations in read voltage are small.

Moreover, since the read voltage MINS of the data "1" can be brought closer to 0 V quickly, it is possible to determine the logic of data read out from the memory cell MC at the earlier timing (at time T7 in FIG. 14) than the first embodiment. This results in a shorter access time of the ferroelectric memory.

This embodiment can also provide the same effects as those of the first embodiment described above. Moreover, in this embodiment, the charges read out onto the bit line BL can be transferred to the node MINS without being left on the bit line BL, because of the capacitor C8 driven by the pull-up signal PUP. As a result of this, it is possible to make the variations in read margin of the data "0" smaller, and to improve the yield of the ferroelectric memory. Furthermore, the access time of the ferroelectric memory can be shortened.

Figure 15:
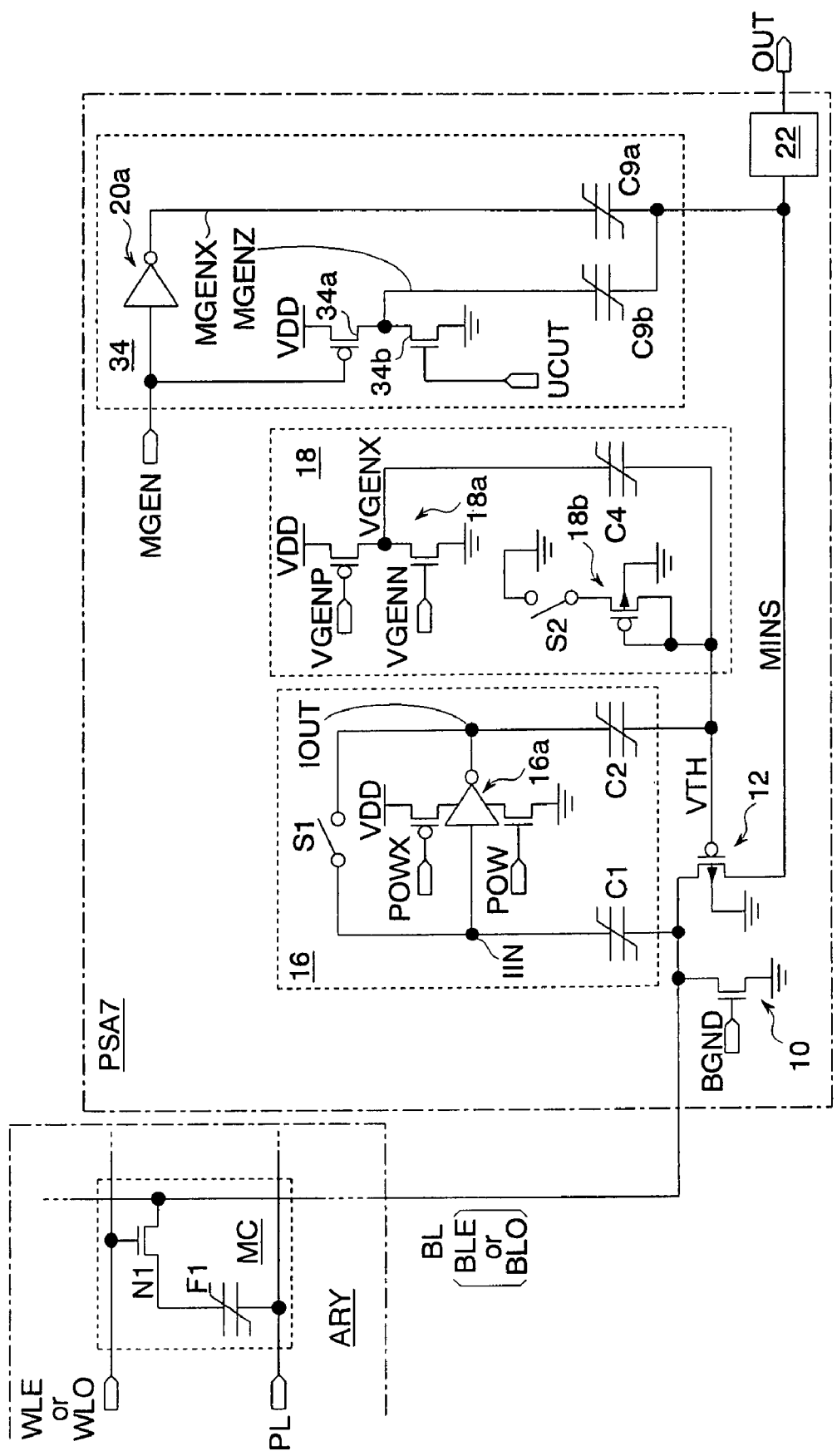
FIG. 15 is a circuit diagram showing the details of the pre-sense amplifier according to a seventh embodiment of the present invention.

FIG. 15 shows a seventh embodiment of the semiconductor memory of the present invention. The same elements as those described in the first embodiment will be designated by identical reference numbers or symbols. Detailed description thereof will be omitted. In this embodiment, pre-sense amplifiers PSA7 are formed instead of the pre-sense amplifiers PSA1 of the first embodiment. The rest of the configuration is the same as in the first embodiment. That is, the semiconductor memory is formed as a ferroelectric memory on a silicon substrate by using CMOS processes. The ferroelectric memory is used, for example, as a work memory of a handheld terminal such as a cellular phone. The ferroelectric memory has the same basic configuration as in FIGS. 1 and 2 seen above, except in the pre-sense amplifiers.

The pre-sense amplifiers PSA7 have a negative voltage generator 34 (charge storing circuit, initializing circuit), instead of the negative voltage generator 20 of the first embodiment. Moreover, the pre-sense amplifiers PSA7 do not have the leakage controlling circuit 14. In other respects, the pre-sense amplifiers PSA7 have the same configuration as that of the pre-sense amplifiers PSA1.

The negative voltage generator 34 has a CMOS inverter 20a which receives the negative voltage controlling signal MGEN and is connected to the node MGENX at its output, a capacitor C9a (first capacitor) arranged between the node MGENX and the node MINS, a pMOS transistor 34a connected in series between the power supply line VDD and the ground line, an nMOS transistor 34b, and a capacitor C9b (second capacitor) arranged between a drain node MGENZ of the transistors 34a and 34b and the node MINS. The pMOS transistor 34a receives the negative voltage controlling signal MGEN at its gate, and the nMOS transistor 34b receives a capacitor control signal UCUT at its gate. The capacitor control signal UCUT is generated by the timing generator TGEN shown in FIG. 1. Each of the capacitors C9a and C9b is made of the ferroelectric capacitor, for example, and the capacitance is designed to be half and two times the capacitance of the capacitor C4 in the first embodiment, respectively.

Figure 16:
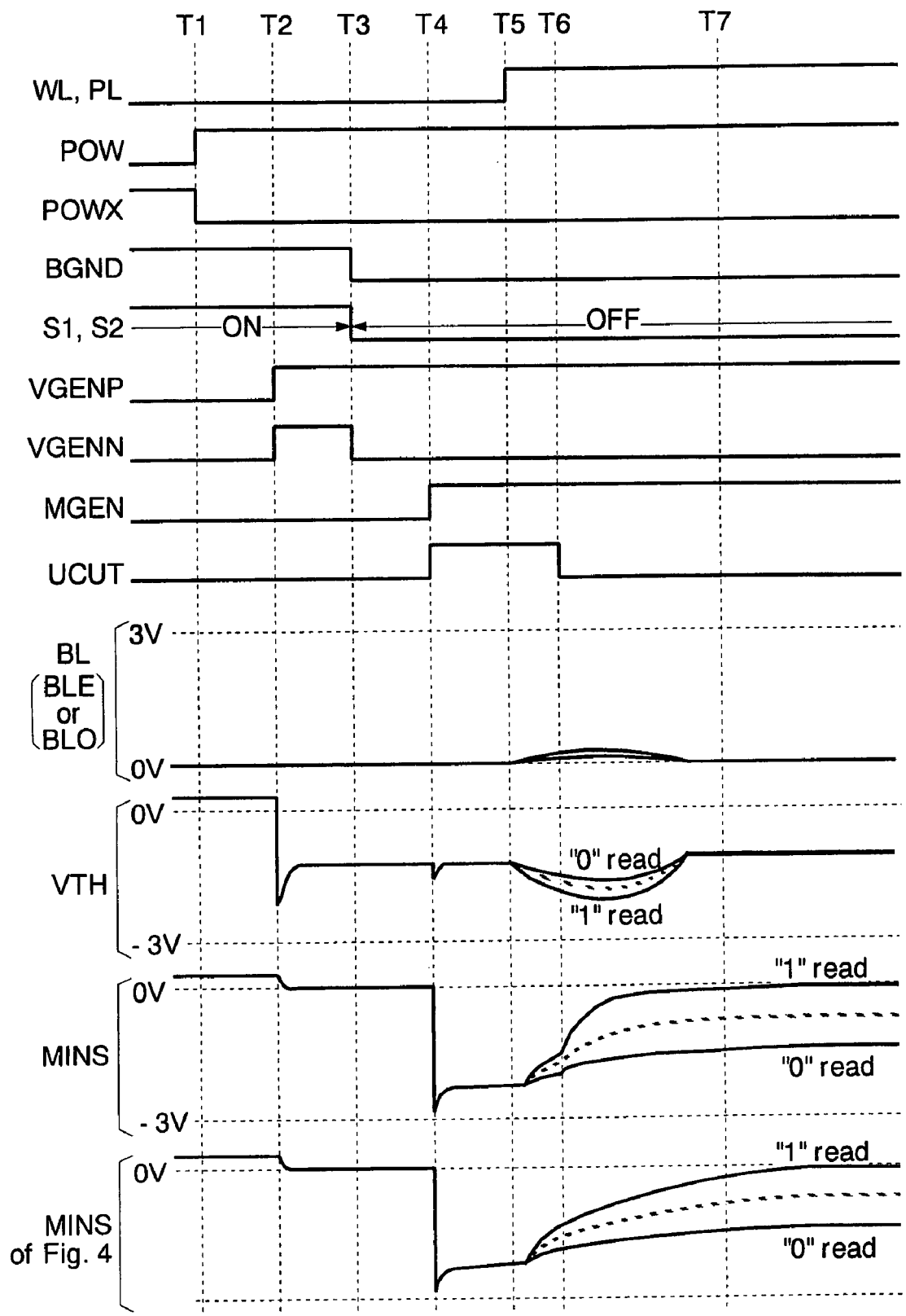
FIG. 16 is a waveform chart showing a read operation of the ferroelectric memory according to the seventh embodiment.

FIG. 16 shows a read operation of the ferroelectric memory according to the seventh embodiment. This embodiment differs from the first embodiment in the waveforms of the nodes VTH and MINS at times T4 and thereafter. The other waveforms are the same as in the first embodiment (FIG. 4). The capacitor control signal UCUT rises at time T4 and falls at time T6. Since the pre-sense amplifiers PSA7 of this embodiment do not have the leakage controlling circuit 14, the voltage of the node VTH does not rise and remains unchanged for the most part during the period from time T4 to time T5.

At time T4, the negative voltage controlling signal MGEN and the capacitor control signal UCUT change to high level simultaneously. The pMOS transistor 34a turns off, and the nMOS transistor 34b turns on. The voltages of the nodes MGENX and MGENZ both change from high level to low level. Because of the capacitive coupling of the capacitors C9a and C9b, the voltage of the node MINS falls as the voltages of the nodes MGEXN and MGENZ fall. Given the power supply voltage VDD of 3 V, the voltages of the nodes MGENX and MGENZ fall by 3 V, and the voltage of the node MINS also falls by approximately 3 V. Since the voltage of the node MINS is initialized to 0 V, it falls to approximately −3 V due to the change in voltage of the node MGENX. Thereafter, the voltage of the node MINS gradually rises due to the loss resulting from the parasitic capacitances and the leakage current of the pMOS transistor 12 which is weakly turned on in advance. However, the total capacitance of the capacitors C9a and C9*b* is 2.5 times as large as the capacitance of the capacitor C5 of the first embodiment, and therefore the degree of rise is smaller than that of the first embodiment. The operation from time T4 to time T6 is the same as that of the first embodiment.

At time T5, the rise of the word line WL and the plate line PL operates the inverting amplifier 16 and drops the voltage of the node VTH. This causes the gate-source voltage (absolute value) of the pMOS transistor 12 to increase, the leakage current flowing from the node MINS to the bit line BL to increase, and the voltage of the node MINS to increase. However, since the capacitors C9*a* and C9*b* whose capacitance is larger than that of the capacitor C5 of the first embodiment are connected in parallel to the node MINS, the rise in voltage is moderate as compared to the first embodiment.

Meanwhile, at time T6, the fall of the capacitor control signal UCUT turns off the nMOS transistor 34*b* and causes the node MGENZ to enter the floating state. Accordingly, the capacitor C9*b* is released equivalently and becomes invisible from the node MINS. That is, the transistors 34*a* and 34*b* function as a connection release circuit which releases the electrical connection between the capacitor C9*b* and the charge transferring circuit 12 (node MINS), after the read operation is started. Moreover, the transistor 34*b* functions as a floating setting circuit which sets the other end of the capacitor C9*b* to enter the floating state after the read operation is started.

This results in the fact that the capacitor storing the charges transferred from the bit line BL to the node MINS is only the capacitor C9*a* whose capacitance is small. Accordingly, a rise rate in voltage of the node MINS drastically increases. However, the charges which are transferred from the memory cells MC to the node MINS from time T5 to time T6 are already stored in the capacitors C9*a* and C9*b*. Therefore, the voltage of the node MINS is prevented from rising when reading out the data "0". This results in a bigger difference between the read voltages (MINS, OUT) of the data "0" and the data "1". That is, the read margin increases.

Moreover, similarly to the sixth embodiment, since the read voltage MINS of the data "1" can be brought closer to 0 V quickly, it is possible to determine the logic of data read out from the memory cell MC at the earlier timing (at time T7 shown in FIG. 14) than the first embodiment. This results in a shorter access time of the ferroelectric memory.

This embodiment can also provide the same effects as those of the first embodiment described above. Moreover, in this embodiment, the capacitances of the capacitors C9*a* and C9*b* are reduced during the read operation, whereby the read margin can be improved. As a result of this, the yield of the ferroelectric memory can be improved. Furthermore, the access time of the ferroelectric memory can be shortened.

Figure 17:
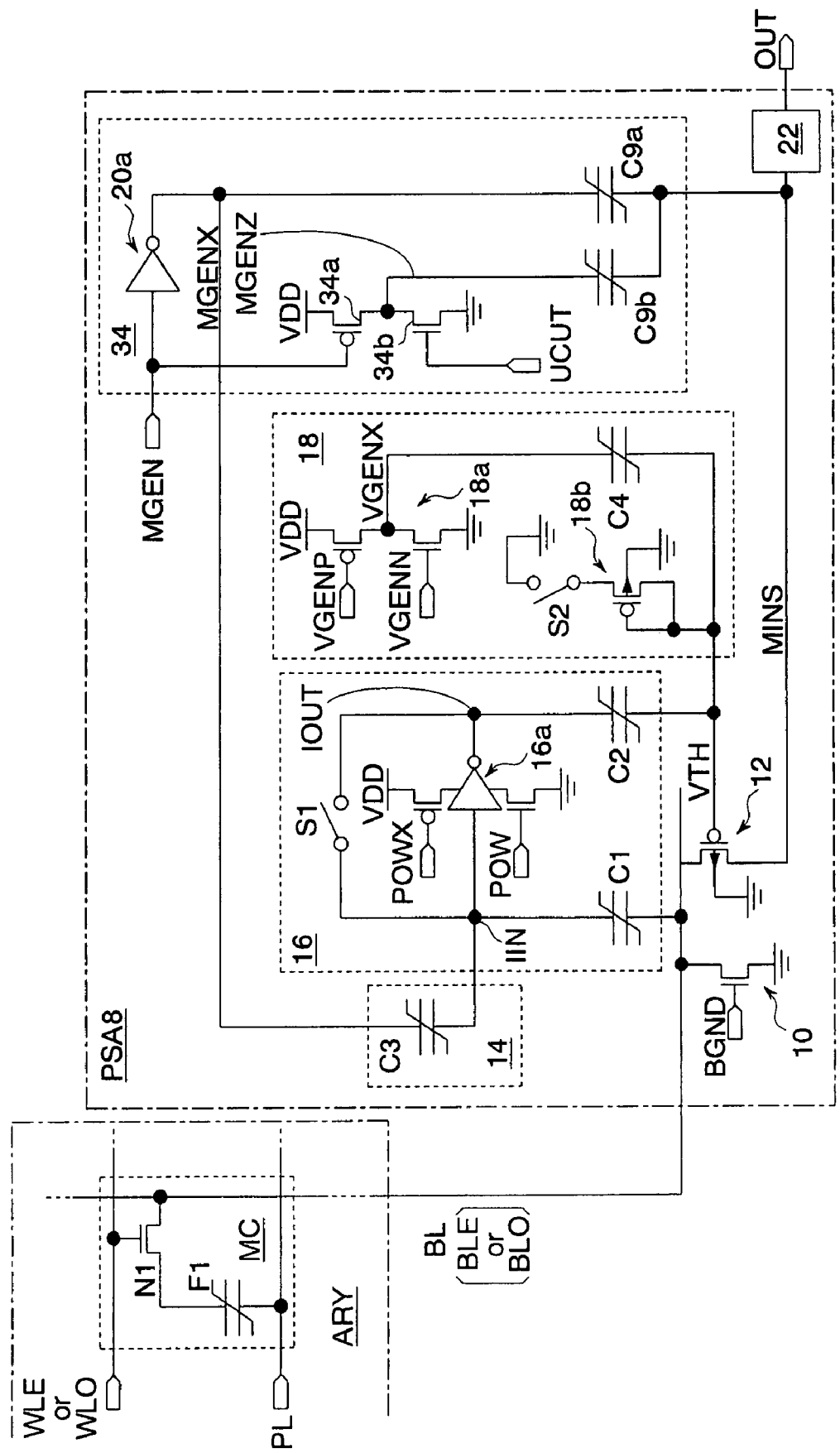
FIG. 17 is a circuit diagram showing the details of the pre-sense amplifier according to an eighth embodiment of the present invention.

FIG. 17 shows an eighth embodiment of the semiconductor memory of the present invention. The same elements as those described in the first and seventh embodiments will be designated by identical reference numbers or symbols. Detailed description thereof will be omitted. In this embodiment, pre-sense amplifiers PSA8 are formed instead of the pre-sense amplifiers PSA1 of the first embodiment. The rest of the configuration is the same as in the first embodiment. That is, the semiconductor memory is formed as a ferroelectric memory on a silicon substrate by using CMOS processes. The ferroelectric memory is used, for example, as a work memory of a hand-held terminal such as a cellular phone. The ferroelectric memory has the same basic configuration as in FIGS. 1 and 2 seen above, except in the pre-sense amplifiers.

The pre-sense amplifiers PSA8 have the negative voltage generator 34 of the seventh embodiment described above, instead of the negative voltage generator 20 of the first embodiment. In other respects, the pre-sense amplifiers PSA8 have the same configuration as that of the pre-sense amplifiers PSA1.

Figure 18:
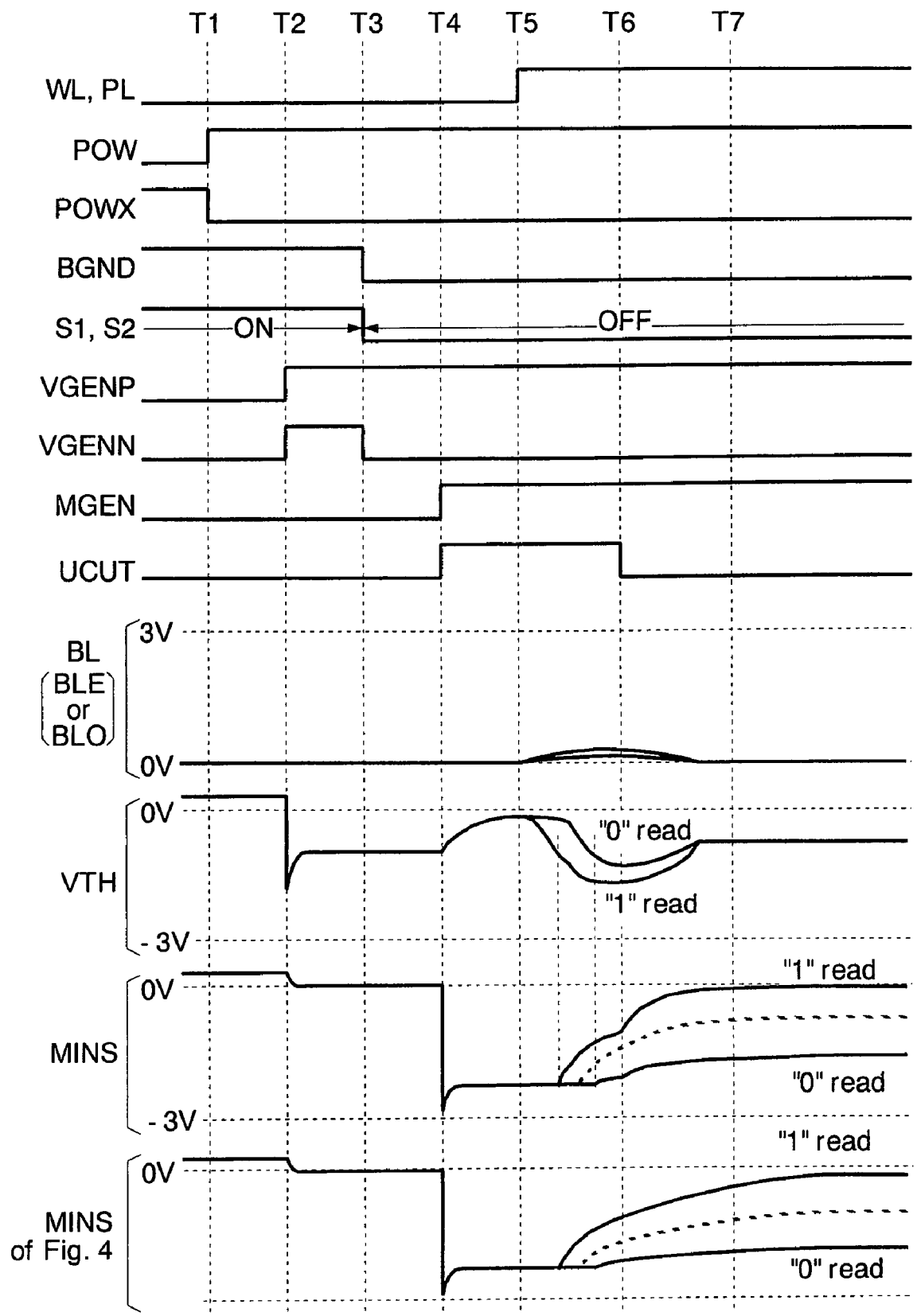
FIG. 18 is a waveform chart showing a read operation of the ferroelectric memory according to the eighth embodiment.

FIG. 18 shows a read operation of the ferroelectric memory according to the eighth embodiment. According to this embodiment, the waveforms up to time T5 are the same as in the first embodiment. The waveforms at times T5 and thereafter are the same as in the seventh embodiment. Incidentally, since the total capacitance of the capacitors C9*a* and C9*b* is greater than the capacitance of the capacitor C5 of the first embodiment, the rise in voltage of the node MINS from time T5 to time T6 is moderate as compared to the first embodiment. Similarly to the seventh embodiment described above, the capacitor control signal UCUT rises at time T4 and falls at time T6. This embodiment can also provide the same effects as those of the first and seventh embodiments described above.

Figure 19:
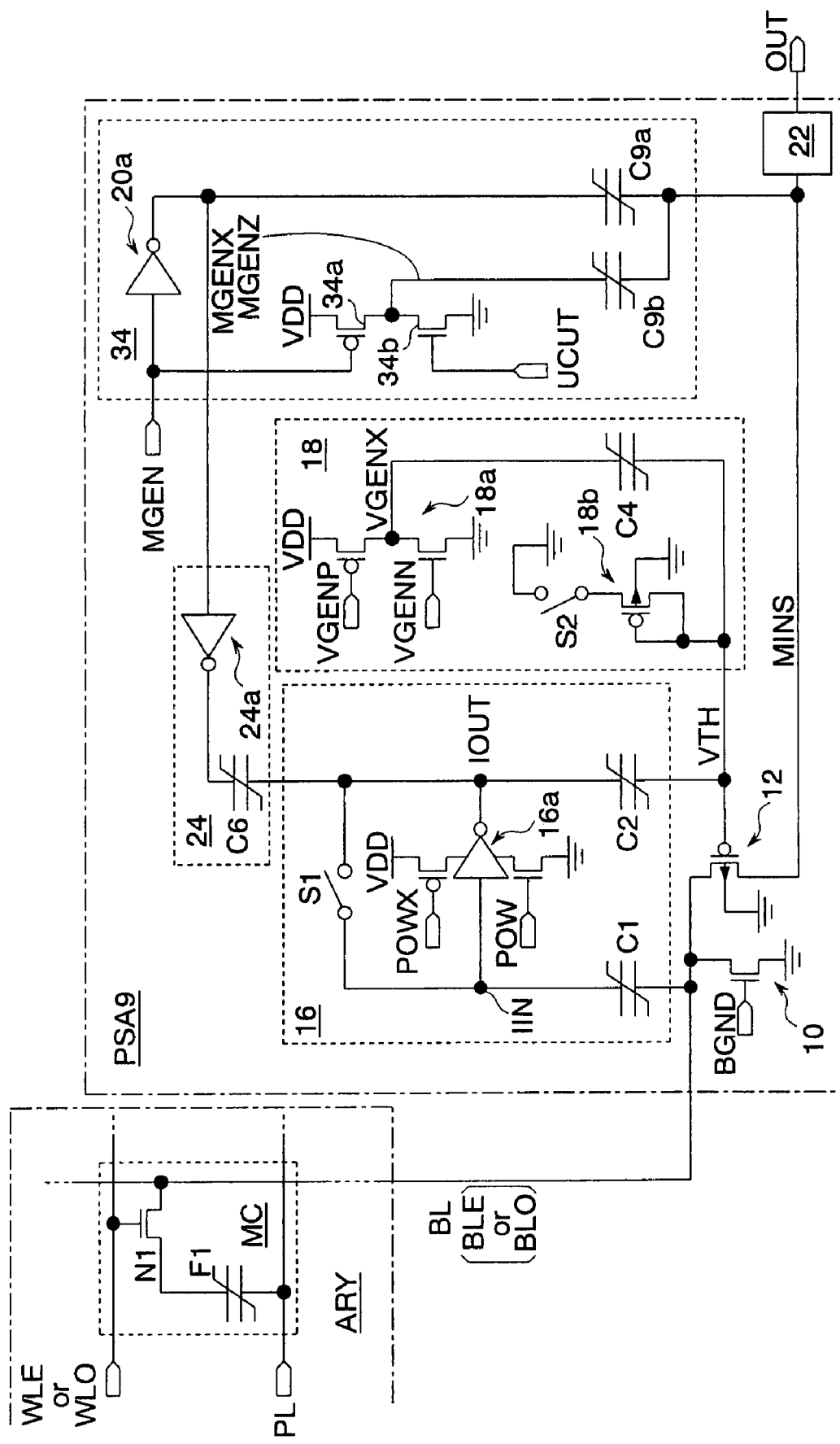
FIG. 19 is a circuit diagram showing the details of the pre-sense amplifier according to a ninth embodiment of the present invention.

FIG. 19 shows a ninth embodiment of the semiconductor memory of the present invention. The same elements as those described in the first, second and seventh embodiments will be designated by identical reference numbers or symbols. Detailed description thereof will be omitted. In this embodiment, pre-sense amplifiers PSA9 are formed instead of the pre-sense amplifiers PSA2 of the second embodiment. The rest of the configuration is the same as in the second embodiment. That is, the semiconductor memory is formed as a ferroelectric memory on a silicon substrate by using CMOS processes. The ferroelectric memory is used, for example, as a work memory of a hand-held terminal such as a cellular phone. The ferroelectric memory has the same basic configuration as in FIGS. 1 and 2 seen above, except in the pre-sense amplifiers.

The pre-sense amplifiers PSA9 have the negative voltage generator 34 of the seventh embodiment described above, instead of the negative voltage generator 20 of the second embodiment. In other respects, the pre-sense amplifiers PSA9 have the same configuration as that of the pre-sense amplifiers PSA2.

Figure 20:
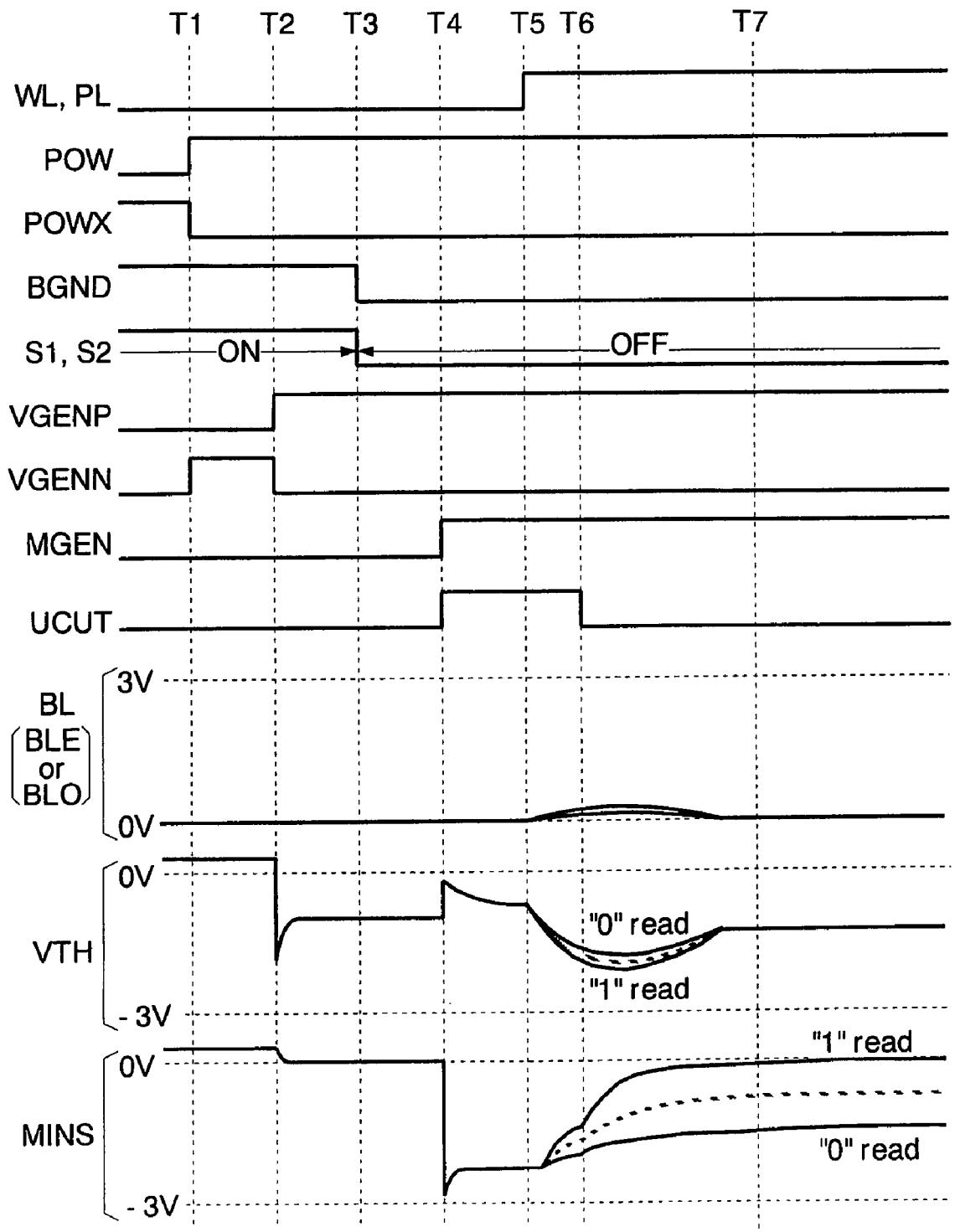
FIG. 20 is a waveform chart showing a read operation of the ferroelectric memory according to the ninth embodiment.

FIG. 20 shows a read operation of the ferroelectric memory according to the ninth embodiment. According to this embodiment, the waveforms up to time T5 are the same as in the second embodiment. The waveforms at times T5 and thereafter are almost the same as in the seventh embodiment. Incidentally, the rise in voltage of the node MINS from time T5 to time T6 is moderate as compared to the second embodiment. Similarly to the seventh embodiment described above, the capacitor control signal UCUT rises at time T4 and falls at time T6. This embodiment can also provide the same effects as those of the first, second and seventh embodiments described above.

Figure 21:
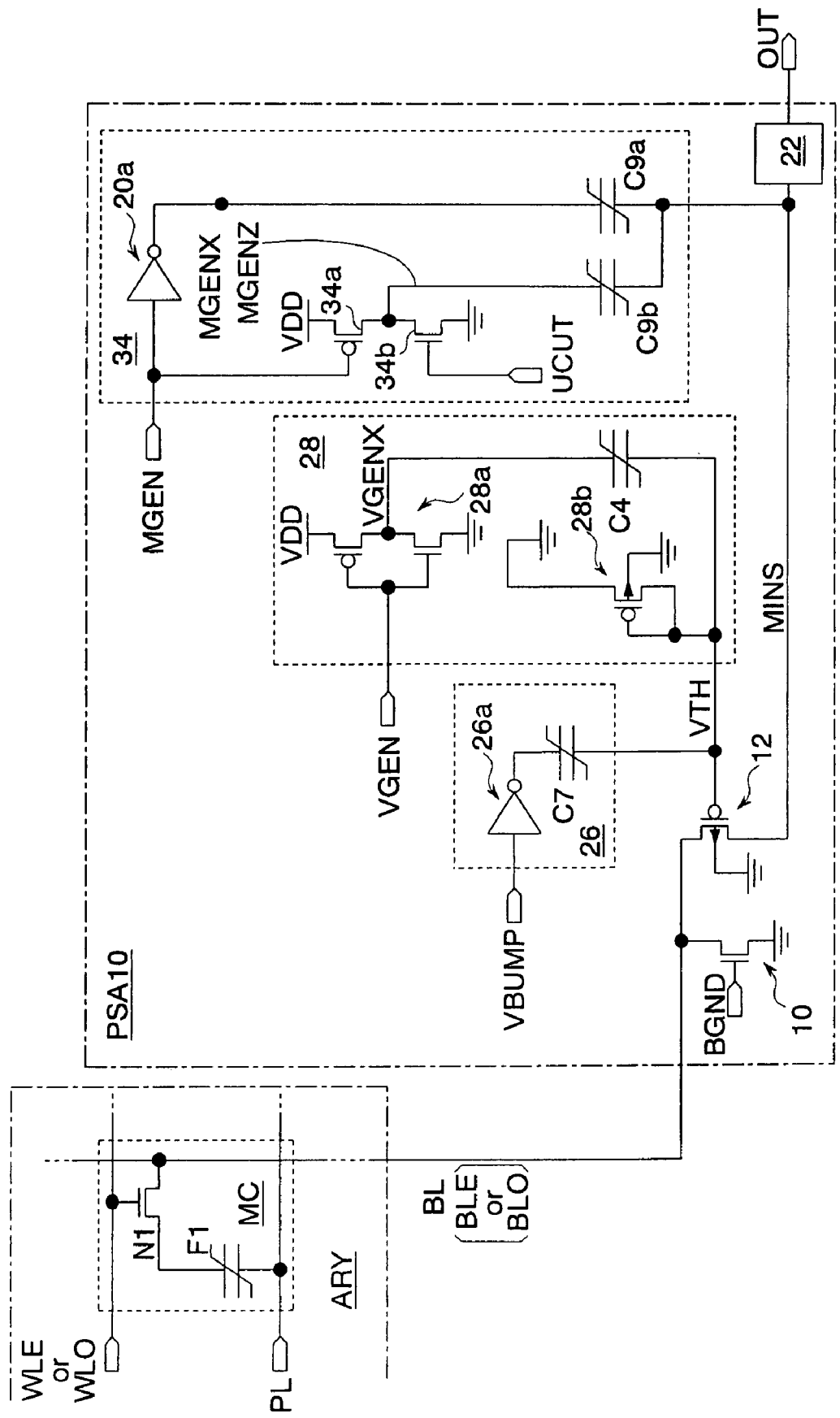
FIG. 21 is a circuit diagram showing the details of the pre-sense amplifier according to a tenth embodiment of the present invention.

FIG. 21 shows a tenth embodiment of the semiconductor memory of the present invention. The same elements as those described in the first, third and seventh embodiments will be designated by identical reference numbers or symbols. Detailed description thereof will be omitted. In this embodiment, pre-sense amplifiers PSA10 are formed instead of the pre-sense amplifiers PSA3 of the third embodiment. The rest of the configuration is the same as in the third embodiment. That is, the semiconductor memory is formed as a ferroelectric memory on a silicon substrate by using CMOS processes. The ferroelectric memory is used, for example, as a work memory of a hand-held terminal such as a cellular phone. The ferroelectric memory has the same basic configuration as in FIGS. 1 and 2 seen above, except in the pre-sense amplifiers.

The pre-sense amplifiers PSA10 have the negative voltage generator 34 of the seventh embodiment described above, instead of the negative voltage generator 20 of the third embodiment. In other respects, the pre-sense amplifiers PSA10 have the same configuration as that of the pre-sense amplifiers PSA3.

Figure 22:
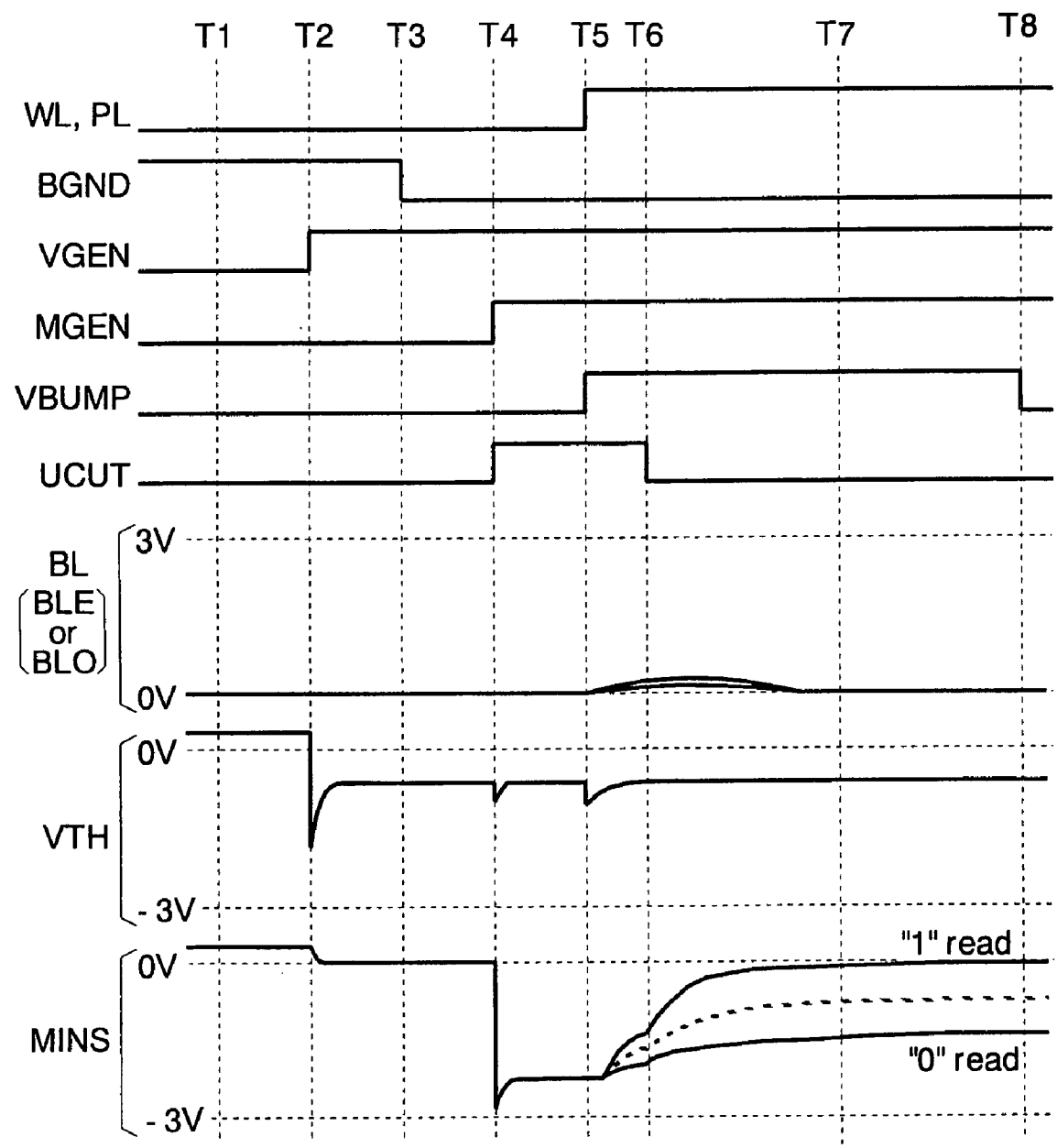
FIG. 22 is a waveform chart showing a read operation of the ferroelectric memory according to the tenth embodiment.

FIG. 22 shows a read operation of the ferroelectric memory according to the tenth embodiment. According to this embodiment, the waveforms up to time T5 are the same as in the third embodiment. The waveforms at times T5 and thereafter are almost the same as in the seventh embodiment. Incidentally, the rise in voltage of the node MINS from time T5 to time T6 is moderate as compared to the third embodiment. Similarly to the seventh embodiment described above, the capacitor control signal UCUT rises at time T4 and falls at time T6. This embodiment can also provide the same effects as those of the first, third and seventh embodiments described above.

Figure 23:
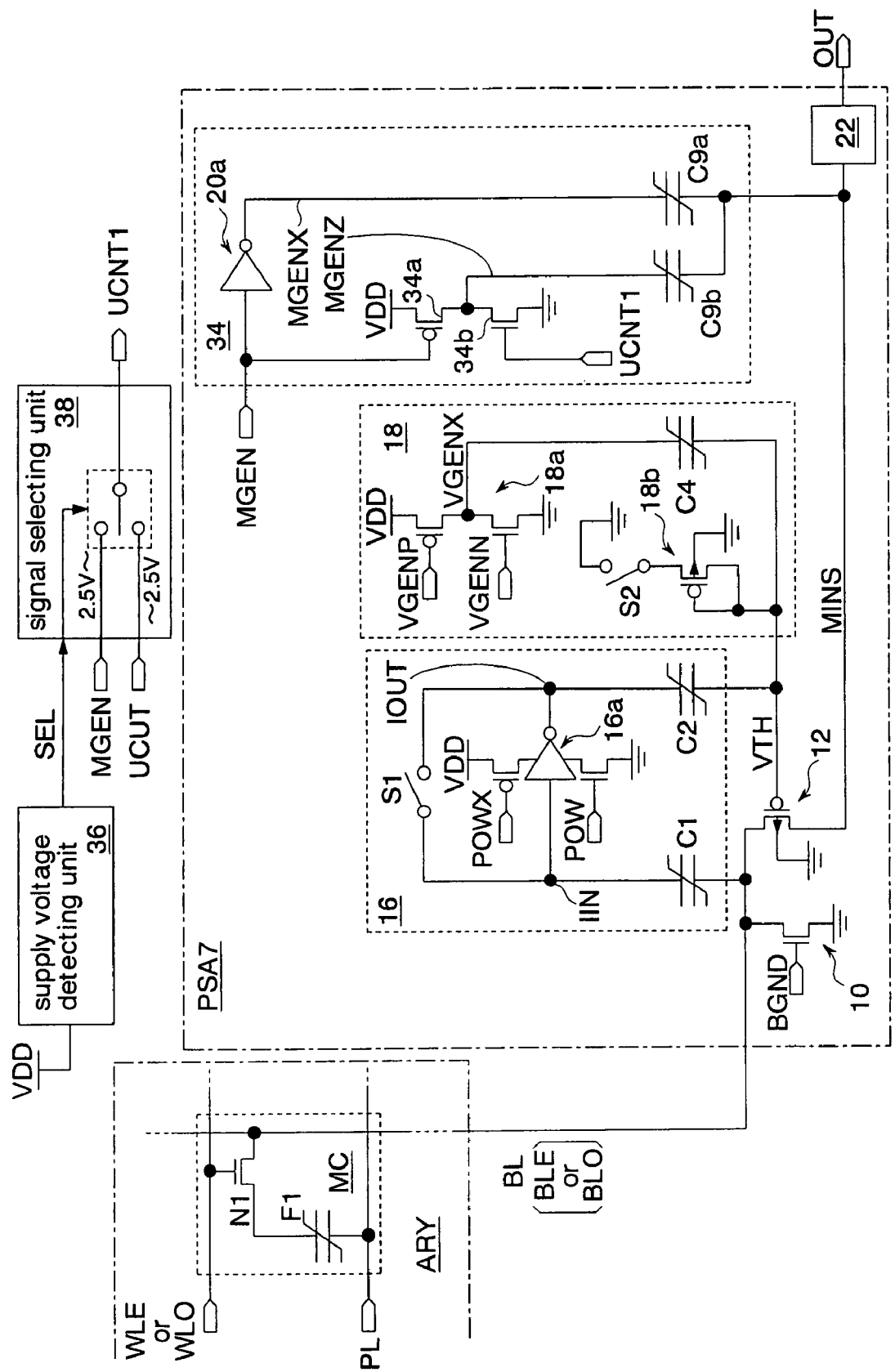
FIG. 23 is a circuit diagram showing the details of the pre-sense amplifier according to an eleventh embodiment of the present invention.

FIG. 23 shows an eleventh embodiment of the semiconductor memory of the present invention. The same elements as those described in the first and seventh embodiments will be designated by identical reference numbers or symbols. Detailed description thereof will be omitted. In this embodiment, the semiconductor memory is constituted by adding the supply voltage detecting unit 36 and the signal selecting unit 38 (release control circuit) to the construction of the seventh embodiment. The rest of the configuration is the same as in the seventh embodiment. That is, the semiconductor memory is formed as a ferroelectric memory on a silicon substrate by using CMOS processes. The ferroelectric memory is used, for example, as a work memory of a hand-held terminal such as a cellular phone. The ferroelectric memory has the same basic configuration as in FIGS. 1 and 2 seen above, except in the pre-sense amplifiers.

The supply voltage detecting unit 36 monitors the power supply voltage VDD, keeps a selection controlling signal SEL at low level while the power supply voltage VDD is equal to or lower than 2.5 V, for example, and keeps the selection controlling signal SEL at high level while the power supply voltage VDD is over 2.5 V. The signal selecting unit 38 outputs the capacitor control signal UCUT as a capacitor control signal UCUT1 while it receives the low-level selection controlling signal SEL. The signal selecting unit 38 outputs the negative voltage controlling signal MGEN as the capacitor control signal UCUT1 while it receives the high-level selection controlling signal SEL. The capacitor control signal UCUT1 is supplied to the gate of the nMOS transistor 34b of the negative voltage generator 34.

That is, according to this embodiment, when the power supply voltage VDD is over 2.5 V, the capacitor C9b acts as the capacitor to store the charges throughout the read operation, together with the capacitor C9a. When the power supply voltage VDD is equal to or lower than 2.5 V, the capacitor C9b is released equivalently in the middle of the read operation and becomes invisible from the node MINS. In other words, the pre-sense amplifiers PSA7 operate the same as the seventh embodiment described above only when the power supply voltage VDD is equal to or lower than 2.5 V. That is, the signal selecting unit 38 functions as a release control circuit which turns off the transistor 34b during the read operation only when the power supply voltage is low.

Figure 24:
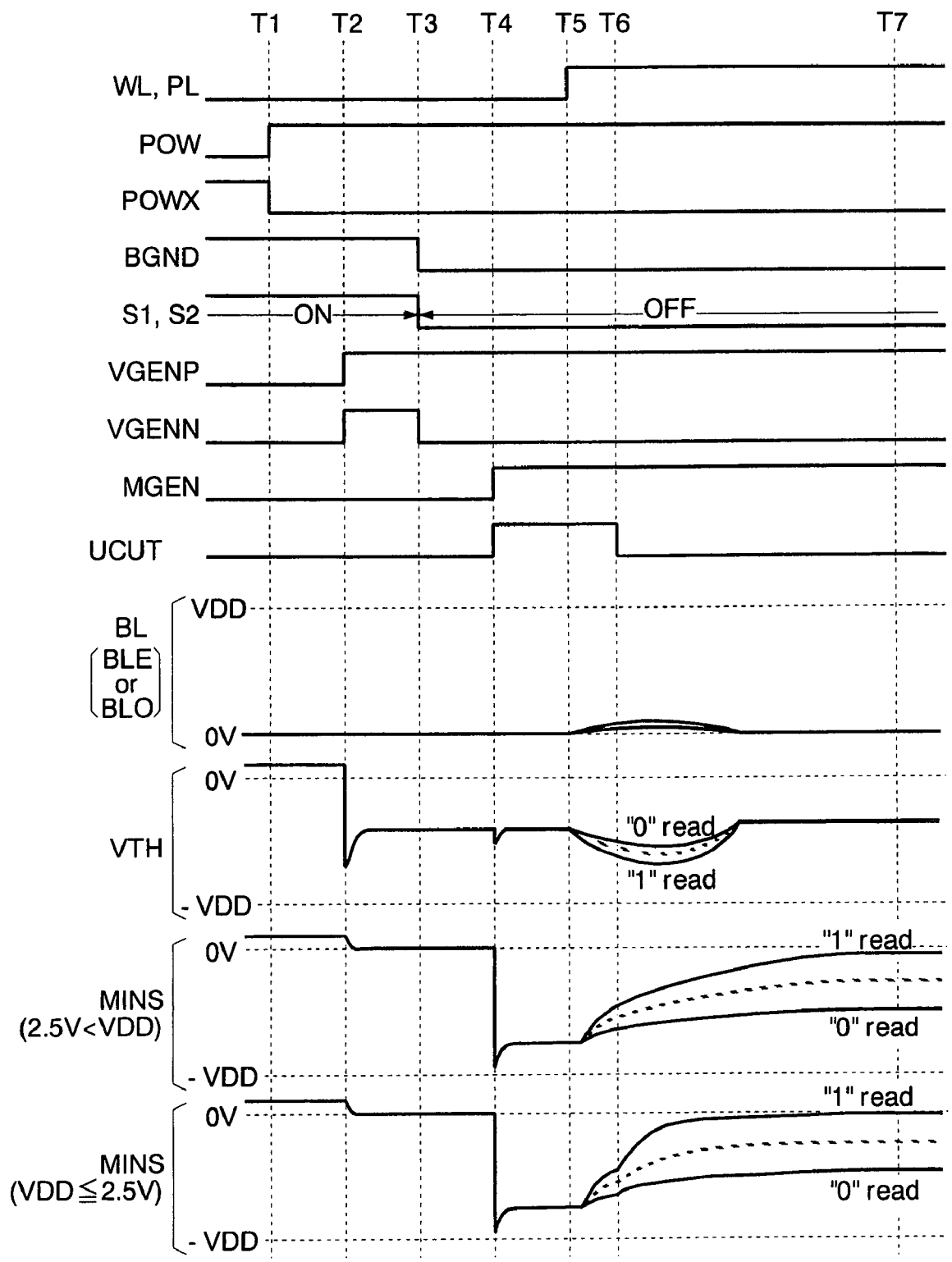
FIG. 24 is a waveform chart showing a read operation of the ferroelectric memory according to the eleventh embodiment.

FIG. 24 shows a read operation of the ferroelectric memory according to the eleventh embodiment. The operational waveforms of this embodiment are the same as in the seventh embodiment described above (FIG. 16) except that the waveforms of the node MINS are different depending on the power supply voltage VDD. More precisely, the waveforms of the node MINS are the same as in the seventh embodiment when the power supply voltage VDD is equal to or lower than 2.5 V.

When the power supply voltage VDD is over 2.5 V, the waveforms of the node MINS are similar to those of the first embodiment because the capacitors C9a and C9b store the charges transferred from the bit line BL to the node MINS throughout the read operation (because the capacitance of the capacitors to store the charges does not change).

When the power supply voltage VDD falls, the amount of charges charged in the ferroelectric capacitor decreases relatively. Moreover, the amount of charges read out from the ferroelectric capacitor F1 of the memory cell MC decreases relatively as the power supply voltage VDD lowers. This causes the read voltage MINS which is generated by the pre-sense amplifier PSA7 to decrease. To be more precise, a difference between the read voltage of the data "1" and the read voltage of the data "0" decreases. According to this embodiment, the capacitor C9b is released from the node MINS during the read operation with the low power supply voltage VDD, so that the optimum read voltage MINS is generated in response to the change in the characteristic of the ferroelectric capacitor due to the power supply voltage VDD. This embodiment can also provide the same effects as those of the first and seventh embodiments described above. Moreover, it is possible to generate the optimum read voltage MINS according to the power supply voltage VDD.

Figure 25:
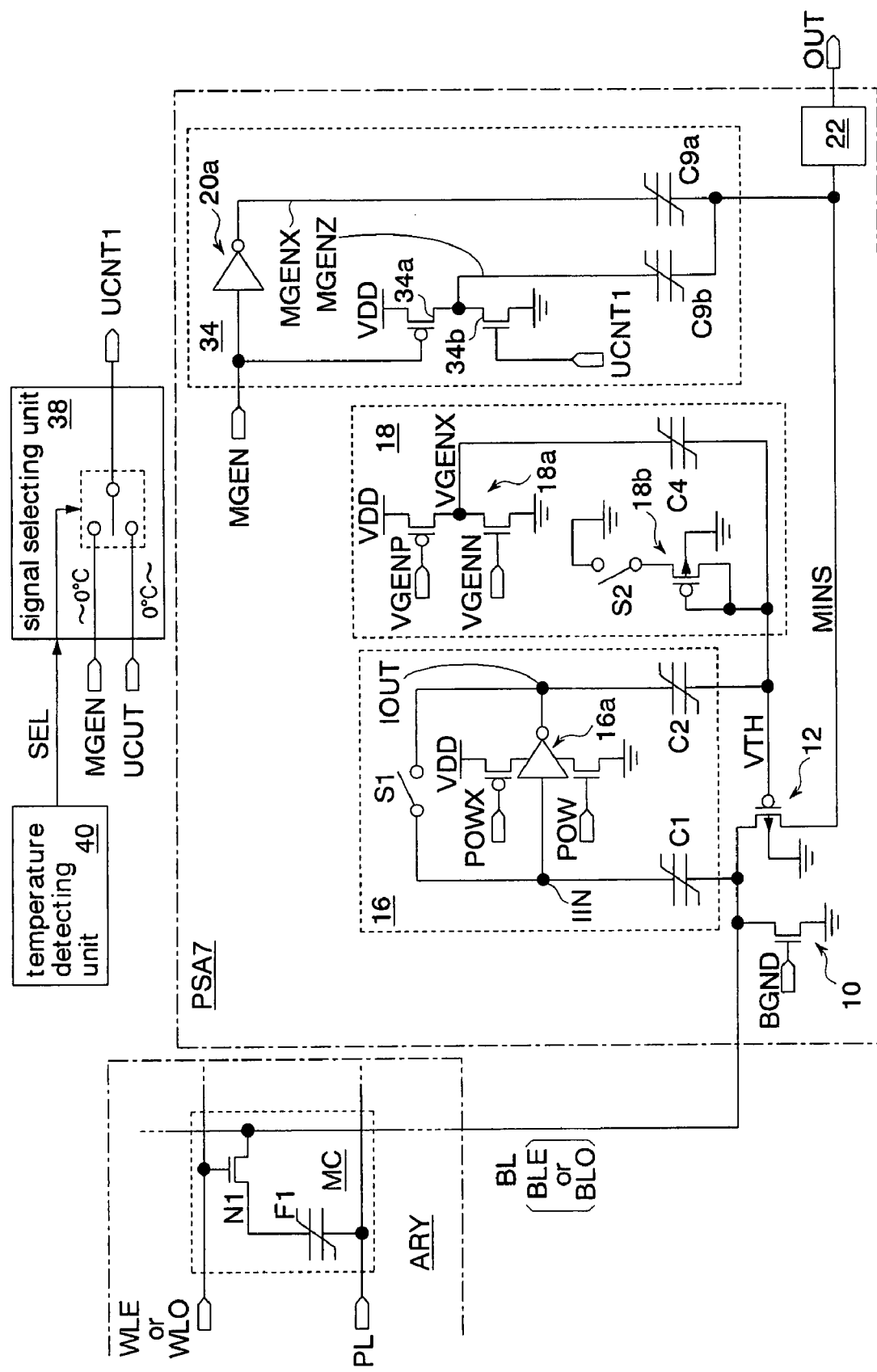
FIG. 25 is a circuit diagram showing the details of the pre-sense amplifier according to a twelfth embodiment of the present invention.

FIG. 25 shows a twelfth embodiment of the semiconductor memory of the present invention. The same elements as those described in the first, seventh and eleventh embodiments will be designated by identical reference numbers or symbols. Detailed description thereof will be omitted. In this embodiment, the semiconductor memory is constituted by adding the temperature detecting unit 40 and the signal selecting unit 38 to the construction of the seventh embodiment. The rest of the configuration is the same as in the seventh embodiment. That is, the semiconductor memory is formed as a ferroelectric memory on a silicon substrate by using CMOS processes. The ferroelectric memory is used, for example, as a work memory of a hand-held terminal such as a cellular phone. The ferroelectric memory has the same basic configuration as in FIGS. 1 and 2 seen above, except in the pre-sense amplifiers.

The temperature detecting unit 40 monitors the chip temperature of the ferroelectric memory, keeps the selection controlling signal SEL at high level while the temperature is equal to or lower than 0° C., for example, and keeps the selection controlling signal SEL at low level while the temperature is over 0° C. The signal selecting unit 38 outputs the capacitor control signal UCUT as the capacitor control signal UCUT1 while it receives the low-level selection controlling signal SEL. The signal selecting unit 38 outputs the negative voltage controlling signal MGEN as the capacitor control signal UCUT1 while it receives the high-level selection controlling signal SEL. The capacitor control signal UCUT1 is supplied to the gate of the nMOS transistor 34b of the negative voltage generator 34.

That is, according to this embodiment, when the temperature is equal to or lower than 0° C., the capacitor C9b acts as the capacitor to store the charges throughout the read operation, together with the capacitor C9a. When the temperature is over 0° C., the capacitor C9b is released equivalently in the middle of the read operation and becomes invisible from the node MINS. In other words, the pre-sense amplifiers PSA7 operate the same as the seventh embodiment described above only when the temperature is over 0° C. Thus, the signal selecting unit 38 functions as the release control circuit which turns off the transistor 34b during the read operation only when the chip temperature is high.

According to this embodiment, the waveforms of the node MINS are the upper waveforms in FIG. 24 of the eleventh embodiment described above when the temperature is equal to or lower than 0° C., and are the lower waveforms in FIG. 24 when the temperature is over 0° C. The amount of charges charged in the ferroelectric capacitor, and the amount of charges read out from the ferroelectric capacitor F1 of the memory cell MC decrease relatively as the temperature rises. By switching between the capacitors C9a and C9b to be connected to the node MINS according to the temperature during the read operation, the optimum read voltage MINS is generated in response to the change in characteristic of the ferroelectric capacitor due to the temperature. This embodiment can also provide the same effects as those of the first and seventh embodiments described above. Moreover, it is possible to generate the optimum read voltage MINS according to the temperature.

Figure 26:
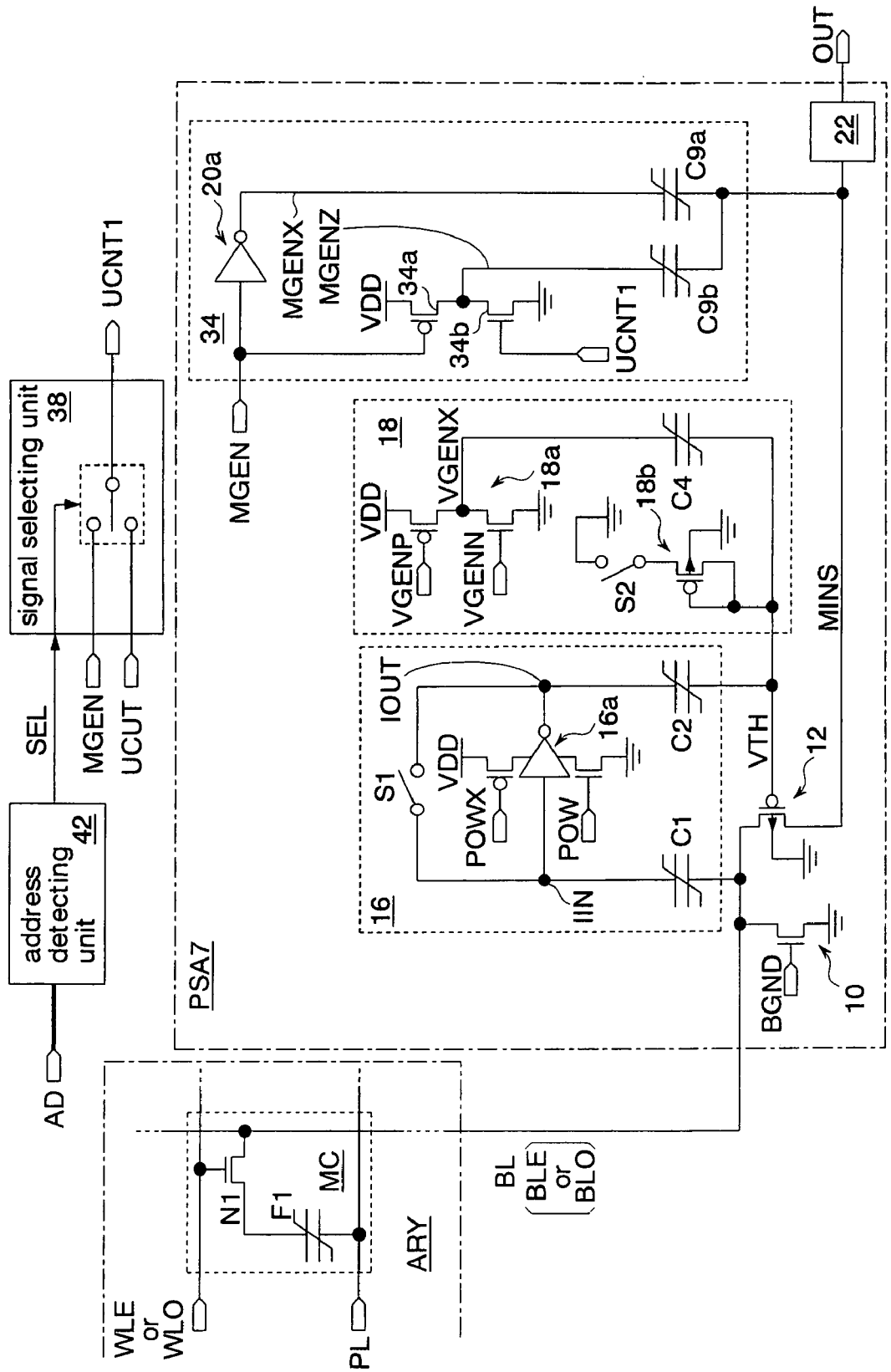
FIG. 26 is a circuit diagram showing the details of the pre-sense amplifier according to a thirteenth embodiment of the present invention.

FIG. 26 shows a thirteenth embodiment of the semiconductor memory of the present invention. The same elements as those described in the first, seventh and eleventh embodiments will be designated by identical reference numbers or symbols. Detailed description thereof will be omitted. In this embodiment, the semiconductor memory is constituted by adding the address detecting unit 42 and the signal selecting unit 38 to the construction of the seventh embodiment. The rest of the configuration is the same as in the seventh embodiment. That is, the semiconductor memory is formed as a ferroelectric memory on a silicon substrate by using CMOS processes. The ferroelectric memory is used, for example, as a work memory of a hand-held terminal such as a cellular phone. The ferroelectric memory has the same basic configuration as in FIGS. 1 and 2 seen above, except in the pre-sense amplifiers.

The address detecting unit 42 receives the address signal AD which is supplied to access and read the ferroelectric memory through the address terminal AD shown in FIG. 1. The address detecting unit 42 outputs the low-level selection controlling signal when the address signal AD specifies the memory cell MC located at the end of the memory cell array ARY shown in FIG. 1, and outputs the high-level selection controlling signal when the address signal AD specifies the memory cell MC except the above. The signal selecting unit 38 outputs the capacitor control signal UCUT as the capacitor control signal UCUT1 while it receives the low-level selection controlling signal SEL. The signal selecting unit 38 outputs the negative voltage controlling signal MGEN as the capacitor control signal UCUT1 while it receives the high-level selection controlling signal SEL. The capacitor control signal UCUT1 is supplied to the gate of the nMOS transistor 34b of the negative voltage generator 34.

That is, according to this embodiment, when the memory cell MC located in the position other than the end of the memory cell array ARY is accessed and read, the capacitor C9b acts as the capacitor to store the charges at all times, together with the capacitor C9a. When the memory cell MC located at the end of the memory cell array ARY is accessed and read, the capacitor C9b is released equivalently in the middle of the read operation and becomes invisible from the node MINS. In other words, the pre-sense amplifiers PSA7 operate the same as the seventh embodiment described above only when the memory cell MC located at the end of the memory cell array ARY is accessed and read. Thus, the signal selecting unit 38 functions as the release control circuit which turns off the transistor 34b during the read operation only when the end of the memory cell array ARY is accessed and read.

According to this embodiment, the waveforms of the node MINS are the upper waveforms in FIG. 24 of the eleventh embodiment described above when the memory cell MC located in the position other than the end of the memory cell array ARY is accessed and read, and are the lower waveforms in FIG. 24 when the memory cell MC located at the end of the memory cell array ARY is accessed and read. In general, the ferroelectric capacitor F1 which is formed inside the memory cell array ARY tends to be formed to have the ideal shape because the same pattern is repeated. On the contrary, the ferroelectric capacitor F1 which is formed on the end part of the memory cell array ARY is hardly formed to have the ideal shape because the repeating pattern is interrupted. Moreover, in the memory cell MC located at the end of the memory cell array ARY, the thickness of the insulating film and electric conductive film constituting the memory cell MC tends to be deviated from the typical values. Accordingly, the characteristic of the ferroelectric capacitor F1 formed on the end part of the memory cell array ARY tends to be deviated from the characteristic in the typical case. When the ferroelectric capacitor F1 whose characteristic tends to be deviated is accessed and read, the optimum read voltage MINS is generated by switching between the capacitors C9a and C9b to be connected to the node MINS during the read operation, even when the data is read out from the ferroelectric capacitor F1 having the bad characteristic. This embodiment can also provide the same effects as those of the first and seventh embodiments described above. Moreover, it is possible to generate the optimum read voltage MINS without depending on the location of the memory cell MC to be accessed and read.

Figure 27:
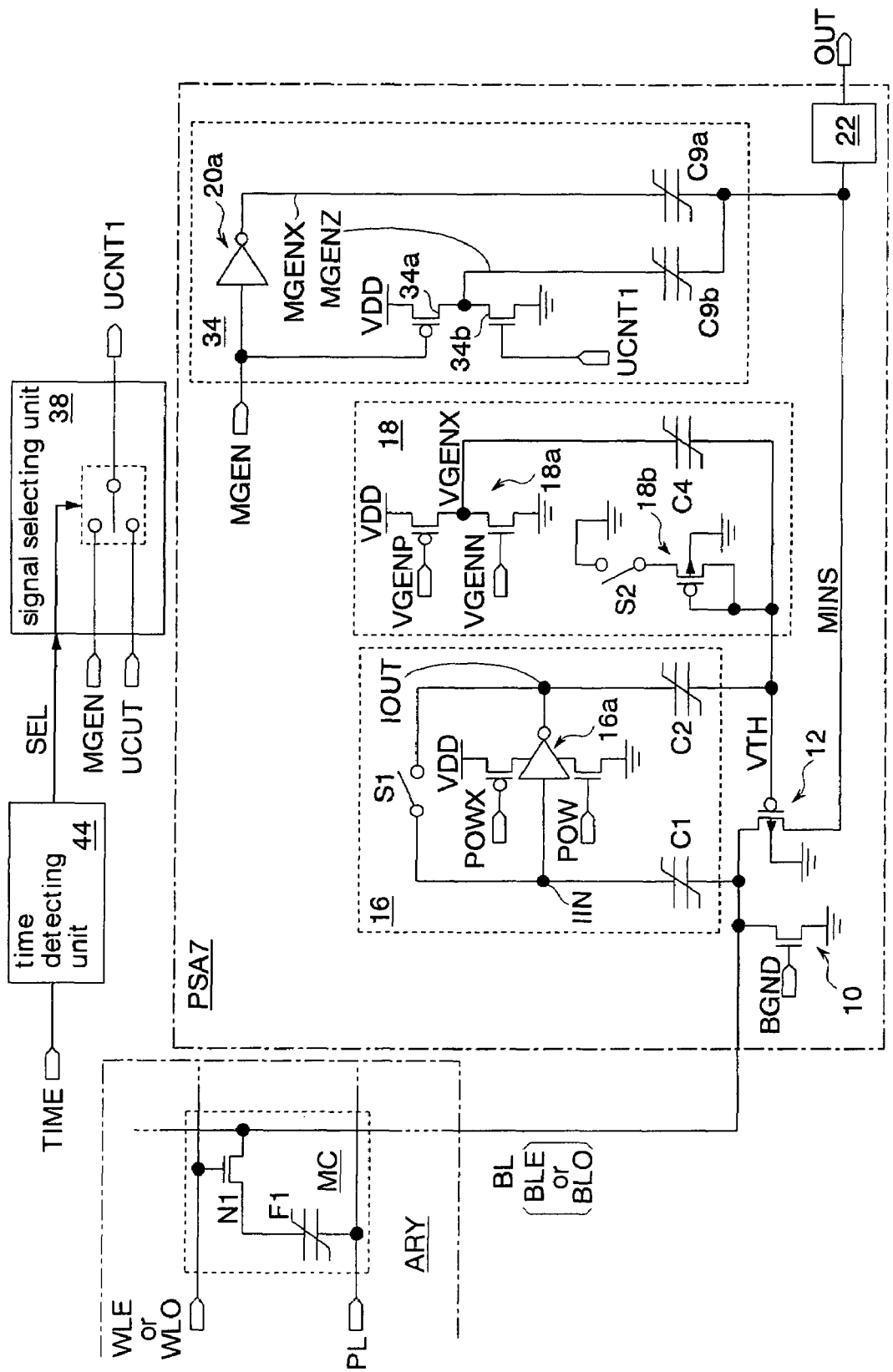
FIG. 27 is a circuit diagram showing the details of the pre-sense amplifier according to a fourteenth embodiment of the present invention.

FIG. 27 shows a thirteenth embodiment of the semiconductor memory of the present invention. The same elements as those described in the first, seventh and eleventh embodiments will be designated by identical reference numbers or symbols. Detailed description thereof will be omitted. In this embodiment, the semiconductor memory is constituted by adding the time detecting unit 44 and the signal selecting unit 38 to the construction of the seventh embodiment. The rest of the configuration is the same as in the seventh embodiment. That is, the semiconductor memory is formed as a ferroelectric memory on a silicon substrate by using CMOS processes. The ferroelectric memory is used, for example, as a work memory of a hand-held terminal such as a cellular phone. The ferroelectric memory has the same basic configuration as in FIGS. 1 and 2 seen above, except in the pre-sense amplifiers.

The time detecting unit 44 receives a time signal TIME (signal having the constant level, for example) from the external of the ferroelectric memory. The ferroelectric memory has a time terminal (not shown) for receiving the time signal TIME. A system (user) using the ferroelectric memory outputs the high-level time signal TIME from, for example, the start of access of the ferroelectric memory until the expiration of a predetermined period (use period of the ferroelectric memory; three years, for example), and outputs the low-level time signal TIME after a lapse of three years. The time detecting unit 44 outputs the high-level selection controlling signal SEL while it receives the high-level time signal TIME, and outputs the low-level selection controlling signal SEL while it receives the low-level time signal TIME. The signal selecting unit 38 outputs the negative voltage controlling signal MGEN as the capacitor control signal UCUT1 while it receives the high-level selection controlling signal SEL. The signal selecting unit 38 outputs the capacitor control signal UCUT as the capacitor control signal UCUT1 while it receives the low-level selection controlling signal SEL. The capacitor control signal UCUT1 is supplied to the gate of the nMOS transistor 34b of the negative voltage generator 34.

That is, according to this embodiment, the capacitor C9b acts as the capacitor to store the charges at all times together with the capacitor C9a, from the start of access of the ferroelectric memory until the expiration of the predetermined period. After the lapse of the predetermined period, the capacitor C9b is released equivalently in the middle of the read operation and becomes invisible from the node MINS. In other words, the pre-sense amplifiers PSA7 operate the same as the seventh embodiment described above until the expiration of the predetermined period. Thus, the signal selecting unit 38 functions as the release control circuit which turns off the transistor 34b during the read operation only when the use period of the ferroelectric memory exceeds the predetermined period.

According to this embodiment, the waveforms of the node MINS are the upper waveforms in FIG. 24 described above until the expiration of the predetermined period, and are the lower waveforms in FIG. 24 described above after the lapse of the predetermined period. In general, the retention characteristic (hysteresis characteristic) of the ferroelectric capacitor F1 deteriorates as the number of accesses increases, and the amount of charges read out from the memory cell MC decreases. Therefore, in the ferroelectric memory which has been used over a long period of time, the optimum read voltage MINS is generated by switching between the capacitors C9a and C9b to be connected to the node MINS during the read operation, even when the data is read out from the ferroelectric capacitor F1 whose characteristic has been deteriorated. This embodiment can also provide the same effects as those of the first and seventh embodiments described above. Moreover, it is possible to generate the optimum read voltage MINS even when the data is read out from the ferroelectric capacitor F1 whose characteristic has been deteriorated due to the use over the long period of time.

Figure 28:
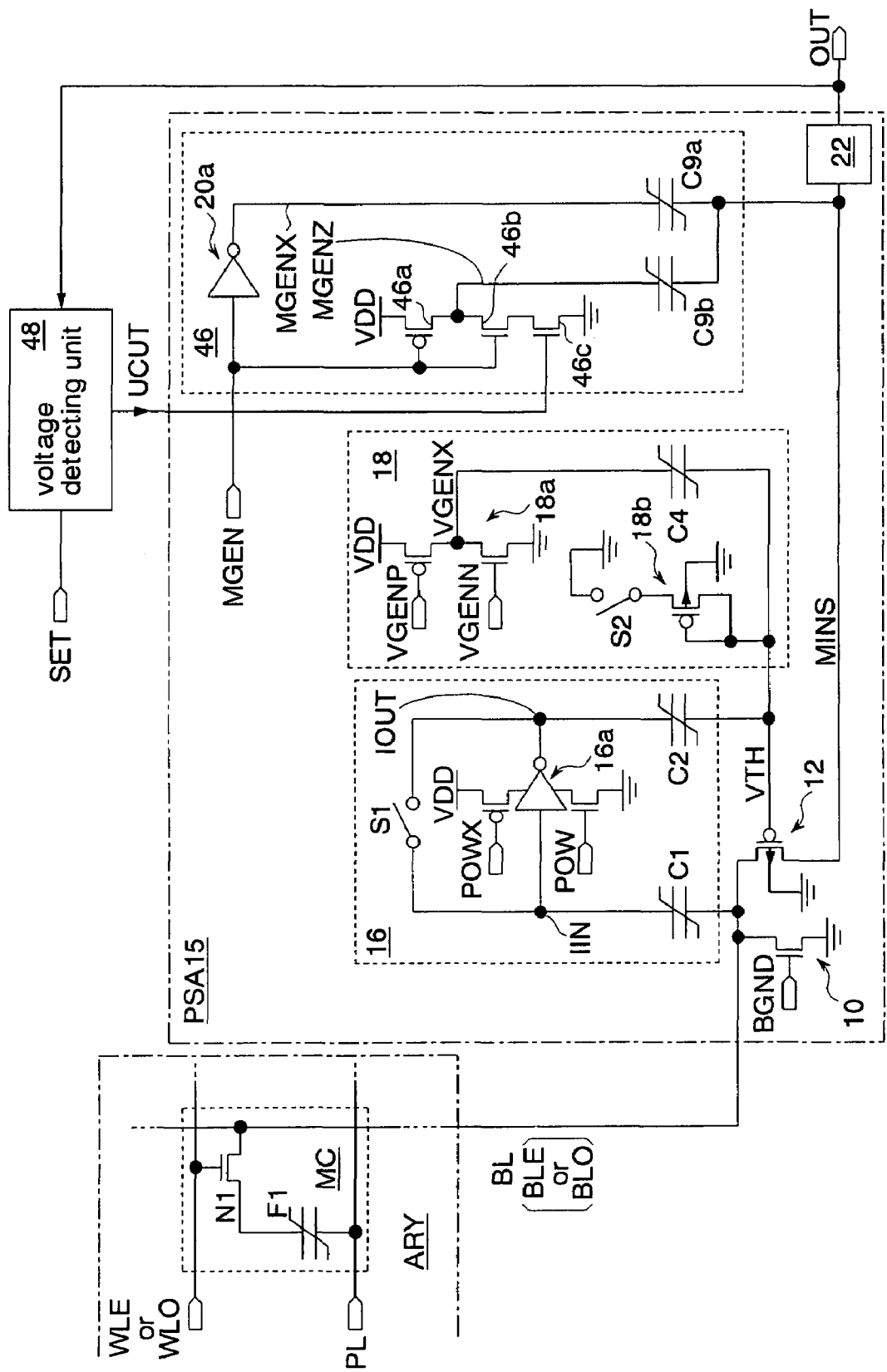
FIG. 28 is a circuit diagram showing the details of the pre-sense amplifier according to a fifteenth embodiment of the present invention.

FIG. 28 shows a fifteenth embodiment of the semiconductor memory of the present invention. The same elements as those described in the first and seventh embodiments will be designated by identical reference numbers or symbols. Detailed description thereof will be omitted. In this embodiment, pre-sense amplifiers PSA15 are formed instead of the pre-sense amplifiers PSA7 of the seventh embodiment. The voltage detecting unit 48 (release control circuit) is newly added. The rest of the configuration is the same as in the seventh embodiment. That is, the semiconductor memory is formed as a ferroelectric memory on a silicon substrate by using CMOS processes. The ferroelectric memory is used, for example, as a work memory of a hand-held terminal such as a cellular phone. The ferroelectric memory has the same basic configuration as in FIGS. 1 and 2 seen above, except in the pre-sense amplifiers.

The pre-sense amplifiers PSA15 have a negative voltage generator 46 (charge storing circuit, initializing circuit), instead of the negative voltage generator 34 of the seventh embodiment. The negative voltage generator 46 has a CMOS inverter 20a which receives the negative voltage controlling signal MGEN and is connected to the node MGENX at its output, a capacitor C9a arranged between the node MGENX and the node MINS, a pMOS transistor 46a connected in series between the power supply line VDD and the ground line, nMOS transistors 46b and 46c, and a capacitor C9b arranged between the drain node MGENZ of the transistors 46a and 46b and the node MINS. The transistors 46a and 46b receive the negative voltage controlling signal MGEN at these gates, and the transistor 46c receives the capacitor control signal UCUT at its gate.

The voltage detecting unit 48 is formed for each of the pre-sense amplifiers 15. The voltage detecting unit 48 sets the logic level of the capacitor control signal UCUT according to a setting signal SET and the read voltage OUT output from the pre-sense amplifier 15. The setting signal SET is generated by the timing generator TGEN shown in FIG. 1.

Figure 29:
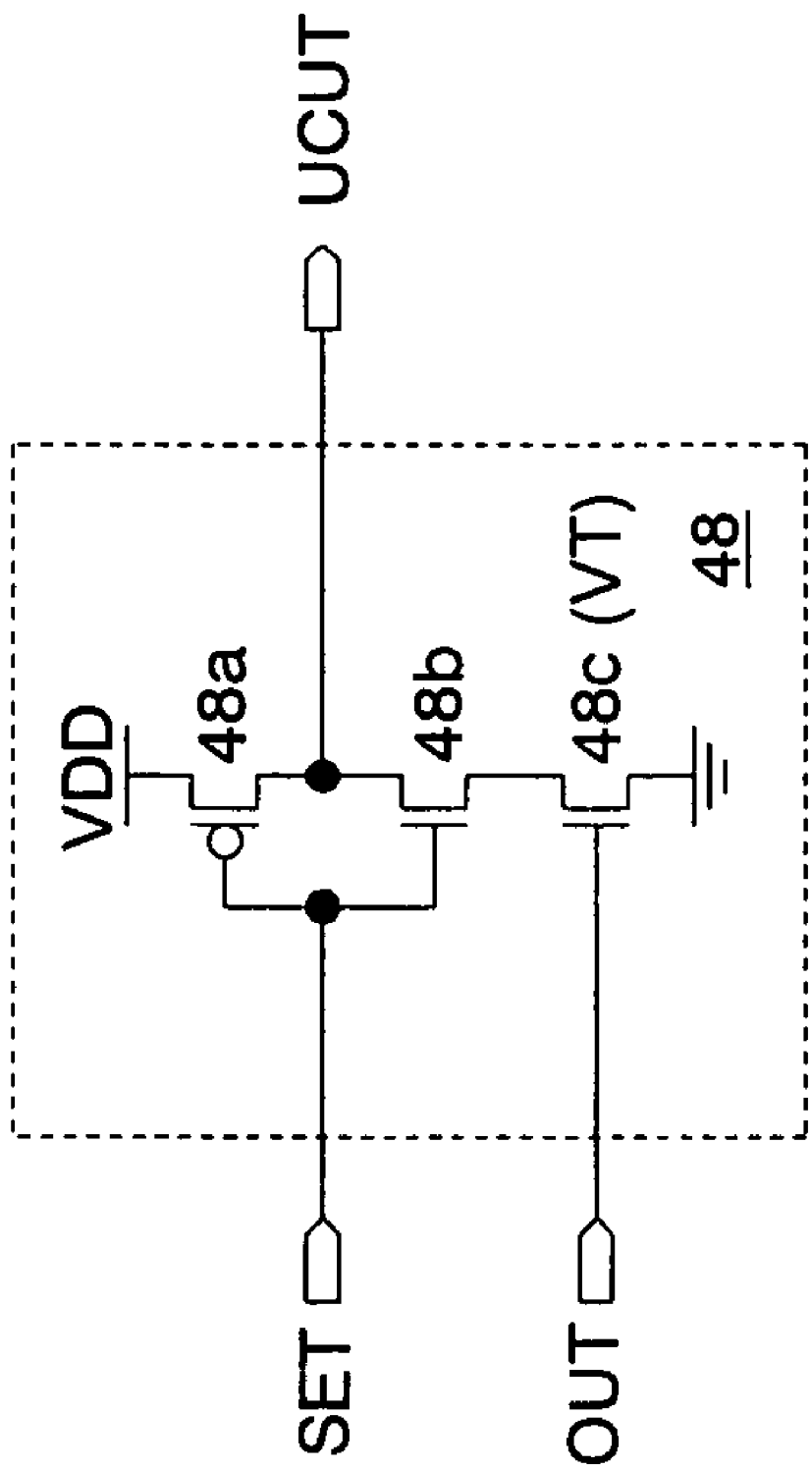
FIG. 29 is a circuit diagram showing the details of the voltage detecting unit shown in FIG. 28.

FIG. 29 shows the details of the voltage detecting unit 48. The voltage detecting unit 48 has a pMOS transistor 48a and nMOS transistors 48b and 48c which are connected in series between the power supply line VDD and the ground line. The pMOS transistor 48a and the nMOS transistor 48b receive the setting signal SET at these gates. The nMOS transistor 48c receives the read voltage OUT at its gate. The threshold voltage of the nMOS transistor 48c is set to be VT. The capacitor control signal UCUT is output from the drains of the pMOS transistor 48a and the nMOS transistor 48b.

Figure 30:
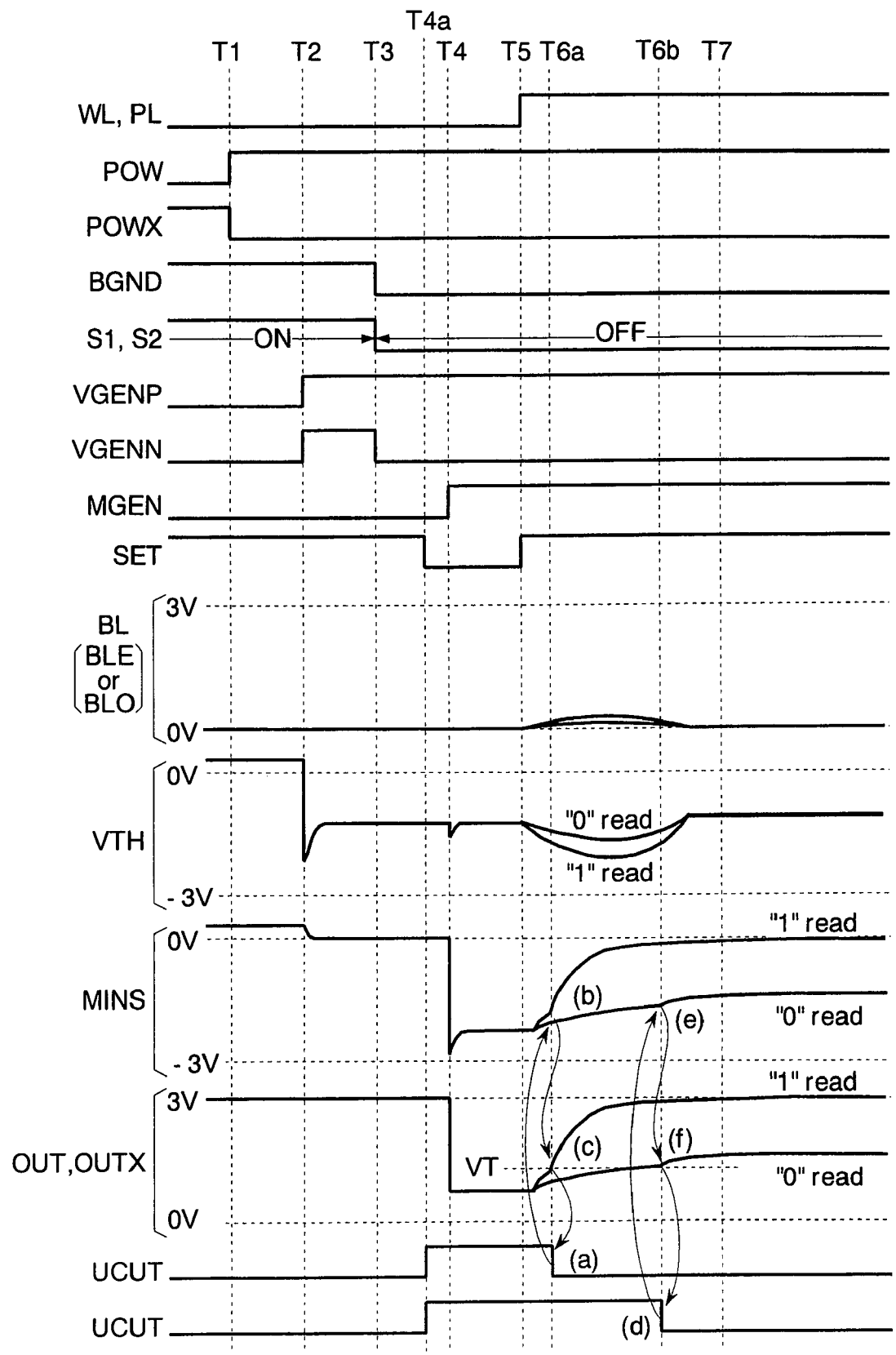
FIG. 30 is a waveform chart showing a read operation of the ferroelectric memory according to the fifteenth embodiment.
Figure 31:
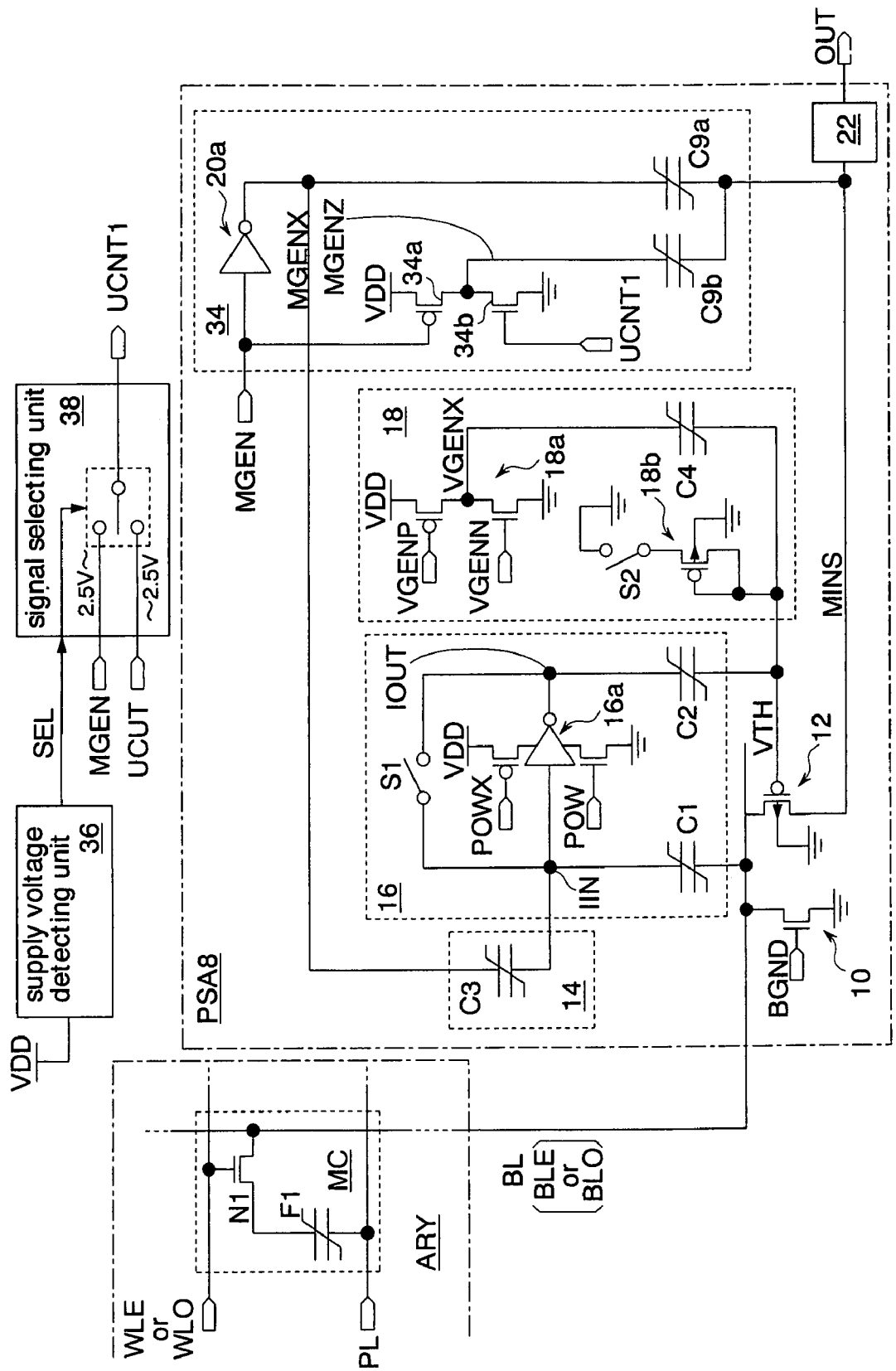
FIG. 31 is a circuit diagram showing another example of the pre-sense amplifier.
Figure 32:
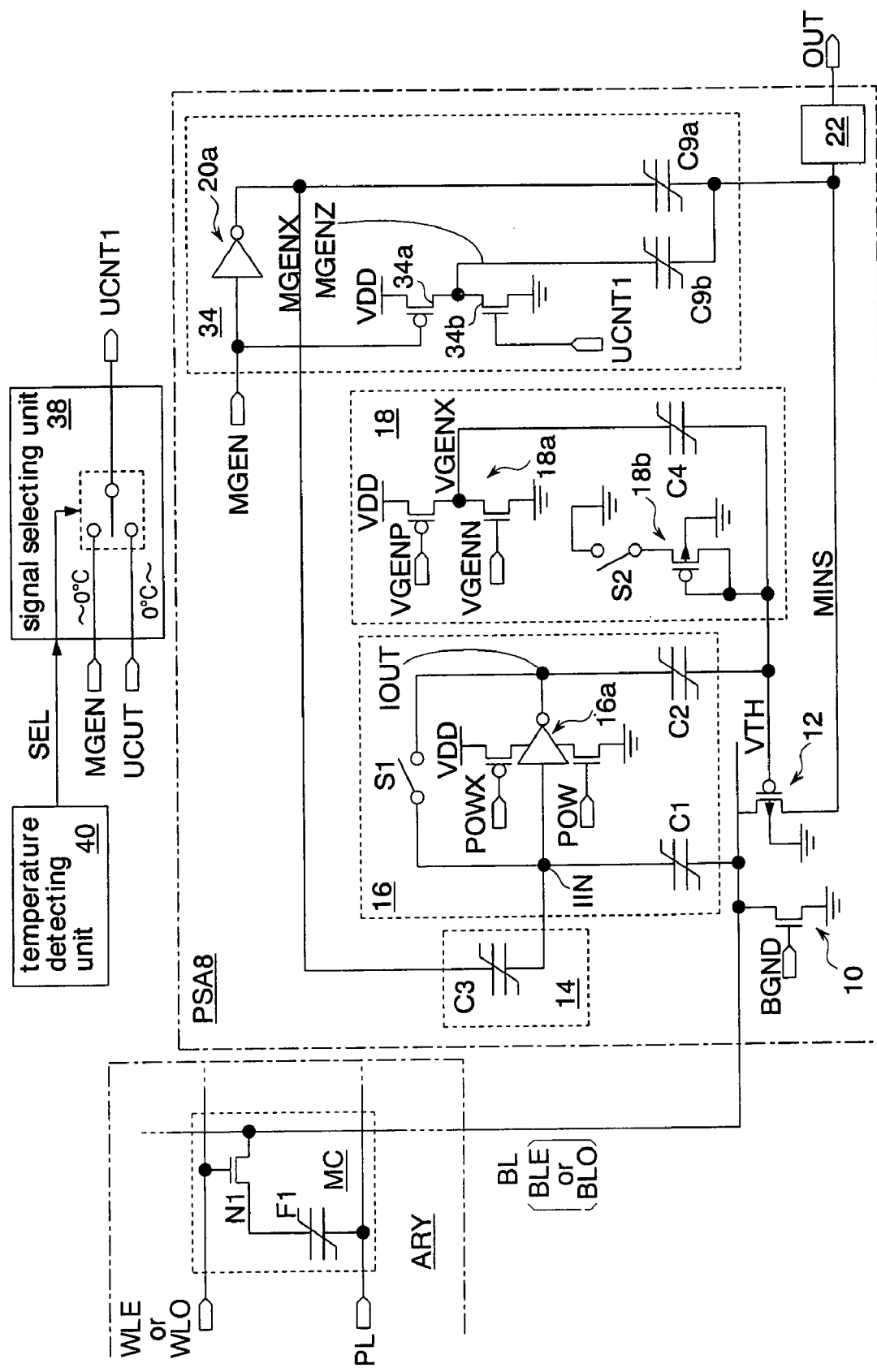
FIG. 32 is a circuit diagram showing another example of the pre-sense amplifier.
Figure 33:
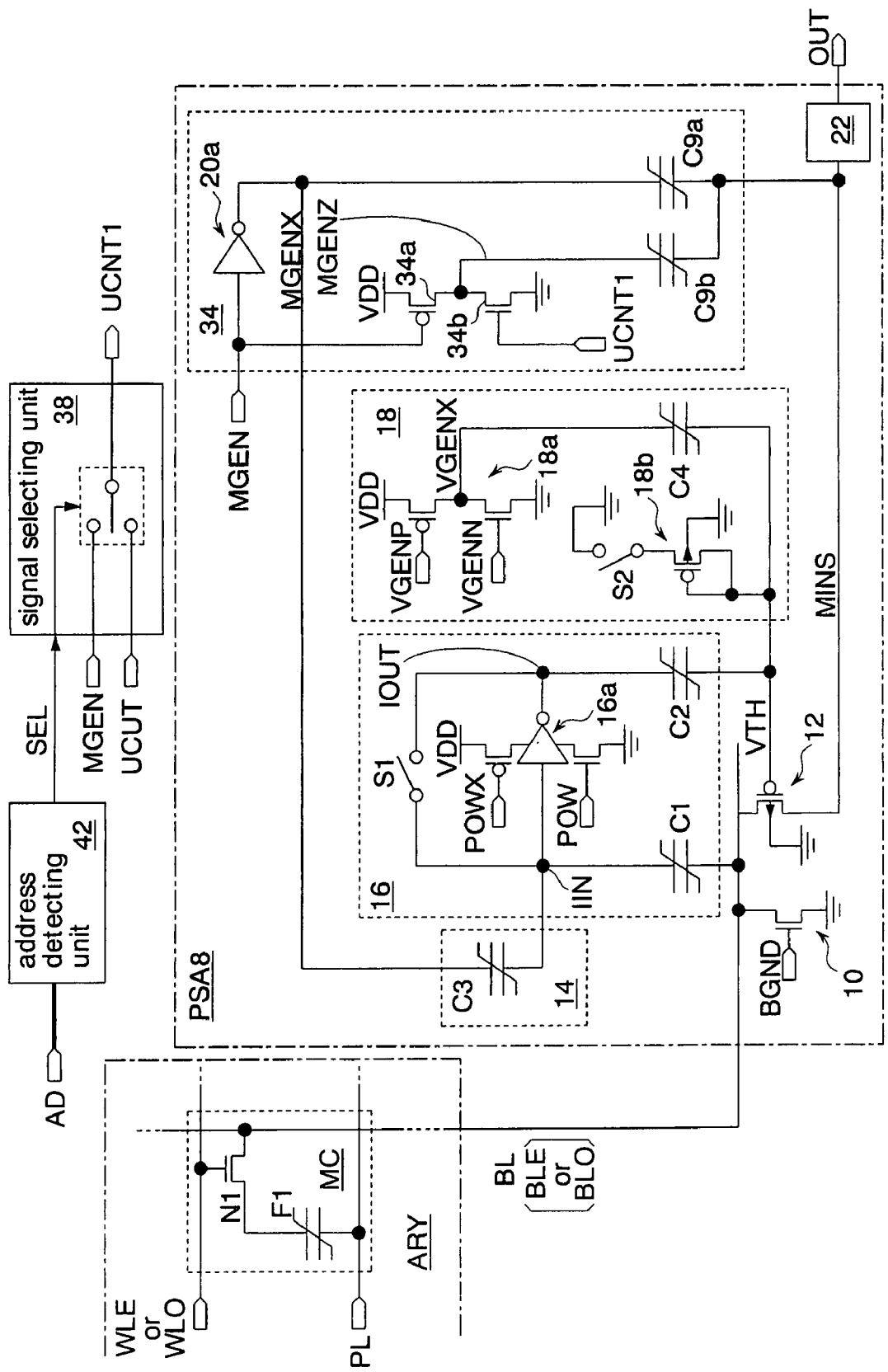
FIG. 33 is a circuit diagram showing another example of the pre-sense amplifier.
Figure 34:
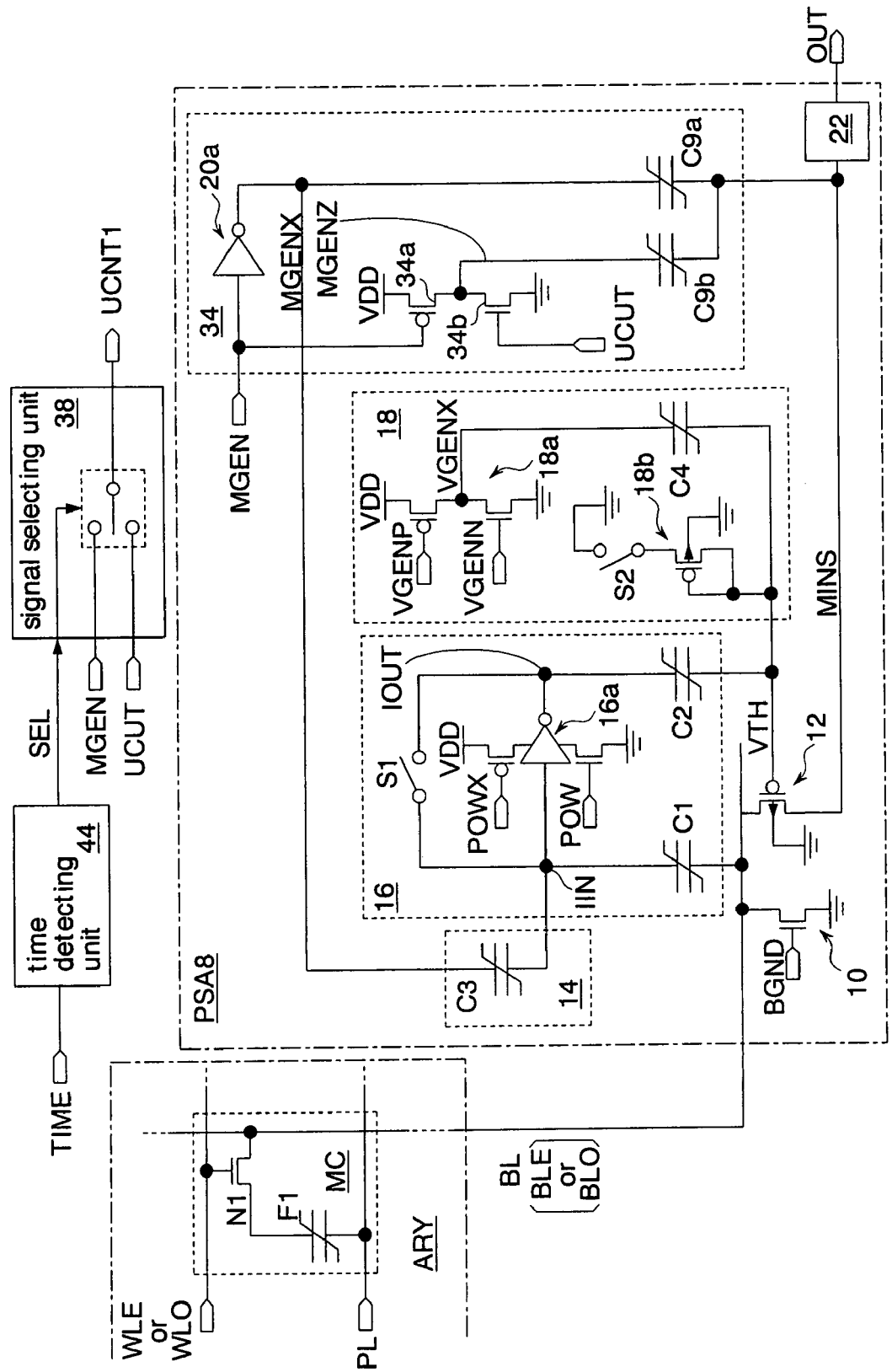
FIG. 34 is a circuit diagram showing another example of the pre-sense amplifier.
Figure 35:
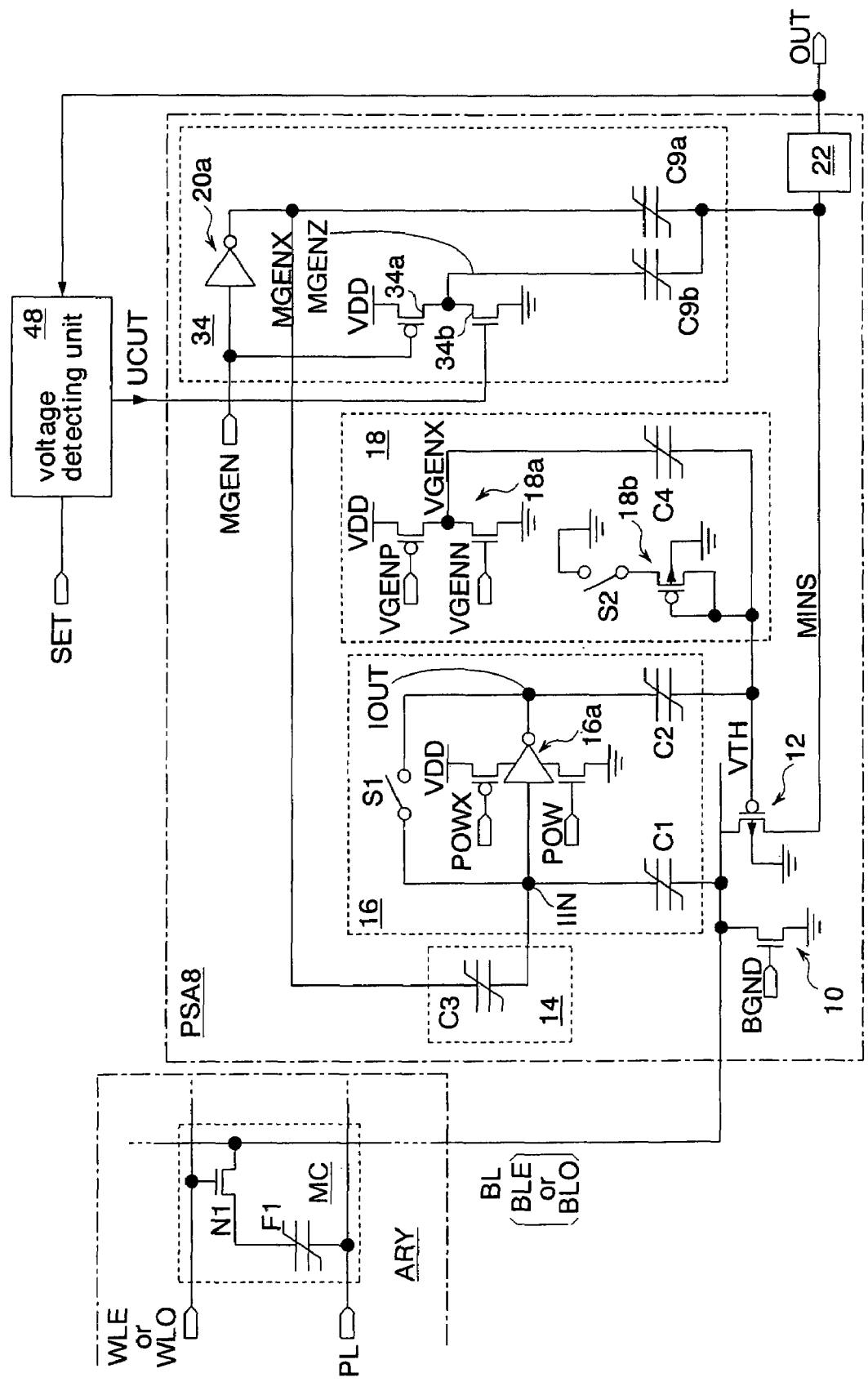
FIG. 35 is a circuit diagram showing another example of the pre-sense amplifier.

FIG. 30 shows a read operation of the ferroelectric memory according to the fifteenth embodiment. The operational waveforms of this embodiment are the same as in the seventh embodiment described above (FIG. 16) except that the waveforms of the nodes MINS and OUT and the timing of the falling edges of the capacitor control signal UCUT are different and the waveform of the setting signal SET is added thereto.

The setting signal SET falls at time T4a and rises at time T5. When the setting signal SET changes to low level at time T4a, the capacitor control signal UCUT changes to high level regardless of the read voltage OUT. In the diagram, the upper capacitor control signal UCUT is output from the voltage detecting unit 48 corresponding to the pre-sense amplifier PSA7 reading out the data "1". The lower capacitor control signal UCUT is output from the voltage detecting unit 48 corresponding to the pre-sense amplifier PSA7 reading out the data "0". The waveforms of the read voltages MINS and OUT up to time T6 are the same as in the seventh embodiment (FIG. 16). Incidentally, the waveforms of the read voltage OUT are not shown in FIG. 16.

First, the data "1" is read out from the memory cell MC as follows. When the read voltage OUT exceeds the threshold voltage VT of the nMOS transistor 48c (at time T6a), the corresponding capacitor control signal UCUT changes to low level (FIG. 30(a)). This change causes the capacitor C9b to be released equivalently and become invisible from the node MINS. Accordingly, the rise rate in voltage of the node MINS reading out the data "1" drastically increases (FIG. 30(b)). Following the change in voltage of the node MINS, the read voltage OUT also changes to high level drastically (FIG. 30(c)). Thus, the transistors 46a, 46b and 46c function as the connection release circuit which releases the electrical connection between the capacitor C9b and the charge transferring circuit 12 (node MINS), after the read operation is started.

Meanwhile, the data "0" is read out from the memory cell MC as follows. When the read voltage OUT exceeds the threshold voltage VT of the nMOS transistor 48c (at time T6b), the corresponding capacitor control signal UCUT changes to low level (FIG. 30(d)). This change causes the capacitor C9b to be released equivalently and the rising speed of the voltage of the node MINS reading out the data "0" to increase (FIG. 30(e)). Following the change in voltage of the node MINS, the read voltage OUT also changes to high level drastically (FIG. 30(f)).

That is, the voltage detecting unit 48 functions as the release control circuit which turns off the transistor 46c during the read operation, when the read voltage OUT reaches the predetermined value. Thus, the rising speed of the voltage of the node MINS reading out the data "1" is increased as compared to the voltage of the node MINS reading out the data "0", whereby the difference between the read voltages (MINS, OUT) of the data "0" and data "1" increases. That is, the read margin is increased. This embodiment can also provide the same effects as those of the first and seventh embodiments described above. Moreover, it is possible to increase the difference between the read voltages (MINS, OUT) of the data "0" and data "1" as compared to the seventh embodiment and to increase the read margin.

Note that the foregoing embodiments have dealt with the cases where the capacitors C1-C8, C9a, and C9b are made of ferroelectric materials. However, the present invention is not limited to such embodiments. For example, the capacitors C1-C8, C9a, and C9b may be made of the gate insulators of MOS transistors (MOS gate capacitors), capacitors formed between polysilicon layers opposed to each other, or capacitors formed between metal wiring layers.

The foregoing embodiments have dealt with the cases where the present invention is applied to a ferroelectric memory having ferroelectric capacitors. However, the present invention is not limited to such embodiments. For example, the present invention may be applied to a DRAM (Dynamic Random Access Memory).

The foregoing sixth to fifteenth embodiments have dealt with the cases where the present invention is applied to the ferroelectric memory having the 1T1C type memory cells MC shown in FIG. 2. However, the present invention is not limited to such embodiments. For example, the same effects can be obtained when the present invention is applied to the ferroelectric memory having the 2T2C type memory cells shown in FIG. 10.

The foregoing fourteenth embodiment has dealt with the case where the generation timing of the capacitor control signal UCUT is changed by the selection controlling signal SEL generated by the time detecting unit 44 according to the time signal TIME. However, the present invention is not limited to such an embodiment. For example, the time signal TIME may be directly received by the signal selecting unit 38, whereby the generation timing of the capacitor control signal UCUT is changed according to the time signal TIME.

The foregoing eleventh to fifteenth embodiments have dealt with the cases where the supply voltage detecting unit 36 and the like are formed in order to control the charge storing operation of the negative voltage generator 34 of the pre-sense amplifiers PSA7 of the seventh embodiment. However, the present invention is not limited to such embodiments. For example, as shown in FIGS. 31 to 35, the supply voltage detecting unit 36 and the like may be formed in order to control the charge storing operation of the negative voltage generator 34 of the pre-sense amplifiers PSA8 of the eighth embodiment. Alternatively, the supply voltage detecting unit 36 and the like may be formed in order to control the charge storing operation of the negative voltage generator 34 of the pre-sense amplifiers PSA9 and PSA10 of the ninth and tenth embodiments, although not particularly illustrated.

The foregoing eleventh embodiment has dealt with the case where the signal selecting unit 38 functions as the release control circuit which releases the capacitor C9b in the middle of the read operation, only when the power supply voltage VDD is lower than the predetermined value (2.5 V). However, the present invention is not limited to such an embodiment. For example, the signal selecting unit 38 may function as the release control circuit only when the power supply voltage VDD is higher than the predetermined value, when the power supply voltage VDD is within a predetermined range, or when the power supply voltage VDD is outside a predetermined range.

The foregoing twelfth embodiment has dealt with the case where the signal selecting unit 38 functions as the release control circuit which releases the capacitor C9b in the middle of the read operation, only when the chip temperature is higher than the predetermined value (0° C.). However, the present invention is not limited to such an embodiment. For example, the signal selecting unit 38 may function as the release control circuit when the chip temperature is lower than the predetermined value, when the chip temperature is within a predetermined range, or when the chip temperature is outside a predetermined range.

The foregoing thirteenth embodiment has dealt with the case where the signal selecting unit 38 functions as the release control circuit which releases the capacitor C9b in the middle of the read operation, when the access address specifies the end of the memory cell array ARY. However, the present invention is not limited to such an embodiment. For example, the signal selecting unit 38 may function as the release control circuit when the access address specifies the position other than the end of the memory cell array ARY.

The foregoing fourteenth embodiment has dealt with the case where the signal selecting unit 38 functions as the release control circuit which releases the capacitor C9b in the middle of the read operation, when the use period of the semiconductor memory exceeds the predetermined period. However, the present invention is not limited to such an embodiment. For example, the signal selecting unit 38 may function as the release control circuit when the use period of the semiconductor memory is within the predetermined period.

The foregoing fourteenth embodiment has dealt with the case where the connection time of the capacitor C9b is changed according to the use period of the ferroelectric memory. However, the present invention is not limited to such an embodiment. For example, a counter counting the number of accesses of the memory cell array ARY or the respective memory cells MC may be formed in the ferroelectric memory, so as to release the connection of the capacitor C9b during the read operation when the counter value exceeds a predetermined value.

The invention is not limited to the above embodiments and various modifications may be made without departing from the spirit and scope of the invention. Any improvement may be made in part or all of the components.

What is claimed is:

1. A semiconductor memory comprising:
 a memory cell having a capacitor which stores therein a charge corresponding to a logic of data:
 a bit line connected to said memory cell;
 a charge transferring circuit connected to said bit line;
 a charge storing circuit connected to said bit line through said charge transferring circuit, and storing therein a charge read out from said memory cell to said bit line in a read operation and generating a read voltage in accordance with a stored charge;
 a read circuit generating a logic of the data retained in said memory cell, in accordance with the read voltage generated by said charge storing circuit, and
 a leakage controlling circuit forcibly and temporarily raising the charge transferability of said charge transferring circuit in said read operation, irrespective of a voltage of said bit line, when a charge is read out from said memory cell to said bit line.

2. The semiconductor memory according to claim 1, further comprising:
 an access gate connecting the capacitor of said memory cell to said bit line and
 an initializing circuit setting the charge transferability of said charge transferring circuit to an initial state in a read operation before said access gate turns on, wherein said leakage controlling circuit raises the charge transferability temporarily in synchronization with the turning-on of said access gate.

3. The semiconductor memory according to claim 2, wherein:
said charge transferring circuit has a transistor which is connected at its gate to the output of said leakage controlling circuit, and connected to said bit line at one of its source and drain and connected to said charge storing circuit at the other of the source and drain;
said initializing circuit sets an absolute value of a gate-to-source voltage of said transistor to a value smaller than an absolute value of a threshold voltage of said transistor in said read operation before said access gate turns on; and
said leakage controlling circuit changes the gate voltage of said transistor so as to make the absolute value of said gate-to-source voltage be temporarily greater than the absolute value of said threshold voltage in synchronization with the turning-on of said access gate.

4. The semiconductor memory according to claim 1, wherein said charge storing circuit includes:
a first and second capacitors connected to said charge transferring circuit at one ends and arranged in parallel to each other, in order to store the charge read out from said memory cell to said bit line; and
a connection release circuit releasing the electrical connection between said second capacitor and said charge transferring circuit, after the read operation is started.

5. The semiconductor memory according to claim 4, wherein said connection release circuit has a floating setting circuit setting the other end of said second capacitor to enter a floating state, after the read operation is started.

6. A semiconductor memory comprising:
a memory cell having a capacitor which stores therein a charge corresponding to a logic of data;
a bit line connected to said memory cell;
a charge transferring circuit connected to said bit line;
a charge storing circuit connected to said bit line through said charge transferring circuit, and storing therein a charge read out from said memory cell to said bit line in a read operation and generating a read voltage in accordance with a stored charge; and
a read circuit generating a logic of the data retained in said memory cell, in accordance with the read voltage generated by said charge storing circuit, wherein
said charge storing circuit includes
a first and second capacitors connected to said charge transferring circuit at one ends and arranged in parallel to each other, in order to store the charge read out from said memory cell to said bit line, and
a connection release circuit releasing the electrical connection between said second capacitor and said charge transferring circuit, after the read operation is started.

7. The semiconductor memory according to claim 6, wherein
said connection release circuit has a floating setting circuit setting the other end of said second capacitor to enter a floating state, after the read operation is started.

8. The semiconductor memory according to claim 6, further comprising:
a supply voltage detecting unit detecting a power supply voltage; and
a release control circuit bringing the function of said connection release circuit into effect only when the power supply voltage detected by said supply voltage detecting unit is lower than a predetermined value.

9. The semiconductor memory according to claim 6, further comprising:
a temperature detecting unit detecting temperature of said semiconductor memory; and
a release control circuit bringing the function of said connection release circuit into effect only when the temperature detected by said temperature detecting unit is higher than a predetermined value.

10. The semiconductor memory according to claim 6, further comprising:
a memory cell array having said memory cell;
an address terminal receiving an address selecting said memory cell;
an address detecting unit detecting a physical location of said memory cell selected by the address; and
a release control circuit bringing the function of said connection release circuit into effect only when the address detected by said address detecting unit specifies the end of said memory cell array.

11. The semiconductor memory according to claim 6, further comprising:
a time terminal receiving a time signal specifying a use period of said semiconductor memory; and
a release control circuit bringing the function of said connection release circuit into effect only when the use period specified by the time signal exceeds a predetermined period.

12. The semiconductor memory according to claim 6, further comprising
a release control circuit detecting the read voltage and bringing the function of said connection circuit into effect when the read voltage reaches a predetermined value.

* * * * *